US012575315B2

(12) United States Patent
Thompson et al.

(10) Patent No.: US 12,575,315 B2
(45) Date of Patent: Mar. 10, 2026

(54) ORGANIC ELECTROLUMINESCENT MATERIALS AND DEVICES

(71) Applicant: University of Southern California, Los Angeles, CA (US)

(72) Inventors: Mark E. Thompson, Anaheim Hills, CA (US); Matthew J Jurow, Culver City, CA (US); Peter I. Djurovich, Long Beach, CA (US); Tobias D. Schmidt, Augsburg (DE)

(73) Assignee: UNIVERSITY OF SOUTHERN CALIFORNIA, Los Angeles, CA (US)

( * ) Notice: Subject to any disclaimer, the term of this patent is extended or adjusted under 35 U.S.C. 154(b) by 0 days.

(21) Appl. No.: 18/777,912

(22) Filed: Jul. 19, 2024

(65) Prior Publication Data

US 2024/0373740 A1 Nov. 7, 2024

Related U.S. Application Data

(60) Continuation of application No. 17/012,997, filed on Sep. 4, 2020, now Pat. No. 12,058,929, which is a (Continued)

(51) Int. Cl.

| | |
|---|---|
| ***H10K 85/30*** | (2023.01) |
| ***C09K 11/02*** | (2006.01) |
| ***C09K 11/06*** | (2006.01) |
| *H10K 50/11* | (2023.01) |
| *H10K 101/10* | (2023.01) |
| *H10K 101/30* | (2023.01) |

(52) U.S. Cl.

CPC .......... *H10K 85/342* (2023.02); *C09K 11/025* (2013.01); *C09K 11/06* (2013.01); *C09K 2211/1044* (2013.01); *C09K 2211/185* (2013.01); *H10K 50/11* (2023.02); *H10K 2101/10* (2023.02); *H10K 2101/30* (2023.02)

(58) Field of Classification Search

CPC .................................................... H10K 85/342

See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

English machine translation of Yoshida (JP-2005259687-A) provided by the EPO website, All Pages, 2025. (Year: 2025).*

(Continued)

*Primary Examiner* — Daniel P Malley, Jr.

(74) *Attorney, Agent, or Firm* — DUANE MORRIS LLP

(57) ABSTRACT

Organic light emitting devices incorporating a film of metal complex emitters that are oriented with their transition dipole moment vectors oriented parallel to the device substrate enhances the outcoupling and eliminate the need for micro-lens arrays, gratings, or other physical extraneous outcoupling methods.

19 Claims, 10 Drawing Sheets

Related U.S. Application Data division of application No. 15/174,409, filed on Jun. 6, 2016, now Pat. No. 10,818,853.

(60) Provisional application No. 62/175,616, filed on Jun. 15, 2015, provisional application No. 62/170,922, filed on Jun. 4, 2015.

(56) References Cited

U.S. PATENT DOCUMENTS

| | | | |
|---|---|---|---|
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,164,114 | B2 | 1/2007 | Lai et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 2002/0034656 | A1 | 3/2002 | Thompson |
| 2002/0134984 | A1 | 9/2002 | Igarashi |
| 2002/0158242 | A1 | 10/2002 | Son et al. |
| 2002/0182441 | A1 | 12/2002 | Lamansky |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0051614 | A1 | 3/2006 | Su |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0106190 | A1 | 5/2008 | Yabunouchi et al. |
| 2008/0124572 | A1 | 5/2008 | Mizuki et al. |
| 2008/0160345 | A1 | 7/2008 | Inoue |
| 2008/0220265 | A1 | 9/2008 | Xia et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2015/0005497 | A1 | 1/2015 | Murer |
| 2016/0233443 | A1* | 8/2016 | Stoessel ............... C07D 221/22 |

FOREIGN PATENT DOCUMENTS

| | | |
|---|---|---|
| EP | 2034538 | 3/2009 |
| JP | 200511610 | 1/2005 |
| JP | 2005259687 A * | 9/2005 |
| JP | 2007123392 | 5/2007 |
| JP | 2007254297 | 10/2007 |
| JP | 2008074939 | 4/2008 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |

OTHER PUBLICATIONS

Ren "Coumarin-Based, Electron-Trapping Iridium Complexes as Highly Efficient and Stable Phosphorescent Emitters for Organic Light-Emitting Diodes", Inorganic Chemistry, 2010, 49, pp. 1301-1303. (Year: 2010).*

Mayr et al. "Control of Molecular Dye Orientation in Organic Luminescent Films by the Glass Transition Temperature of the Host Material", Chem. Mater. 2015, 27, 2759-2762. (Year: 2015).*

STN structure search for U.S. Appl. No. 18/777,912 conducted by the Examiner on Oct. 29, 2025, All Pages. (Year: 2025).*

STN structure search conducted by the Examiner for U.S. Appl. No. 17/012,997, Mar. 5, 2024, All Pages. (Year: 2024).

(56) References Cited

OTHER PUBLICATIONS

Mayr et al., "Control of Molecular Dye Orientation in Organic Luminescent Films by the Glass Transition Temperature of the Host Material", Chemistry of Materials, 2015, 27, pp. 2759-2762. (Year: 2015).
Adachi, Chihaya et al., "Organic Electroluminescent Device Having a Hole Conductor as an Emitting Layer," Appl. Phys. Lett., 55(15): 1489-1491 (1989).
Adachi, Chihaya et al., "Nearly 100% Internal Phosphorescence Efficiency in an Organic Light Emitting Device," J. Appl. Phys., 90(10): 5048-5051 (2001).
Adachi, Chihaya et al., "High-Efficiency Red Electrophosphorescence Devices," Appl. Phys. Lett., 78(11)1622-1624 (2001).
Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.
Baldo et al., Highly Efficient Phosphorescent Emission from Organic Electroluminescent Devices, Nature, vol. 395, 151-154, (1998).
Baldo et al., Very high-efficiency green organic light-emitting devices based on electrophosphorescence, Appl. Phys. Lett., vol. 75, No. 1, 4-6 (1999).
Gao, Zhiqiang et al., "Bright-Blue Electroluminescence From a Silyl-Substituted ter-(phenylene-vinylene) derivative." Appl. Phys. Lett., 74(6): 865-867 (1999).
Guo, Tzung-Fang et al., "Highly Efficient Electrophosphorescent Polymer Light-Emitting Devices," Organic Electronics, 1: 15-20 (2000).
Hamada, Yuji et al., "High Luminance in Organic Electroluminescent Devices with Bis(10-hydroxybenzo[h]quinolinato) beryllium as an Emitter, " Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi et al., "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4.4',4"-Tris(3-methylphenylphenyl-amino) triphenylamine (m-MTDATA), as Hole-Transport Materials," Adv. Mater., 6(9):677-679 (1994).
Kwong, Raymond C et al., "High Operational Stability of Electrophosphorescent Devices," Appl. Phys. Lett., 81(1) 162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18 (21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of a-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem, Mater., 17(13):3532-3536 (2005).
Noda, Tetsuya and Shirota, Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(1) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74.985-991 (1997).
Sotoyama, Wataru et al., "Efficient Organic Light-Emitting Diodes with Phosphorescent Platinum Complexes Containing NACAN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexyllhiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters." Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).

(56) References Cited

OTHER PUBLICATIONS

Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

ORGANIC ELECTROLUMINESCENT MATERIALS AND DEVICES

CROSS-REFERENCE TO RELATED APPLICATIONS

This application is a continuation of U.S. patent application Ser. No. 17/012,997, filed Sep. 4, 2020, which is a divisional of U.S. patent application Ser. No. 15/174,409, filed Jun. 6, 2016, now U.S. Pat. No. 10,818,853, which claims priority under 35 U.S.C. § 119(e)(1) to U.S. Patent Application Ser. No. 62/175,616, filed on Jun. 15, 2015, and U.S. Patent Application Ser. No. 62/170,922, filed on Jun. 4, 2015, the entire contents of which are incorporated herein by reference.

PARTIES TO A JOINT RESEARCH AGREEMENT

The claimed invention was made by, on behalf of, and/or in connection with one or more of the following parties to a joint university corporation research agreement: The Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

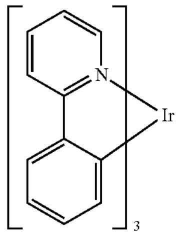

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

Molecular orientation and solid state morphology exert a significant impact on the performance of molecular electronic devices. The use of phosphorescent iridium complexes with near unity electroluminescence quantum yields as emitters in modern OLEDs has allowed for the manufacture of device with excellent efficiencies. However, despite the high quantum efficiency for light emission, approximately 80% of photons are lost to surface plasmons and waveguide modes. Thus, there is a need for improved outcoupling of photons from OLEDs.

SUMMARY

According to an aspect of the present disclosure OLEDs having improved outcoupling properties are disclosed. In some embodiments, a first OLED is disclosed which comprises a substrate, an anode, a cathode, and an organic layer disposed between the anode and the cathode. The organic layer comprises a film of heteroleptic compounds having a formula $M(L_A)_2(L_B)$;

wherein $L_A$ and $L_B$ are bidentate, monoanionic ligands;

wherein each of the compounds has a structure of

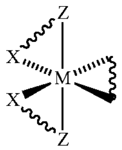

, wherein 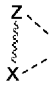 represents ligand $L_A$ and  represents ligand $L_B$;

wherein M is a metal selected from the group consisting of Ir, Rh, Re, Ru, Os, Pt, Au, and Cu;

wherein the compound has a $C_2$ symmetry axis and a transition dipole moment vector (TDV);

wherein the ligand $L_B$ is symmetric with respect to the $C_2$ symmetry axis;

wherein the Z atoms are trans to each other and the $C_2$ symmetry axis is perpendicular to the M-Z bonds and the TDV is coincident or nearly coincident with the M-Z bonds;

wherein Z is C or N;

wherein X is O, NR, $CR_2$, or $SiR_2$;

wherein R is H, alkyl, or aryl; and wherein the heteroleptic compounds in the film are oriented with their $C_2$ symmetry axis substantially perpendicular to the substrate.

According some embodiments, the organic layer in the first OLED comprises a film of homoleptic compounds having a formula $M(L_A)_3$;

wherein the compound has a structure of

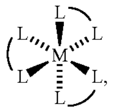

, wherein  represents $L_A$, wherein M is a metal selected from the group consisting of Ir, Rh, Re, Ru, Os, Pt, Au, and Cu;

wherein L is C or N atom;

wherein $L_A$ is a $C_2$ symmetric bidentate monoanionic ligand and each ligand $L_A$'s coordination to M forms a L-M-L bond angle;

wherein each of the homoleptic compound is a $C_3$ symmetric compound having a $C_3$ symmetry axis and has a transition dipole moment; and wherein the homoleptic compounds in the film are oriented with their $C_3$ symmetry axis substantially perpendicular to the substrate and the transition dipole moment for the $M(L_A)$ fragment bisects the L-M-L bond angle.

According to some embodiments, a formulation comprising the heteroleptic compound is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
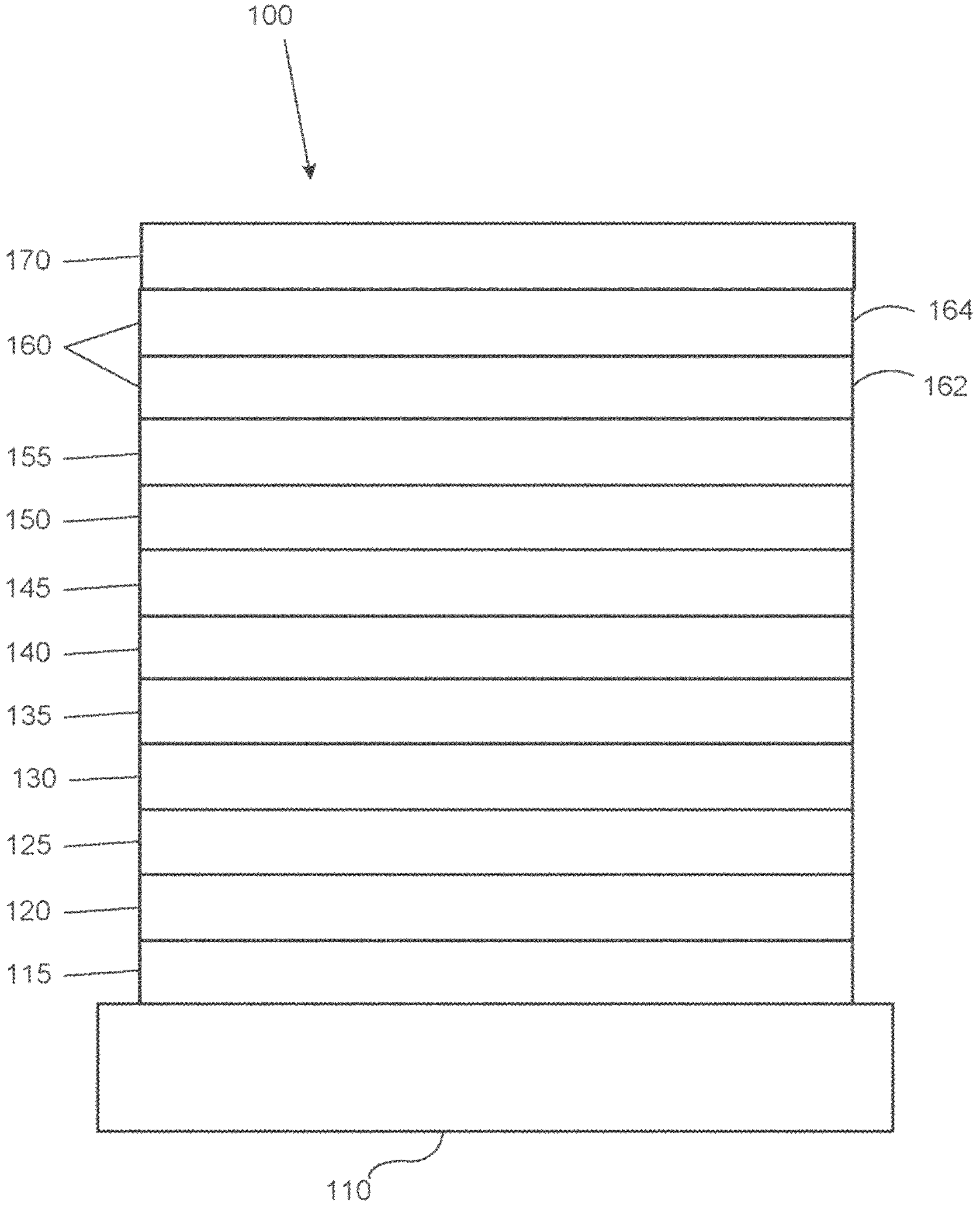
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
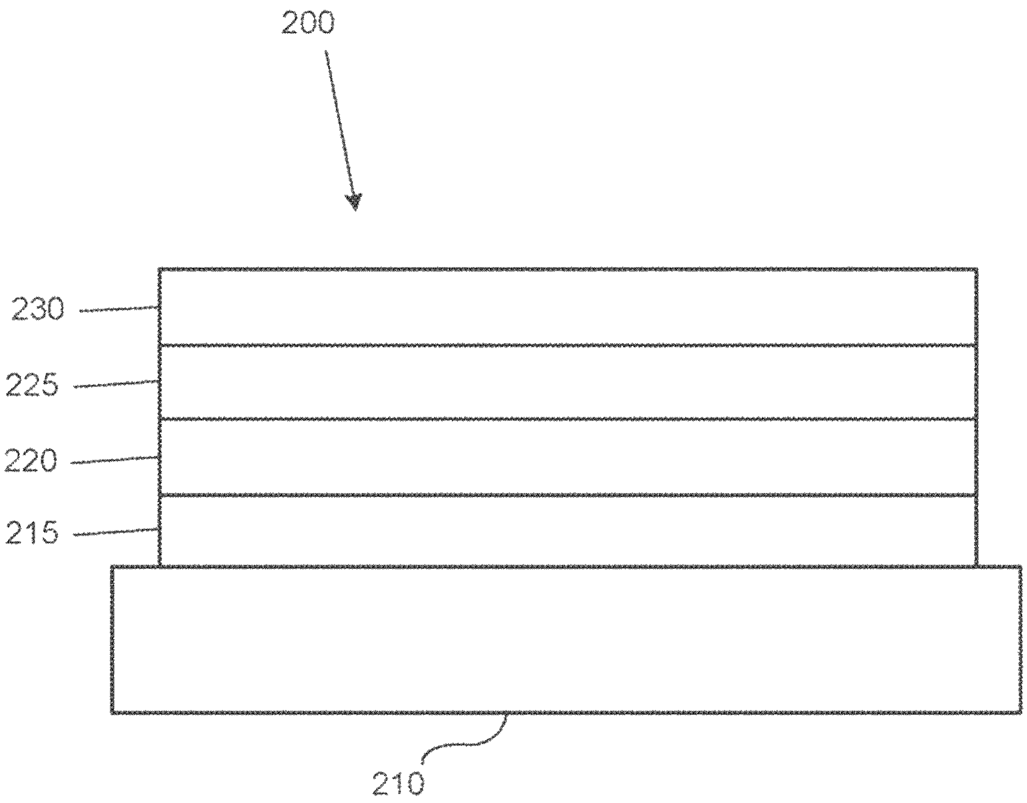
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), wearable device, laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree c. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo," "halogen," or "halide" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" as used herein contemplates cyclic alkyl radicals. Preferred cycloalkyl groups are those containing 3 to 10 ring carbon atoms and includes cyclopropyl, cyclopentyl, cyclohexyl, adamantyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also means heteroaryl. Preferred hetero-non-aromatic cyclic groups are those containing 3 to 7 ring atoms which includes at least one hetero atom, and includes cyclic amines such as morpholino, piperdino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" as used herein contemplates single-ring hetero-aromatic groups that may include from one to five heteroatoms. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In order to reduce the incidence of photons being dissipated to optical loss channels, and enhance overall external quantum efficiencies (EQE), the inventors have discovered a way to increase the outcoupling efficiency within the OLED through controlling the direction of the photon emission. The organometallic molecules at the core of these devices emit light perpendicular to their transition dipole moment vector (TDV). Orienting emissive molecules with their transition dipoles parallel to the device substrate would eliminate the need for micro-lens arrays, gratings, or other physical extraneous methods used to enhance outcoupling, and allow for large scale manufacture of OLEDs with high EQE.

Inventors have discovered that heteroleptic compounds having a formula $M(L_A)_2(L_B)$;

wherein $L_A$ and $L_B$ are bidentate, monoanionic ligands;

wherein each of the compounds has a structure of

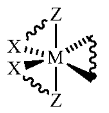

Formula 1, wherein 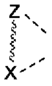 represents ligand $L_A$ and  represents ligand $L_B$;

wherein M is a metal selected from the group consisting of Ir, Rh, Re, Ru, Os, Pt, Au, and Cu;

wherein the compound has a $C_2$ symmetry axis and a transition dipole moment vector (TDV);

wherein the ligand $L_B$ is symmetric with respect to the $C_2$ symmetry axis;

wherein Z is C or N;

wherein X is O, $CR_2$, or $SiR_2$; and wherein the Z atoms are trans to each other and the $C_2$ symmetry axis is perpendicular to the M-Z bonds and the TDV is coincident or nearly coincident with the M-Z bonds, will enhance outcoupling of an OLED when such heteroleptic compounds are incorporated into the OLED as phosphorescent emitter in a film of the heteroleptic compounds where the heteroleptic compounds are oriented with their $C_2$ symmetry axis substantially perpendicular to the OLED's substrate. In the heteroleptic compounds having a formula $M(L_A)_2(L_B)$, the ligand $L_A$ is emissive ligand and $L_B$ is ancillary ligand.

In the heteroleptic compound of formula $M(L_A)_2(L_B)$, the triplet energy of $L_B$ is greater than that of $L_A$.

According to an aspect of the present disclosure, a first OLED is disclosed wherein the OLED comprises: a substrate; an anode; a cathode; and an organic layer, disposed between the anode and the cathode, comprising a film of heteroleptic compounds having a formula $M(L_A)_2(L_B)$;

wherein $L_A$ and $L_B$ are bidentate, monoanionic ligands;

wherein each of the compounds has a structure of

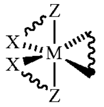

Formula 1, wherein 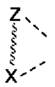 represents ligand $L_A$ and  represents ligand $L_B$;

wherein M is a metal selected from the group consisting of Ir, Rh, Re, Ru, Os, Pt, Au, and Cu;

wherein the compound has a $C_2$ symmetry axis and a transition dipole moment vector (TDV);

wherein the ligand $L_B$ is symmetric with respect to the $C_2$ symmetry axis;

wherein the Z atoms are trans to each other and the $C_2$ symmetry axis is perpendicular to the M-Z bonds and the TDV is coincident or nearly coincident with the M-Z bonds;

wherein Z is C or N;

wherein X is O, NR, $CR_2$, or $SiR_2$; and wherein the heteroleptic compounds in the film are oriented with their $C_2$ symmetry axis substantially perpendicular to the substrate.

The $C_2$ symmetry axis of the heteroleptic compounds refers to the 2-fold rotational axis of the heteroleptic compounds. When TDV is described as being coincident or nearly coincident, it means that the TDV is preferably within ±15 degrees of the M-Z bond axis. Substantially perpendicular to the substrate means being within 25 degree cone around an axis that is perpendicular to the substrate surface. Thus, the $C_2$ symmetry axis of the heteroleptic compounds being substantially perpendicular to the substrate means that the $C_2$ symmetry axis of the compounds are aligned to the substrate within 25 degree cone around an axis that is perpendicular to the substrate surface. The M-Z bond defines the plane of the ligand and because the M-Z bond and the TDV of the compound are perpendicular to the $C_2$ symmetry axis, the M-Z bond and the TDV are parallel to the substrate.

In some embodiments of the first OLED, the ligand $L_A$ in the formula $M(L_A)_2(L_B)$ is

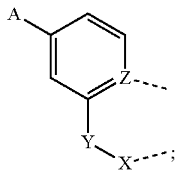

;

wherein Z is C or N;

wherein X is O, NR, $CR_2$, or $SiR_2$;

wherein Y is $CR_2$, or $SiR_2$;

wherein A is H, CN, $NO_2$, or C(O)R; and wherein R is H, alkyl, or aryl.

In some embodiments of the first OLED, where the ligand $L_A$ in the formula $M(L_A)_2(L_B)$ is

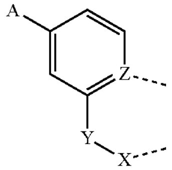

as defined above, $L_B$ is selected from the group consisting of:

$L_{B1}$

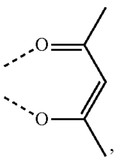

, $L_{B2}$

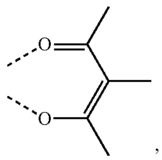

, $L_{B3}$

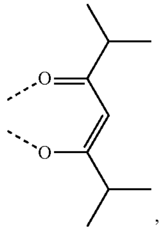

, $L_{B4}$

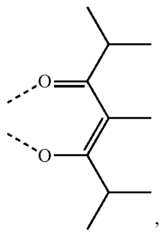

,

-continued
$L_{B5}$
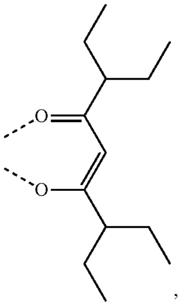
,
$L_{B6}$
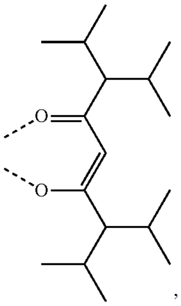
,
$L_{B7}$
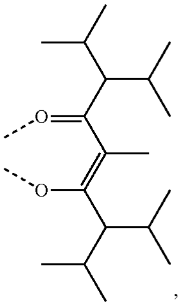
,
$L_{B8}$
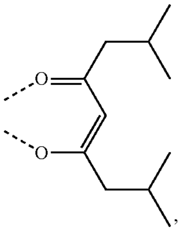
,
$L_{B9}$
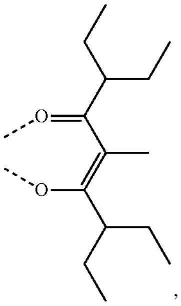
,
-continued
$L_{B10}$
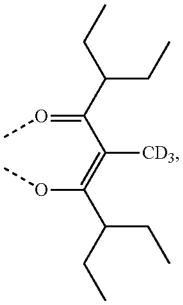
$L_{B11}$
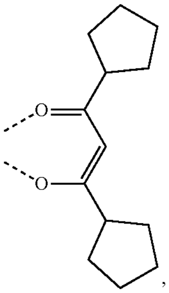
,
$L_{B12}$
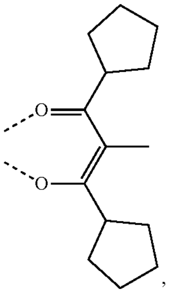
,
$L_{B13}$
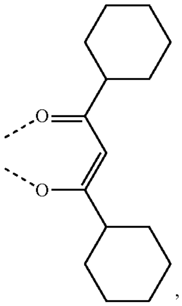
,
$L_{B14}$
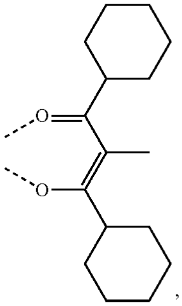
, -continued $L_{B15}$

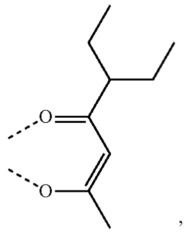

, $L_{B16}$

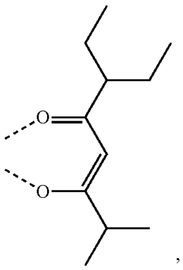

, and $L_{B17}$

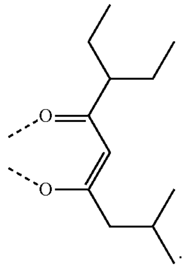

In some other embodiments of the first OLED, where the ligand $L_A$ in the formula $M(L_A)_2(L_B)$ is

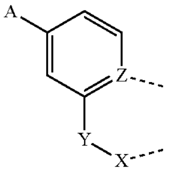

as defined above, $L_B$ is selected from the group consisting of:

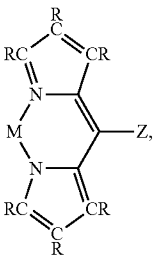

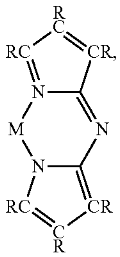

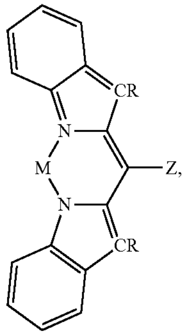

-continued

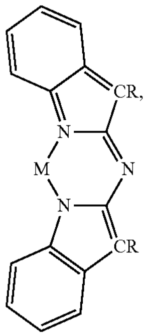

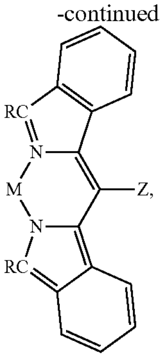

and

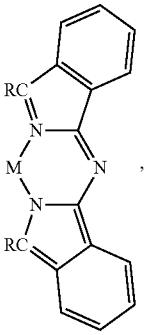

, wherein Z is H, alkyl, aryl, alkynyl, CN, C(O)R, $CO_2R$, or $NO_2$; and wherein R is H, alkyl, or aryl.

In some other embodiments of the first OLED where the heteroleptic compound has the formula $M(L_A)_2(L_B)$, the ligand $L_B$ is one of the following anionic borate ligands:

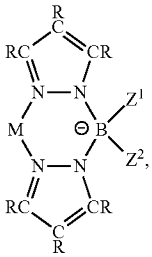

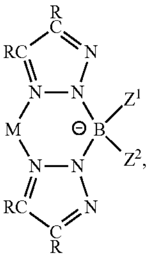

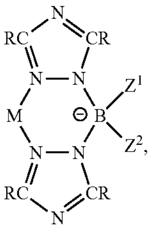

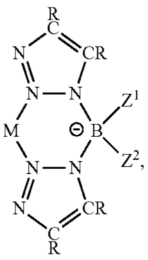

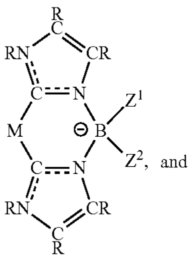

and

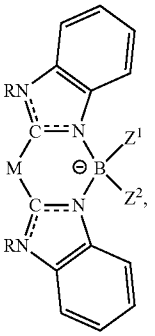

wherein $Z^1$ and $Z^2$ are independently H, alkyl, aryl, alkynyl, C(O)R, or $CO_2R$; and wherein R is H, alkyl, or aryl.

In some embodiments of the first OLED where the heteroleptic compound has the formula $M(L_A)_2(L_B)$, the ligand $L_A$ is one of the following anionic ligands:

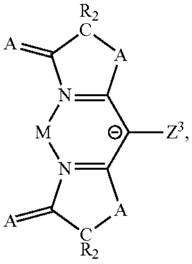, and 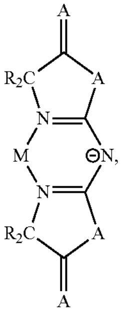

wherein $Z^3$ is H, alkyl, aryl, alkynyl, CN, C(O)R, $CO_2R$, or $NO_2$;

wherein A is O, S, NR, PR, CO, $CR_2$, or $SiR_2$; and wherein R is H, alkyl, or aryl.

In some other embodiments of the first OLED where the heteroleptic compound has the formula $M(L_A)_2(L_B)$, the compound is one of:

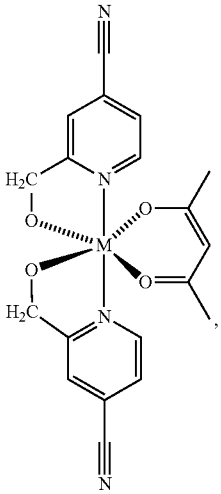, 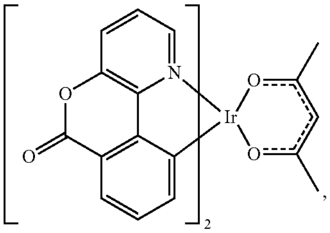, (bppo)$_2$Ir(acac)

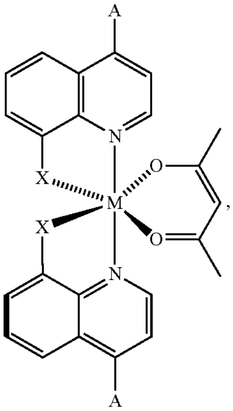, or 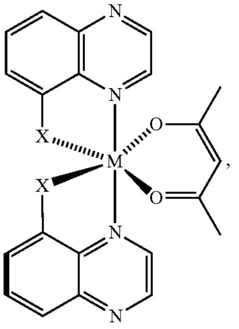, wherein A is H, CN, $NO_2$, C(O)R, or $CO_2R$;

X is O, NR, $CR_2$, or $SiR_2$; and

R is H, alkyl, or aryl.

In some embodiments of the first OLED comprising the heteroleptic compound of Formula 1 in the organic layer, M is Ir.

In some embodiments of the first OLED comprising the heteroleptic compound of Formula 1 in the organic layer, θ is 0.1 or less.

In some embodiments of the first OLED comprising the heteroleptic compound of Formula 1 in the organic layer, the organic layer is an emissive layer and the compound is an emissive dopant.

In some embodiments of the first OLED comprising the heteroleptic compound of Formula 1 in the organic layer, the organic layer further comprises a host, wherein the host comprises a triphenylene containing benzo-fused thiophene or benzo-fused furan;

wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1{-}Ar_2$, and $C_nH_{2n}{-}Ar_1$, or the host has no substitutions;

wherein n is from 1 to 10; and wherein $Ar_1$ and $Ar_2$ are independently selected from the group consisting of benzene, biphenyl, naphthalene, triphenylene, carbazole, and heteroaromatic analogs thereof.

In some embodiments of the first OLED comprising the heteroleptic compound of Formula 1 in the organic layer, the organic layer further comprises a host, wherein host comprises at least one chemical group selected from the group consisting of carbazole, dibenzothiphene, dibenzofuran, dibenzoselenophene, azacarbazole, aza-dibenzothiophene, aza-dibenzofuran, and aza-dibenzoselenophene.

In some embodiments of the first OLED comprising the heteroleptic compound of Formula 1 in the organic layer, the organic layer further comprises a host, wherein the host comprises a metal complex.

In some embodiments of the first OLED comprising the heteroleptic compound of Formula 1 in the organic layer, the first OLED is incorporated into a device selected from the group consisting of a consumer product, an electronic component module, an organic light-emitting device, and a lighting panel.

Inventors have also discovered that homoleptic compounds having a formula $M(L_A)_3$ having a structure of

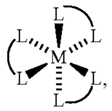, wherein  represents $L_A$;

wherein M is a metal selected from the group consisting of Ir, Rh, Re, Ru, Os, Pt, Au, and Cu;

wherein L is C or N atom;

wherein $L_A$ is a $C_2$ symmetric bidentate monoanionic ligand and each ligand $L_A$'s coordination to M forms a L-M-L bond angle;

wherein each of the homoleptic compound is a $C_3$ symmetric compound having a $C_3$ symmetry axis and has a transition dipole moment ventor (TDV); and wherein the TDV for the $M(L_A)$ fragment bisects the L-M-L bond angle, will enhance outcoupling of an OLED when such homoleptic compounds are incorporated into the OLED as phosphorescent emitter in a film of the homoleptic compounds where the homoleptic compounds are oriented with their $C_3$ symmetry axis substantially perpendicular to the OLED's substrate.

This orientation of the compound will put the TDVs for each of the three $M(L_A)$ fragments orthogonal to the $C_3$ symmetry axis.

According to another aspect of the present disclosure, a first OLED comprising: a substrate; an anode; a cathode; and an organic layer, disposed between the anode and the cathode, comprising a film of homoleptic compounds having a formula $M(L_A)_3$ is disclosed. The compound of formula $M(L_A)_3$ has a structure of

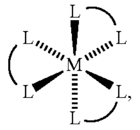

wherein  represents $L_A$;

wherein M is a metal selected from the group consisting of Ir, Rh, Re, Ru, Os, Pt, Au, and Cu;

wherein L is C or N atom;

wherein $L_A$ is a $C_2$ symmetric bidentate monoanionic ligand and each ligand $L_A$'s coordination to M forms a L-M-L bond angle;

wherein each of the homoleptic compound is a $C_3$ symmetric compound having a $C_3$ symmetry axis and has a transition dipole moment; and wherein the homoleptic compounds in the film are oriented with their $C_3$ symmetry axis substantially perpendicular to the substrate and the transition dipole moment for the $M(L_A)$ fragment bisects the L-M-L bond angle.

$C_3$ symmetry axis refers to the 3-fold rotational symmetry axis. "Substantially perpendicular to the substrate" in this context means that the $C_3$ symmetry axis of the compounds are aligned to the substrate within 25 degree cone around an axis that is perpendicular to the substrate surface.

In some embodiments of the first OLED where the organic layer disposed between the anode and the cathode comprises a film of homoleptic compounds having a formula $M(L_A)_3$ is disclosed. The compound of formula $M(L_A)_3$ has a structure of

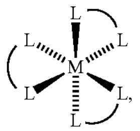

wherein 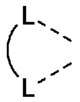 represents $L_A$, wherein M is Ir.

In some embodiments of the first OLED where the organic layer disposed between the anode and the cathode comprises a film of homoleptic compounds having a formula $M(L_A)_3$ where $M(L_A)_3$ has a structure of

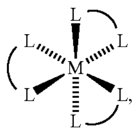

$L_A$ is selected from the group consisting of:

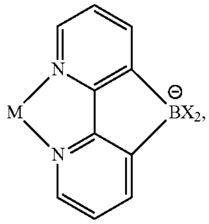

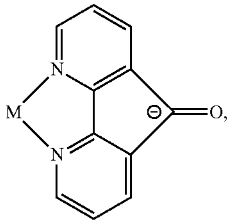

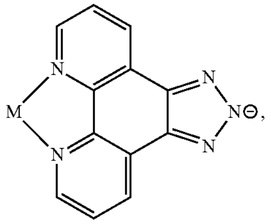

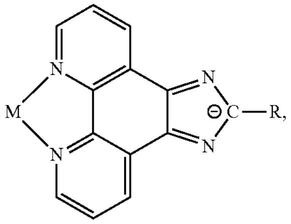

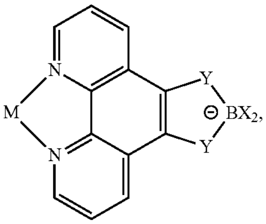

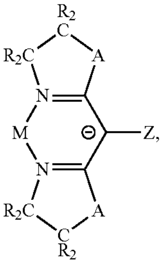

and

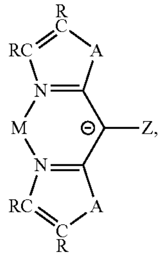

wherein X is halide, alkyl, aryl, or alkoxide;

wherein Y is O or NR;

wherein Z is H, alkyl, aryl, CN, or $NO_2$;

wherein A is O, S, NR, PR, CO, $CR_2$, or $SiR_2$; and wherein R is H, alkyl, or aryl.

In some embodiments of the first OLED where the organic layer disposed between the anode and the cathode comprises a film of homoleptic compounds having a formula $M(L_A)_3$ is disclosed. The compound of formula $M(L_A)_3$ has a structure of

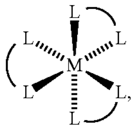

wherein  represents $L_A$;, wherein the organic layer is an emissive layer and the compound is an emissive dopant.

In some embodiments of the first OLED where the organic layer disposed between the anode and the cathode comprises a film of homoleptic compounds having a formula $M(L_A)_3$ is disclosed. The compound of formula $M(L_A)_3$ has a structure of

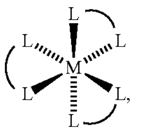

wherein  represents $L_A$; wherein the organic layer further comprises a host, wherein the host comprises a triphenylene containing benzo-fused thiophene or benzo-fused furan;

wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1{-}Ar_2$, and $C_nH_{2n}{-}Ar_1$, or the host has no substitutions;

wherein n is from 1 to 10; and wherein $Ar_1$ and $Ar_2$ are independently selected from the group consisting of benzene, biphenyl, naphthalene, triphenylene, carbazole, and heteroaromatic analogs thereof.

In some embodiments of the first OLED where the organic layer disposed between the anode and the cathode comprises a film of homoleptic compounds having a formula $M(L_A)_3$ is disclosed. The compound of formula $M(L_A)_3$ has a structure of

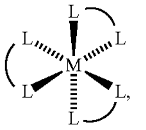

wherein  represents $L_A$; wherein the organic layer further comprises a host, wherein host comprises at least one chemical group selected from the group consisting of carbazole, dibenzothiphene, dibenzofuran, dibenzoselenophene, azacarbazole, aza-dibenzothiophene, aza-dibenzofuran, and aza-dibenzoselenophene.

In some embodiments of the first OLED where the organic layer disposed between the anode and the cathode comprises a film of homoleptic compounds having a formula $M(L_A)_3$ is disclosed. The compound of formula $M(L_A)_3$ has a structure of

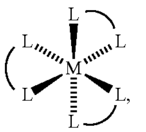

wherein  represents $L_A$, and the organic layer further comprises a host, wherein the host comprises a metal complex.

In some embodiments of the first OLED where the organic layer disposed between the anode and the cathode comprises a film of homoleptic compounds having a formula $M(L_A)_3$ is disclosed. The compound of formula $M(L_A)_3$ has a structure of

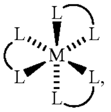

wherein  represents $L_A$; wherein the first organic light emitting device is incorporated into a device selected from the group consisting of a consumer product, an electronic component module, an organic light-emitting device, and a lighting panel.

According to some embodiments, the following examples of anionic BOX-type ligands can be used as the ligand $L_A$ in the heteroleptic compound of formula $M(L_A)_2(L_B)$ or the homoleptic compound of formula $M(L_A)_3$:

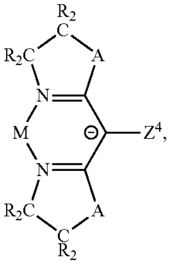 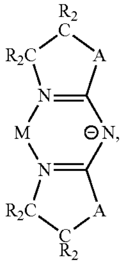 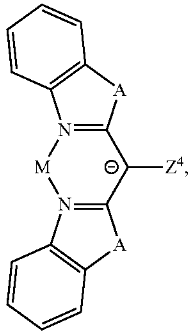

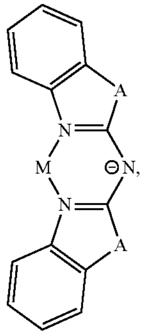 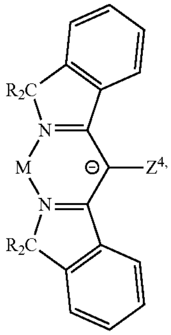 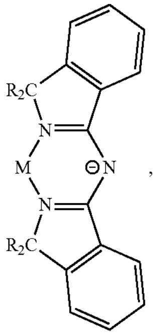 ,

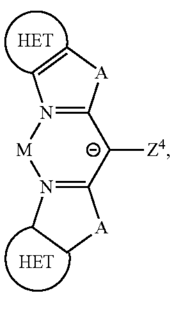 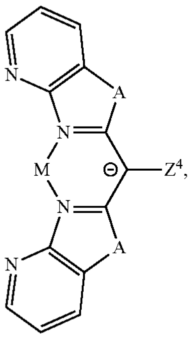 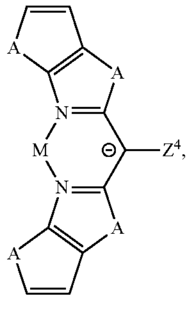

-continued

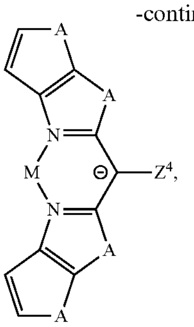

and

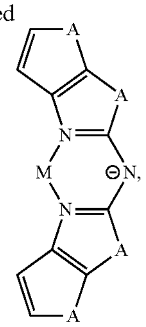

wherein HET refers to a heterocyclic ring;

wherein $Z^4$ is H, alkyl, aryl, alkynyl, CN, C(O)R, $CO_2R$, or $NO_2$;

wherein A is O, S, NR, PR, CO, $CR_2$, or $SiR_2$; and wherein R is H, alkyl, or aryl.

The anionic BOX-type ligand examples provided above can be employed for either the heteroleptic compound of formula $M(L_A)_2(L_B)$ or the homoleptic compound of formula $M(L_A)_3$. The choice depends on the triplet energy and/or electron affinity of the BOX-type ligand. In the heteroleptic $M(L_A)_2(L_B)$ complex, the BOX-type ligand can be used as the ancillary ligand $L_B$ as long as the triplet energy of the BOX-type ligand is greater than that of the ligand being used as $L_A$. If the triplet energy of the ligand is less than 3.0 eV, as would likely be the case for the benzannulated derivatives, then the ligand can be used to make luminescent $M(L_A)_3$ complexes. The triplet energy of a BOX-type ligand can be established from its phosphorescent spectrum, typically recorded at temperatures <100K, when coordinated to Gadolinium to form a homoleptic complex. One can also determine the triplet energy of $Z^4$ and R, when they are aryl groups, from their phosphorescent spectrum. Finally, one can also estimate the triplet energy of the BOX-type ligands using results from TDDFT calculations.

Calculating TDVs

One of ordinary skill in the art would know how to calculate the TDVs of metal complexes in order to determine whether a particular heteroleptic compound or homoleptic compound meets the requirements for optimizing the outcoupling in an OLED disclosed herein. One example of such method for calculating the TDVs of metal complexes is described below along with some examples of the calculations.

Density functional theory (DFT) and time-dependent density functional theory (TDDFT) calculations were performed using Jaguar (version 9.1) in the Material Science suite of the Schrodinger software package (2016-1 release). The functional used for the calculation, "Becke, Lee, Yang and Parr" (B3LYP), contains three parameters that specify the contributions of the Hartree-Fock exact exchange, local exchange, gradient-corrected exchange and a gradient-corrected correlation functional. The Los Alamos Core Valence Potential (LACVP) basis set used includes polarization functions (**) for the lighter atoms. All structures were geometry optimized using a restricted (same spatial orbitals) DFT method. Twenty singlet and triplet states were then calculated using the TDDFT method on the geometry optimized structures. The TDDFT calculations used the linear response approximation, whereby changes of the electron density are assumed to be proportional to the changes of the external field. Each electronic transition is represented using a linear combination of one-electron excitations between pairs of ground state occupied (HOMO) and unoccupied (LUMO) molecular orbitals. The contributions of the various one-electron excitations from the occupied-to-unoccupied orbital in each excited state are expressed in percent (%). Since the TDDFT calculations do not include spin-orbit coupling, the oscillator strengths and transition dipole moments computed for these transitions are zero. Therefore, calculated dipole moments for singlet states that correspond to the same principal one-electron excitation involved in the triplet state are used to estimate the direction of the TDVs in the triplet state. We use this approach to estimate the direction of the TDVs for luminescence, relative to the molecular frame, for any compound of interest. For the L2MX derivatives (i.e., compounds of formula $M(L_A)_2(L_B)$), the Z-axis is coincident with the $C_2$ rotation axis of the molecule. For the L3M derivatives (i.e., compounds of formula $M(L_A)_3$), the X-Y plane is perpendicular to the molecular $C_3$ symmetry axis.

In the following calculation examples, the molecular orbitals (MOs) involved in the lowest triplets state for one L3M and one L2MX complex obtained from time-dependent density functional theory (TDDFT) calculations. Since the calculations do not include spin-orbit coupling, the oscillator strengths and TDVs for the transitions are zero. Therefore, calculated results from the same compounds for singlet states are included that include the principal MO transitions involved in the triplet state. One can use this approach to estimate the direction of the TDVs for luminescence from any compounds of interest.

Example 1

TDDFT (B3LYP/LACVP**) Calculation Results for $Ir(Phen\text{-}imidMe)_3$ Complex

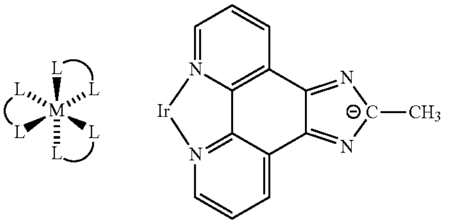

Note that the x-y plane bisects the ligand along its $C_2$ rotational axis.

TABLE 1

| Triplet excited state 1: 1.585 eV (782 nm) | |
|---|---|
| Molecular Orbital transition | % |
| HOMO-2 => LUMO + 1 | 20.6 |
| HOMO-2 => LUMO + 2 | 5.5 |
| HOMO-1 => LUMO | 37.8 |

TABLE 1-continued

| Triplet excited state 1: 1.585 eV (782 nm) | |
|---|---|
| Molecular Orbital transition | % |
| HOMO-1 => LUMO + 1 | 19.6 |
| HOMO => LUMO | 1.5 |
| HOMO => LUMO + 2 | 15.0 |

TABLE 2

| Singlet excited state 1: 2.035 eV (609 nm) | |
|---|---|
| Molecular Orbital transition | % |
| HOMO-2 => LUMO + 1 | 13.6 |
| HOMO-2 => LUMO + 2 | 3.4 |
| HOMO-1 => LUMO | 47.3 |
| HOMO-1 => LUMO + 1 | 16.8 |
| HOMO => LUMO | 2.2 |
| HOMO => LUMO + 2 | 16.7 |

Transition dipole moment (debye): X=−1.8837, Y=0.8542, Z=−0.0006, Total=2.0683

Oscillator strength, f=0.0330

Note: Transition dipole moment=TDV

Oscillator strength is proportional to the absorption strength

Example 2

TDDFT (B3LYP/LACVP**) Calculation Results for $Ir(Ppy)_2(Acac)$ Complex

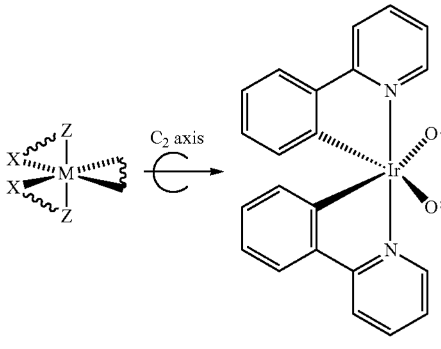

Note: z-axis is coincident with the $C_2$ rotational axis, y-axis is coincident with the Ir—N bond.

TABLE 3

| Triplet excited state 1: 2.517 eV (493 nm) | |
|---|---|
| MO transition | % |
| HOMO-3 => LUMO | 7.0 |
| HOMO-2 => LUMO + 1 | 1.5 |
| HOMO => LUMO + 1 | 91.5 |

TABLE 4

| Singlet excited state 1: 2.768 eV (448 nm) | |
|---|---|
| MO transition | % |
| HOMO => LUMO + 1 | 100 |

Transition dipole moment (debye): X=0.2066, Y=−1.7910, Z=0.0003, Total=1.8029

Oscillator strength, f=0.0341

TABLE 5

| Singlet excited state 8: 3.654 eV (339 nm) | |
|---|---|
| MO transition | % |
| HOMO-5 => LUMO + 1 | 2.8 |
| HOMO-2 => LUMO + 1 | 92.1 |
| HOMO-1 => LUMO | 3.0 |
| HOMO-1 => LUMO + 4 | 2.1 |

Transition dipole moment (debye): X=−1.3322, Y=1.7705, Z=0.0019, Total=2.2157

Oscillator strength, f=0.0680

TABLE 6

| Singlet excited state 13: 3.931 eV (315 nm) | |
|---|---|
| MO transition | % |
| HOMO-6 => LUMO | 2.0 |
| HOMO-3 => LUMO | 81.0 |
| HOMO-2 => LUMO + 1 | 1.5 |
| HOMO-2 => LUMO + 2 | 3.9 |
| HOMO-1 => LUMO + 3 | 11.5 |
| HOMO-1 => LUMO + 4 | 2.0 |

Transition dipole moment (debye): X=0.9175, Y=1.6314, Z=−0.0092, Total=1.8717

Oscillator strength, f=0.0522

In EXAMPLE 1, the z-axis is coincident with the $C_3$ symmetry axis of the molecule and luminescence is considered to originate from the lowest triplet state. The lowest triplet excited state 1 is comprised of a linear combination of six one-electron excitations and these same six one-electron excitations are present in the lowest singlet excited state 1. While the % contribution from each one-electron excitation differs in between the two states, the relative contribution from each one-electron excitation is comparable. The transition dipole moment calculated for singlet state 1 has a large x- and y-axis component (−1.8837 and 0.8542, respectively) and only a minor contribution in the z-axis direction (−0.0006). The contribution from z-axis polarization is so small relative to the x- and y-axes that it can be considered negligible. Therefore, the TDV for luminescence from the triplet state in this example is predicted to be polarized in the x- and y-directions.

In EXAMPLE 2 the z-axis is coincident with the $C_2$ axis of the molecule and luminescence is considered to originate from the lowest triplet state. The lowest triplet excited state 1 is comprised of three one-electron excitations, with the HOMO to LUMO+1 excitation being dominant (91.5%). The same HOMO to LUMO+1 transition in the singlet excited state 1 has a transition dipole moment polarized along the x- and y-axes (0.2066 and −1.7910, respectively) and a near negligible component along the z-axis (0.0003). Moreover, singlet states dominated by one-electron excitations equivalent to the other two minor one-electron excitations found in triplet state 1, i.e., singlet states 8 (HOMO-2 to LUMO+1, 92.1%) and 13 (HOMO-3 to LUMO, 81.0%), have transition dipole moments polarized in the x- and y-directions (x=−1.3322, y=1.7705 in singlet state 8 and x=0.9175, y=1.6314 in singlet state 13) with negligible components along the z-axis (z=0.0019 and −0.0092 in singlet states 8 and 13, respectively). Therefore, the TDV for luminescence from the triplet state in EXAMPLE 2 is predicted to be polarized in the x- and y-directions as well.

Deposition of the Metal Complex Films

The desired orientation of the metal complexes (where the phosphor's $C_2$ or $C_3$ symmetry axis is perpendicular to the plane of the substrate) with respect to the OLED substrate can be achieved by vacuum deposition. Without being bound to the theory, inventors have uncovered through their experimental work disclosed herein that the interaction of the chemically anisotropic species and the boundry created between the vacuum and the organic surface during the deposition process is responsible for the observed uniform orientation of the disclosed compounds when vacuum deposited. Thus, this previously unknown mechanism is utilized to substantially enhance the outcoupling of OLEDs by selectively choosing the metal complex phosphors having the desired transition dipole moment vectors.

Experimental

A coumarin based ligand was synthesized from which we prepared heteroleptic iridium based emitters: $(bppo)_2Ir(acac)$, $(bppo)_2Ir(ppy)$, and $(ppy)_2Ir(bppo)$ where bppo=benzopyranopyridinone, ppy=2-phenylpyridinate. Their structures are shown below:

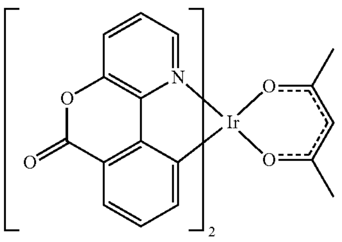

$(bppo)_2Ir(acac)$

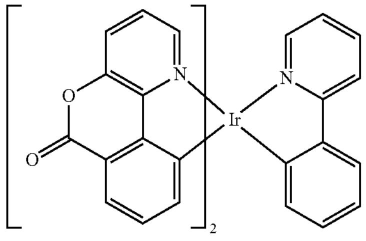

$(bppo)_2Ir(ppy)$

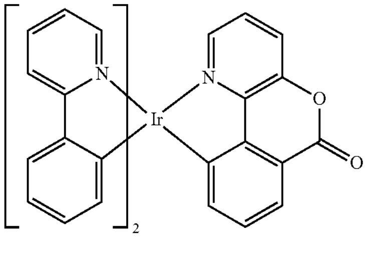

$(ppy)_2Ir(bppo)$

The coumarin functionality was employed because the carbonyl (C═O) group has a large impact on dipole moment and the known orientation behavior. Each material was doped into a 4,4'-bis(N-carbazolyl)-1,1'-biphenyl (CBP) host matrix at 2%, 6%, 12% and 20% (v/v) and characterized by angular dependent p-polarized emission. Analysis revealed that emission from films containing (bppo)2Ir(acac) is oriented with a net horizontal alignment, while the emission from films with (ppy)2Ir(bppo) and (bppo)2Ir(ppy) are nearly isotropic. All materials demonstrated concentration related photoluminescence quenching at high doping percentages that surprisingly has no effect on the emission orientation. Understanding the causes of the observed alignment behavior of the emitted light allowed the inventors to develop dopant molecules that will preferentially orient in films of isotropic materials for diverse uses in photonic devices.

The Ir complexes were prepared using a common precursor, [(bppo)2Ir(μ-Cl)]2, obtained from a reaction of the coumarin bppo-H and IrCl3·xH2O in refluxing 2-ethoxyethanol. Reaction of the Ir chloro-bridged dimer with free acetylacetonate produced $(bppo)_2Ir(acac)$ in good yield. A reaction between [Ir(bppo)2(μ-Cl)]2 and ppy-H formed both (bppo)2Ir(ppy) and (ppy)2Ir(bppo) in moderate yield. Both tris-cyclometalated complexes were isolated as facial isomers with the (ppy)2Ir(bppo) species being a result of ligand scrambling during the course of the reaction. The synthesis and photophysical properties of (bppo)2Ir(ppy) and (ppy)2Ir(bppo) have been reported previously and are known.

Figure 3A:
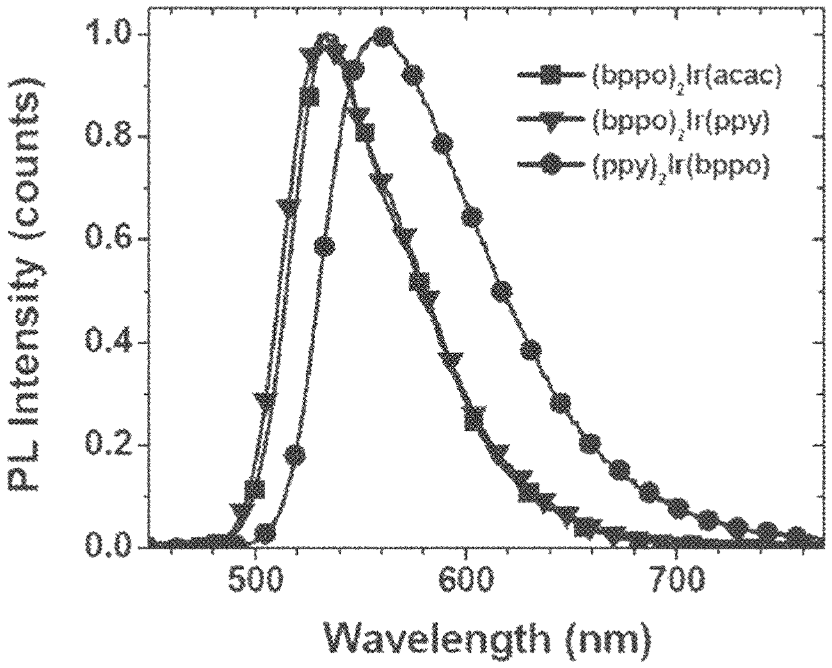
FIG. 3A shows photoluminescence spectra in 2-methyl THF at room temperature.
Figure 3B:
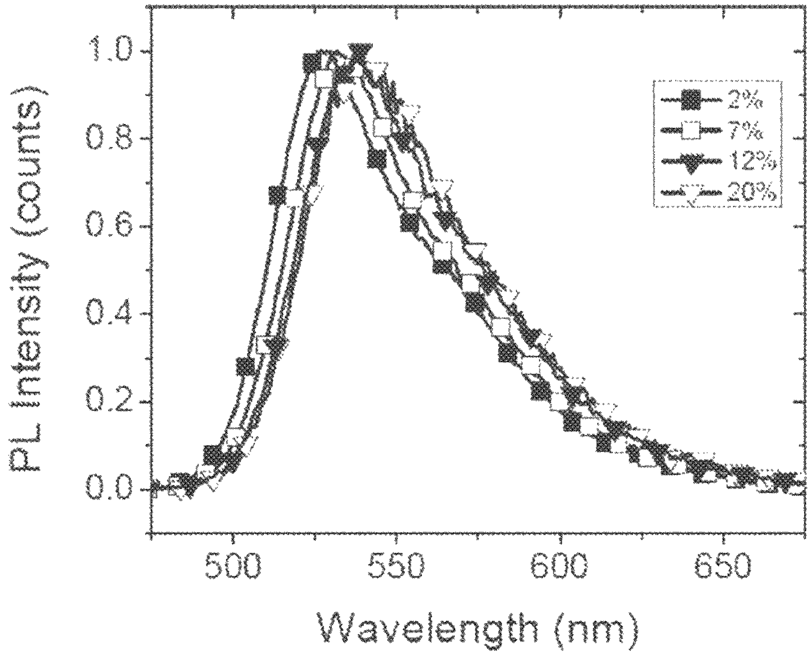
FIG. 3B shows photoluminescence from films of CBP doped with different concentrations of $(bppo)_2Ir(acac)$.

The Ir complexes exhibit photophysical properties typical of phosphorescent iridium complexes. As shown in FIG. 3A, at room temperature the compounds display strong green-yellow luminescence, with emission maxima at 534 nm, 532 nm and 560 nm for (bppo)2Ir(acac), (bppo)2Ir(ppy) and (ppy)2Ir(bppo), respectively, and have quantum yields of greater than 88% in deaerated solutions of 2-methyltetrahydofuran. The luminescence decay occurs with microsecond lifetimes indicative of phosphorescence. The photophysical properties of (bppo)2Ir(acac) and (bppo)2Ir(ppy) are comparable to that of (ppy)2Ir(acac). The presence of two relatively strong ppy donor ligands in (ppy)2Ir(bppo) reduces its HOMO-LUMO gap and thus it has a lower emission energy compared to the other two complexes.

Ground state dipole moments for the complexes were calculated using DFT (B3LYPLACVP**). (bppo)2Ir(acac) has a dipole moment (μ=6.18 D) that bisects the angle between the bppo ligands and is coincident with the molecular $C_2$ symmetry axis. The dipole moments in (bppo)2Ir(ppy) (p=8.44 D) and (ppy)2Ir(bppo) (p=8.25 D) are oriented toward the pseudo threefold axis defined by the Ir—C bonds. In (bppo)2Ir(ppy) the dipole is tilted from this axis and lies in a plane of the bppo ligand that is trans to the Cbppo and Nppy. In Ir(ppy)2(bbpo) the dipole lies in the plane of the ppy ligand that is also trans to Cbppo and Nppy but is tilted toward the bppo ligand.

Films of the complexes doped into CBP were deposited at 2%, 6%, 12% and 20% (v/v) to probe the impact of dipole moment and heteroleptic substitution on aggregation and concentration quenching. All species have large quantum yields in solid films, greater than 30% at any doping level tested. Concentration related quenching of photoluminescent quantum yield, along with a concentration dependent red shift indicative of aggregation, was observed with all species. The extent of the concentration quenching varied between the three dopants, with the (bppo)2Ir(ppy) species showing the largest loss in quantum yield, followed by (bppo)2Ir(acac) and finally (ppy)2Ir(bppo). Since concentration quenching requires an overlap of the emissive ligands, the inventors believe that the (bppo)2Ir(ppy) demonstrates the largest effect because it has two potential emissive ligands. A red shift and broadening of the emission spectrum of the (bppo)2Ir(acac) doped films was observed, transitioning from a full width at half maximum of 53 nm in 2% films to 58 nm in 20% films. This result indicates that aggregation is occurring in the doped films.

Angular dependent p-polarized emission measurements of doped films by photoluminescent excitation can accurately determine the net orientation of the TDVs of emissive dopants. We define the value θ as the ratio of power radiated by vertical components of the contributing TDVs to the total power radiation. For a single emitting molecule containing only one possible TDV $\vec{p}=(p_x, p_y p_z)$, θ is given by: $\theta=p_z^2/(p_x^2+p_y^2+p_z^2)$. In molecules containing n different TDVs, or an ensemble of n differently oriented molecules, each of these TDVs must be taken into account. As an excited state is only related to one of them, each TDV must be calculated separately with respect to the contributing fraction $\alpha_i$; $\Sigma_{i=1}^{n}\alpha_i=1$. Thus the resulting θ can be calculated as:

$$\theta = \frac{\sum_{i=1}^{n} a_i p_{z,i}^2}{\sum_{i=1}^{n} a_i \vec{p}_i^{\,2}}$$

where $\vec{p}_i$ denotes the i-th TDV and $p_{z,i}$ the corresponding component perpendicular to the surface.

For an isotropic film, which can be described by an effective TDV with three equal vector components Px=Py=Pz, the resulting value is θ=0.33. A film with the transition dipoles all aligned parallel to the substrate will not have any perpendicular component and θ=0, while a film with all of the transition dipoles perpendicular to the substrate will be represented by a TDV of $\vec{p}=(0,0, p_z)$ and a θ value of 1. Vertically oriented transition dipoles couple strongly to surface plasmons in the metal electrodes of the OLED, decreasing the external efficiency of the OLED, therefore the smallest possible value of θ is desired.

Figure 4A:
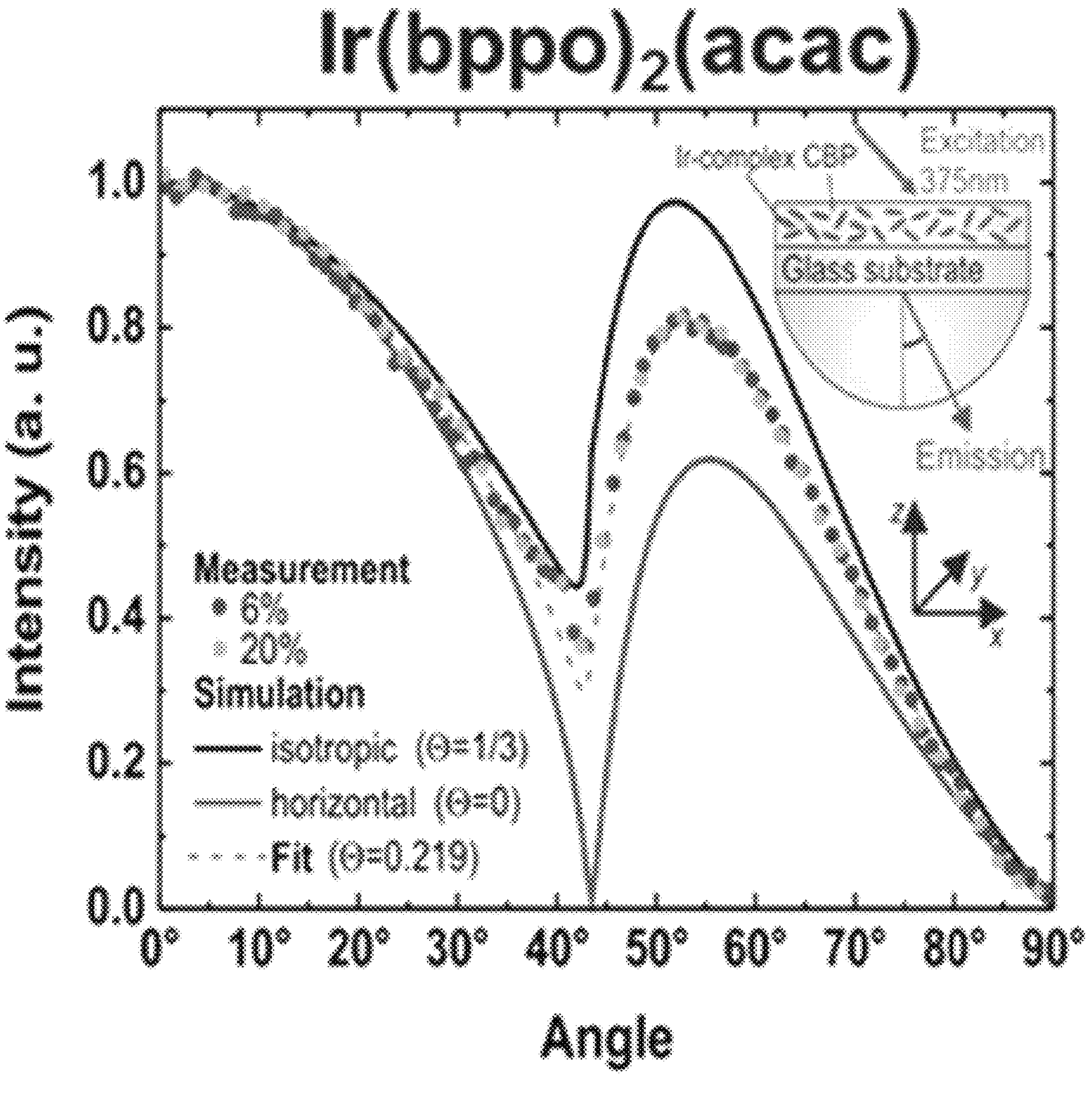
FIGS. 4A, 4B, and 4C show cross-sections of the measurements and simulations of the angular dependent p-polarized PL emission spectra (considering an emission in the x-z-plane) for films of 15 nm CBP doped with different dopants at different doping levels on glass substrates.
Figure 4B:
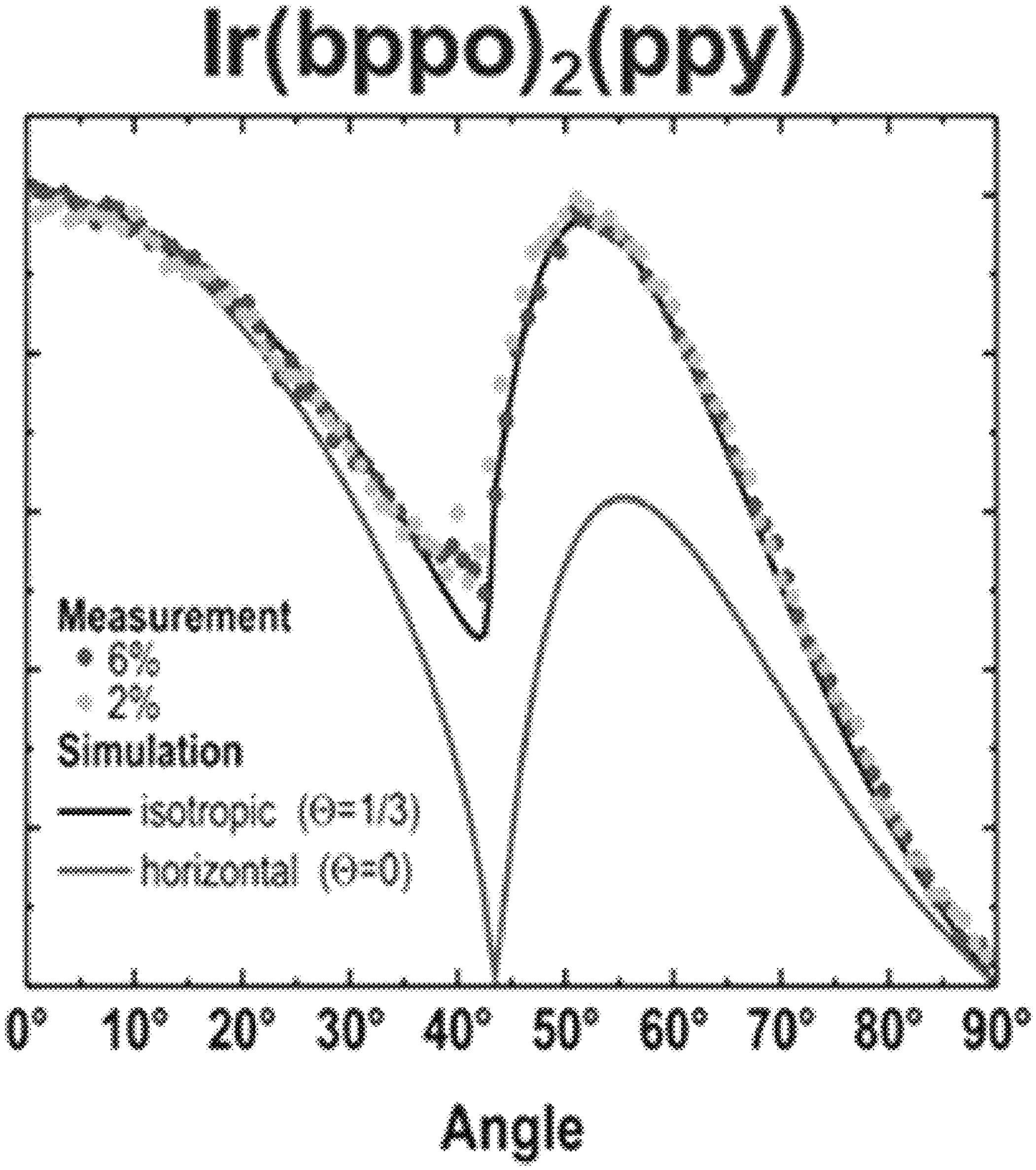
Figure 4C:
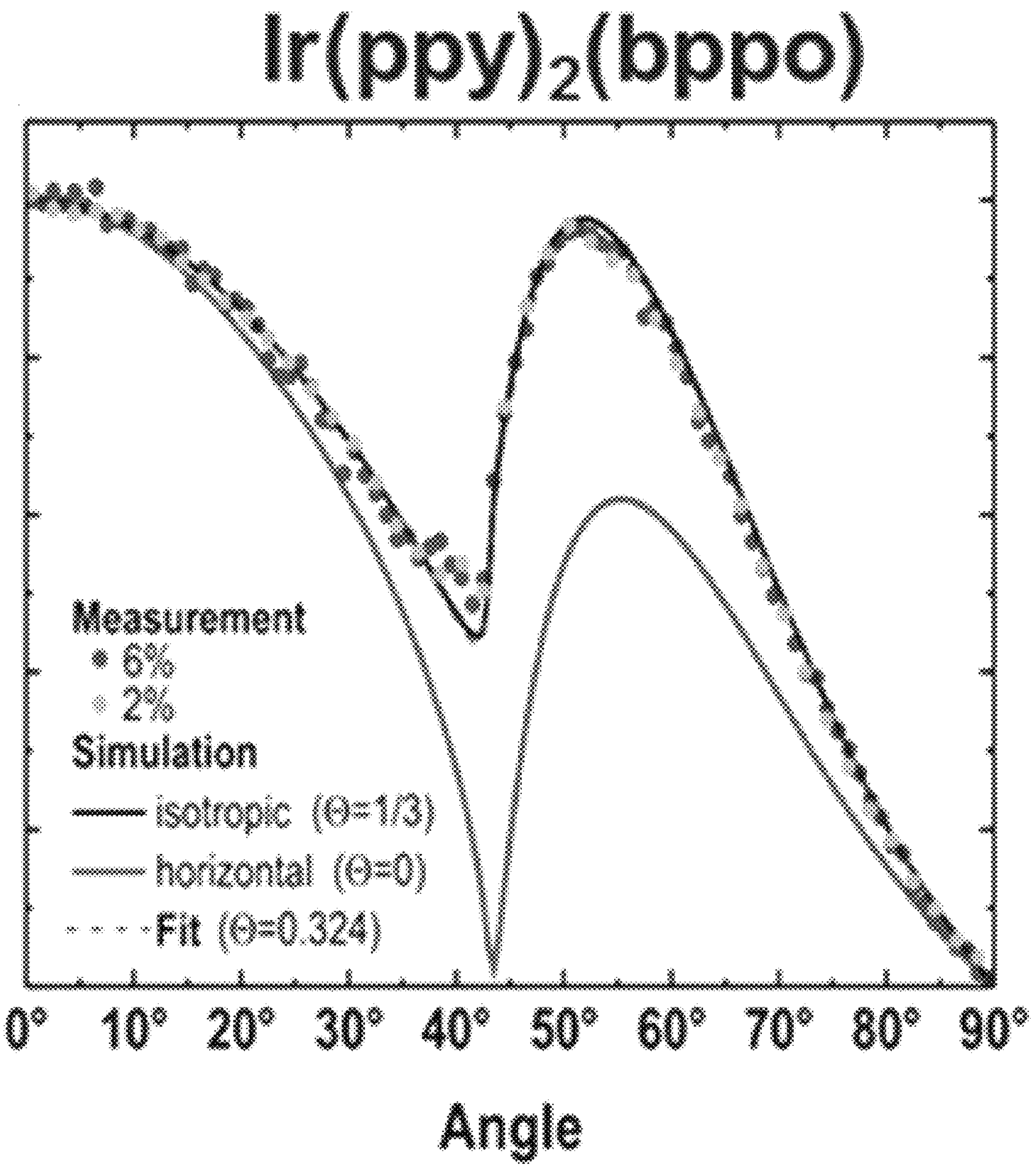

FIGS. 4A, 4B, and 4C show cross-sections of the measurements and simulations of the angular dependent p-polarized PL emission spectra (considering an emission in the x-z-plane) for films of 15 nm CPB doped with different dopants at different doping levels on glass substrates. FIG. 4A shows the data for films of 15 nm CBP doped with $(bppo)_2Ir(acac)$ (at 540 nm). FIG. 4B shows the data for films of 15 nm CBP doped with $(bppo)_2Ir(ppy)$ (at 530 nm). FIG. 4C shows the data for films of 15 nm CPB doped with $(ppy)_2Ir(bppo)$ (at 550 nm). The measured data have been fitted (dashed line) to determine the degree of orientation. $(bppo)_2Ir(acac)$ θ=0.22; $(bppo)_2Ir(ppy)$ θ=0.33; and $(ppy)_2Ir(bppo)$ θ=0.32.

As shown in FIG. 4A, films of 15 nm CBP doped with $(bppo)_2Ir(acac)$ (6% v/v) exhibit θ=0.22. In contrast, as shown in FIGS. 4B and 4C, the emission from the CBP films doped with $(bppo)_2Ir(ppy)$ and $(ppy)_2Ir(bppo)$ were observed to be nearly isotropic at all measured doping levels. The net horizontal orientation for $(bppo)_2Ir(acac)$ is similar to the value observed for other heteroleptic iridium complexes with diketonate ligands. Interestingly, we observed that films doped with $(bppo)_2Ir(acac)$ at 20% (v/v) still exhibit θ=0.22 with nearly identical line fits, despite being well into the concentration quenched regime.

The inventors found that complexes with large ground state dipole moments such as fac-$Ir(ppy)_3$ (μ=6.4 D) aggregate in doped films to a greater extent than complexes with smaller dipole moments such as $(ppy)_2Ir(acac)$ (μ=1.4 D). The aggregated complexes are proposed to undergo a decreased interaction with the host matrix and are thus randomly oriented. The inventors gauge dopant aggregation by measuring spectral broadening of the emission. All of our tested dopants exhibit spectral broadening along with concentration quenching due to aggregation, as expected because of their large permanent dipole moments. The concurrent observed red shifted emission in our measured doped films indicates that these aggregates emit photons. The unchanged orientation measured in the extremely concentrated (20% v/v) $(bppo)_2Ir(acac)$ film implies that aggregates orient equally to the freely dispersed molecules, and the lack of aggregation is not responsible for the consistently observed net horizontal orientation of heteroleptic iridium complexes containing an acac ligand. Additionally, no deviation from isotropic orientation was observed for films containing $(bppo)_2Ir(ppy)$ and $(ppy)_2Ir(bppo)$ even at doping levels low enough to prevent any likely aggregation (2% v/v).

In order to understand the observed alignment for the bppo and related $Ir(C^\wedge N)_3$ and heteroleptic complexes, it is helpful to define the orientation of the transition dipole moment relative to the molecular frame, since our optical measurement only gives the relationship of the TDV to the substrate plane. Emission from cyclometallated iridium complexes is due predominantly to a triplet metal-to-ligand-charge-transfer ($^3$MLCT) transition. In a heteroleptic Ir complex, emission is expected to originate from a $^3$MLCT state involving the ligand(s) with the lowest triplet energy. If one ligand, $C^\wedge N_a$, has a lower triplet energy than the other heteroligand, ($C^\wedge N_b$ or $O^\wedge O$) the second ligand is considered to be ancillary and the molecule will exhibit photophysical characteristics determined by the $Ir(C^\wedge N_a)$ moiety. Calculated triplet spin density surfaces indicate that all three bppo based complexes considered here emit from a $^3$MLCT state involving a single bppo ligand. The $(bppo)_2Ir(acac)$ species can emit from either bppo ligand since the triplet states in this complex are degenerate, due to the inherent $C_2$ molecular symmetry. The $(bppo)_2Ir(ppy)$ species does not have perfectly degenerate emissive states because of the asymmetry introduced by the ppy ligand, but the calculated separation between the depicted triplet density and the equivalent state on the other bppo ligand is only 0.01 eV.

Figure 5A:
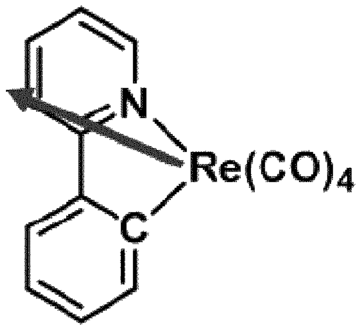
FIGS. 5A and 5B illustrate the orientation of the transition diple moment vectors measured in $(ppy)Re(CO)_4$, shown in FIG. 5A, and proposed for (bppo)Ir based emitters, shown in FIG. 5B.
Figure 5B:
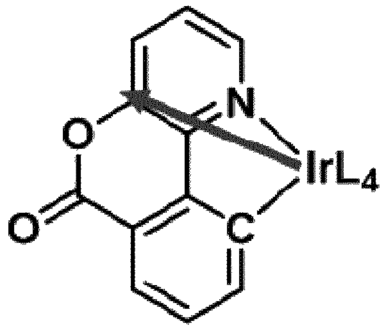

The next step is to determine the orientation of the TDV for the "(bppo)Ir" fragment and ultimately to the permanent dipole moment of the molecule. Fortunately, the orientation of the TDV has been determined experimentally for the closely related cyclometallated complex $(ppy)Re(CO)_4$ by examining the polarization of emission obtained from a single crystal. Just as observed for the "$Ir(C^\wedge N)$" based emitters, this Re complex emits from a $^3$MLCT involving the "(ppy)Re" fragment. The transition dipole was found to lie in the plane of the ppy ligand directed 18.5° away from the Re—N bond axis (see FIG. 5A). Considering the molecular and photophysical properties of $(bppo)_2Ir(acac)$ are similar to those of $(ppy)_2Ir(acac)$, the orientation of the transition dipole for the two cyclometalated ligands can then be expected to lie in a similar direction. Therefore, we estimate molecular transition dipoles of the Ir(bppo) complexes to lie in the plane of the emissive ligand, canted away from the direction of the Ir—N bond by roughly 20° (see FIG. 5B).

The angles between the permanent and transition dipole moments for the dopant $(bppo)_2Ir(acac)$ is 86°, for the dopant $(bppo)_2Ir(ppy)$ is 780 and 93°, for the dopant $(ppy)_2Ir(bppo)$ is 68°. With two identical emissive bppo ligands, $(bppo)_2Ir(acac)$ and $(bppo)_2Ir(ppy)$ have similar angles between their ground state and transition dipole moment vectors. Since both ground state and transition dipole vectors orient toward the single emissive bppo ligand, $(ppy)_2Ir(bppo)$ has smaller angle between the permanent and transition dipoles. Considering the similarities of these angles for the three complexes and the fact that only $(bppo)_2Ir(acac)$ shows a net alignment in doped films we can rule out the molecular dipole as being responsible for dopant alignment in Ir-phosphor based films.

The complexes studied here have similar electrostatic surfaces dominated by the strongly electronegative coumarin ligand, yet demonstrate quite different orientation behavior in CBP. Furthermore, the apparent lack of dependence on ground state dipole and the consistency of the orientation values for a wide range of heteroleptic molecules coordinated with a diketonate ligand dispersed in numerous amorphous dopant host materials lead us to conclude that the presence of the acac ligand is principally responsible for the observed orientation.

Here we propose a new mechanism for emitting dopant alignment, which recognizes that the surface of an amorphous (isotropic) film is inherently asymmetric, i.e. organic film versus vacuum, that leads to the alignment of molecules deposited on it. The acac group presents an aliphatic region on the surface of the $(C^N)_2Ir(acac)$ complex, which lies along the molecular $C_2$ axis. We propose that the boundary created between the organic host material on the substrate and the vacuum of the deposition chamber during fabrication causes the asymmetrical $(C^N)_2Ir(acac)$ molecules to orient with the aromatic ligand groups toward the organic layer, and the aliphatic acac group exposed to the vacuum, before it is over coated with an amorphous layer of the host material. Molecular rearrangement on surfaces is known to occur on time scales consistent with this mechanism.44-46 Note that the orientation measurement describes only the relative components of the TDV, thus the measured values will be the same if the molecule is inverted, with acac ligand interacting with the organic layer. This hypothesis would explain the surprisingly narrow range of 0 measured for phosphors containing diketonates in hosts for red through green phosphors with widely varied cyclometallating ligands (0 values reported for $(C^N)_2Ir(acac)$ emitters are 0.20-0.25).

To further test our hypothesis we compared films of $(MDQ)_2Ir(acac)$ doped into NPD (8% v/v) prepared by both vacuum deposition and by spin coating from chloroform solutions. The spin cast films (15 nm on glass) displayed an orientation of θ=0.36, i.e.nearly isotropic. When fabricated by vapor deposition, the same system demonstrates horizontal orientation with θ=0.24, in good agreement with the reported values of alignment for $(C^N)_2Ir(acac)$ dopants. This result indicates that the vacuum/organic boundary created during vapor deposition is critical to producing the observed alignment in the measured heteroleptic systems.

Figure 6A:
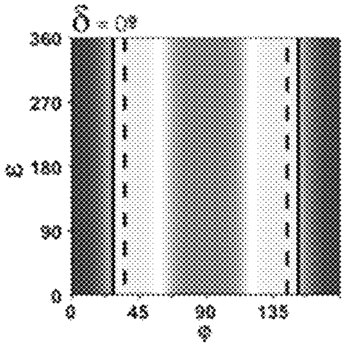
FIGS. 6A through 6E are surface maps illustrating the dependence of the optical anisotropy parameter (θ, represented here by a grayscale gradient) on molecular rotation for any $(C^\wedge N)_2Ir(O^\wedge O)$ molecule with the starting orientation as shown in FIG. 6F.
Figure 6B:
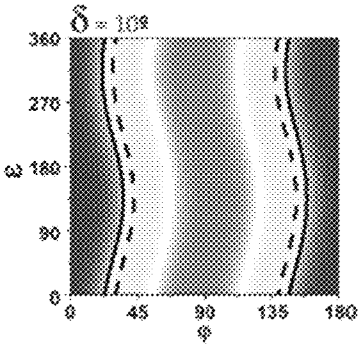
Figure 6C:
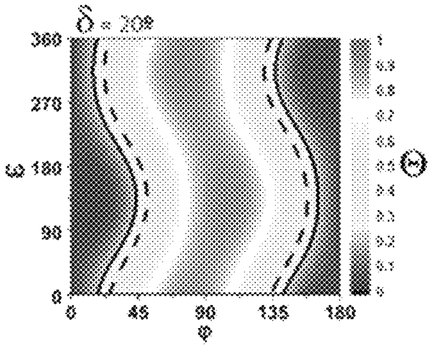
Figure 6D:
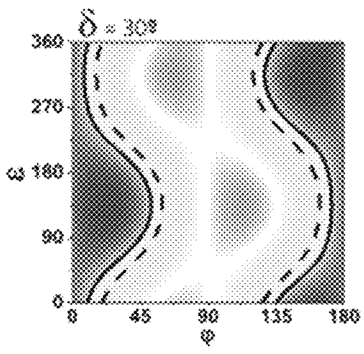
Figure 6E:
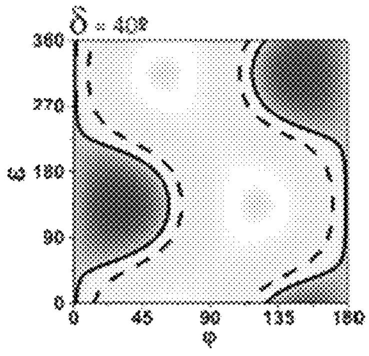
Figure 6F:
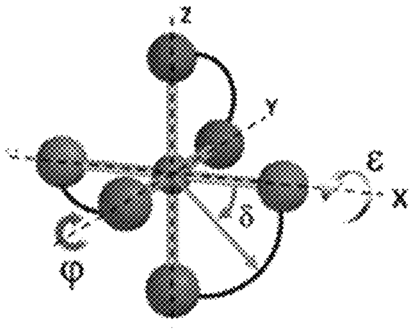
FIGS. 6G through 6K are surface maps illustrating the dependence of the optical anisotrophy parameter on molecular rotation for any homoleptic fac-Ir(C^N)$_3$ molecule with the starting orientation as shown in FIG. 6L. The angle N—Ir-TDV is δ, where δ=0° corresponds to a TDV oriented directly towards the nitrogen. ε is rotation about the x-axis, φ is rotation around the y-axis in the direction shown in the sketch. The solid line is θ=0.22 and the dashed line is θ=0.33 (isotropic).
Figure 6G:
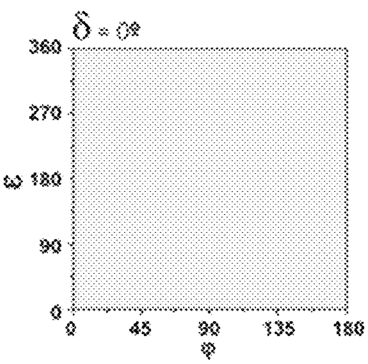
Figure 6H:
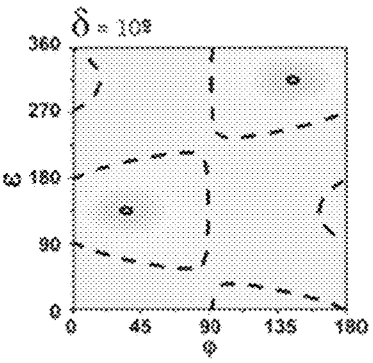
Figure 6I:
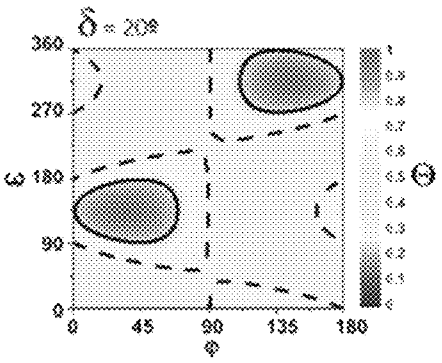
Figure 6J:
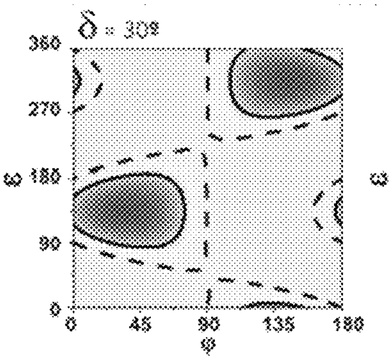
Figure 6K:
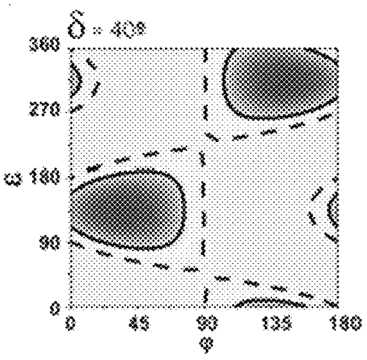
Figure 6L:
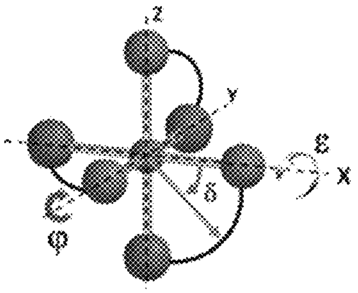

To assess the validity and consequences of this proposed mode of dopant alignment we have developed a mathematical representation for both $(C^N)_2Ir(O^O)$ and fac-$Ir(C^N)_3$ species from which 0 can be calculated for any molecular orientation. The coordinate system and direction of rotation for the molecules around angles ε and φ are depicted in FIGS. 6F and 6L. The z-axis is orthogonal to the substrate. The model assumes that the TDV lies in the plane of the $(C^N)Ir$ ligands with an angle δ between the Ir—N bond and TDV. To probe the dependence of θ on molecular orientation for various values of δ, the metal complex is rotated in the imposed coordinate system. The starting point for both types of complexes (ε=φ=0°) is as shown in the figure. The order of the rotations is not arbitrary. Rotation around E must be applied first since the molecular arrangement changes after the first rotation, but the axes themselves do not. Using this model the value of θ can be determined by calculating the projection of the TDV of the emissive ligand(s) onto the x, y, and z directions.

The dependence of θ on variation of the TDV angle δ is markedly different for the two types of complexes. Values of θ for $(C^N)_2Ir(O^O)$ complexes with δ<10° are relatively insensitive to rotation around ε but vary greatly with changes in φ as shown in FIGS. 6A-6E. As the magnitude of δ increases, the dependence of θ upon rotation around ε becomes more pronounced. Regions of low θ become localized near values of ε that place the $C_2$ axis in the x-y plane, parallel to the substrate. In contrast, an idealized fac-Ir $(C^N)_3$ complex with a TDV oriented along either the Ir—N or Ir—C bonds (δ=0 or 90°, respectively) will yield a 0 value of 0.33 for all molecular orientations as shown in FIGS. 6G-6K. In this case, the emission patterns of a perfectly aligned emitter and a randomly oriented one would be indistinguishable. As the TDV deviates from the metal-ligand bond axis, regions of low θ appear, centered at angles of ε and φ that place the molecular $C_3$ axis perpendicular to the x-y plane.

Figure 7:
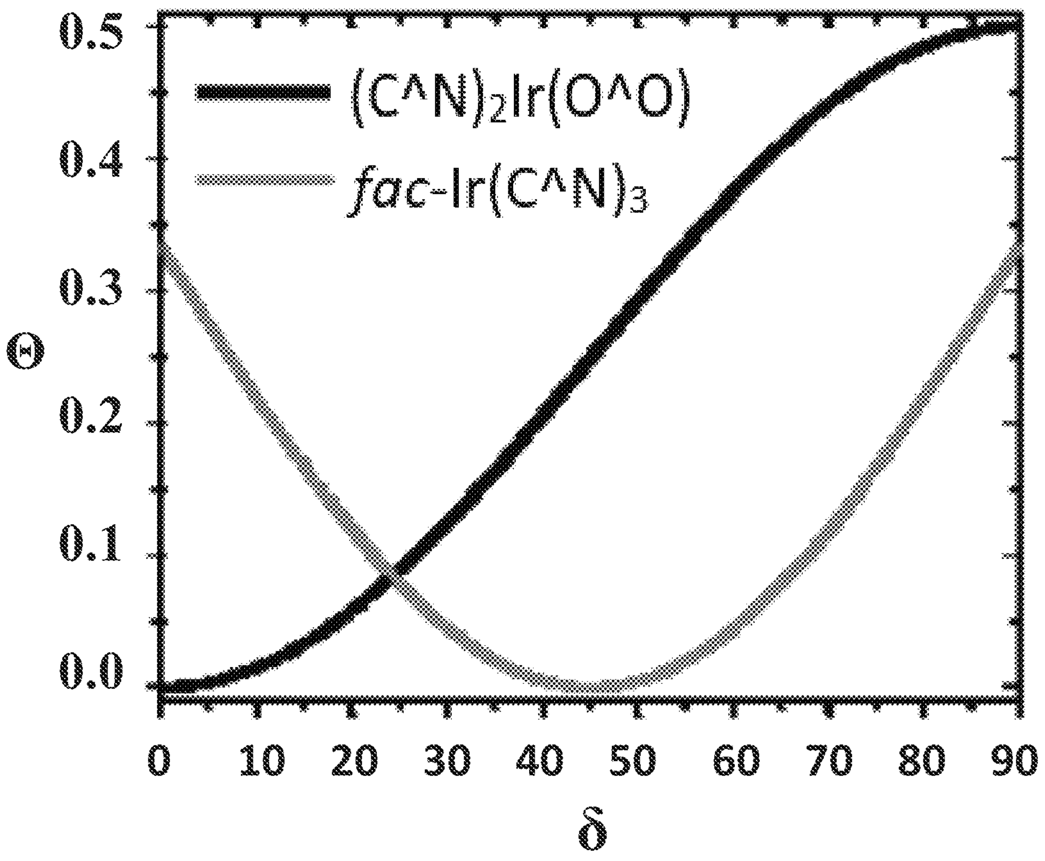
FIG. 7 is a plot of δ vs. θ for (C^N)$_2$Ir(O^O) (black line) and fac-Ir(C^N)$_3$ complex (gray line) molecules uniformly oriented with their $C_2$ axis perpendicular to the substrate.

Based on our stated mechanism of dopant alignment, we propose that vapor deposited $(C^N)_2Ir(O^O)$ molecules are oriented with the $C_2$ axis perpendicular to the substrate (ε=45° and φ=0°). As is likely in a large population of molecules, variations in molecular orientations will result in some deviation from an idealized θ value. FIGS. 6A through 6E demonstrate the impact of changing these variables on the value of θ for any $(C^N)_2Ir(O^O)$ complex. Considering that the spin density of the emissive $^3$MLCT state in $(bppo)_2Ir(acac)$ is heavily localized toward the pyridyl moiety of the emissive ligand, the TDV is expected to be comparable to that found for $(ppy)Re(CO)_4$ (δ=18.5°).40 If the molecules are uniformly oriented with the $C_2$ axis perpendicular to the substrate, the measured emission anisotropy (θ=0.22) equates to a value for δ of approximately 40° (FIG. 7). It is anticipated that the actual molecular orientation is disordered with some rotation about φ, as well as ε. Some divergence in the δ angle of $(bppo)_2Ir(acac)$ from the value observed in $(ppy)Re(CO)_4$ is also expected due to the introduction of the strongly electron withdrawing carboxylate functionality. In the more chemically likely range of values of 6 between 20° and 30°, a rotation around φ of only 7° will yield a θ value of 0.22. To further improve intrinsic orientation it will therefore be necessary to shift the direction of the TDV toward the Ir—N bond. However, regions with the lowest θ values are much more sensitive to small changes in molecular orientation, suggesting that these systems will be less forgiving of any distribution of molecular orientations.

FIGS. 6G through 6K show that fac-$Ir(C^N)_3$ complexes with related δ alues between 20° and 30° for the TDV, if properly aligned, are also capable of generating anisotropic emission. The fact that the $(bppo)_2Ir(ppy)$ and $(ppy)_2Ir(bppo)$ molecules display isotropic emission indicates that they are randomly oriented in the film. The isotropic behavior likely originates because these molecules have no significant difference in their overall structure to promote orientation. However, there are examples where anisotropic emission has been observed from films doped with homoleptic fac-Ir(C^N)$_3$ complexes. These complexes have a bilateral structural asymmetry across the principal rotation axis, similar to (C^N)$_2$Ir(O^O) species, created by having disparate structures for the C-metalated and N-coordinated moieties. If the complexes align on the surface of the growing film by our proposed mechanism, the bilateral asymmetry would orient the molecular $C_3$ axis perpendicular to the substrate plane. The measured orientation values ($\Theta$=0.22) would correspond to a TDV angle of $\delta$=100 (FIG. 7), well within the anticipated range for planar C^N ligands. This result suggests that facial homoleptic emitters can produce orientation values capable of drastically improving device EQE upon proper tuning of the ligand TDV and introduction of chemical anisotropies.

We studied a series of heteroleptic iridium complexes with ground state dipole moments between 6.2 D and 8.4 D. The complexes varied widely in relative orientations of the ground state dipoles and TDV. We found that (bppo)$_2$Ir (acac) partially aligns in thermally evaporated films of host molecule CBP, to the same degree observed for other (C^N)$_2$Ir(O^O) complexes. All three of the bppo based emitters have large dipole moments, but only (bppo)$_2$Ir (acac) shows horizontal orientation with $\Theta$=0.22. Emission from the other two bppo based emitters is isotropic, with average TDV having equal components in x, y and z; $\Theta$=0.33.

Based on these results we conclude that the presence of the diketonate group is responsible for the commonly measured value of $\Theta\approx$0.2 for a large variety of (C^N)$_2$Ir(O^O) species. We hypothesize that interaction of the chemically anisotropic species and the boundary created between the vacuum and the organic surface during deposition is responsible for the observed uniform orientation, wherein the phosphor's $C_2$ axis is perpendicular to the plane of the substrate. This proposed mechanism for alignment is consistent with the $\Theta$ value being unaffected by aggregation of the dopant. If the driving force for dopant alignment is the organicvacuum interface, a dopant deposited on the surface will align the same way whether the underlying surface is the host material or another dopant molecule.

Thin film deposition: Films in the experiments were made in an Angstrom Engineering EvoVac 800 VTE deposition system attached to a glove box and Inficon SQS-242 deposition software was used to control deposited material thicknesses using a 6 MHz Inficon quartz monitor gold coated crystal sensor. All films deposited in the VTE were performed at pressures ≤4×10-4 Pa and with deposition rates less than 1 Å/s. Organic films were stored under a nitrogen atmosphere. Doped films on glass substrates for orientation measurements were fabricated at pressures ≤5×10-5 Pa with deposition rates of ca. 1.5 Å/s for CBP and various dopant concentrations (v/v). Films were encapsulated with a glass cover in nitrogen atmosphere to prevent photodegeneration upon PL excitation during orientation measurements. To determine the molecular orientation in doped films, angular-dependent photoluminescence (PL) measurements have been performed. The sample was attached to a fused silica half cylinder prism by index matching liquid and the emission angle was changed using a rotation stage. Spectra were recorded using a fibre optical spectrometer (SMS-500, Sphere Optics) and a polarizing filter to distinguish between p- and s-polarized light. The excitation of the samples was performed with a 375 nm cw laser diode with a fixed excitation angle of 45°. The degree of orientation of the optical transition dipole moments of the emitter molecules was determined from numerical simulation reported previously.

Spin Coating: Films were cast from chloroform solutions. 1 mg of each organic compound was dissolved in 1 ml chloroform. Then, a mixture of both solutions was prepared with 4.6 ml NPD/chloroform and 0.4 ml Ir(MDQ)$_4$(acac)/chloroform resulting in a doping concentration of 8% Tr(MDQ)2(acac):NPD. Variable angle spectroscopic ellipsometry was performed (Si-substrate used) to determine thickness and the optical constants of the films after spin coating and drying for 1 hour at room temperature. The thickness of the films was additionally checked by the fitting procedure of the angular dependent photoluminescence emission_spectra (p-pol for the orientation and s-pol for the actual thickness).

The same type of calculation discussed above in connection with FIGS. 6A through 6K can be used to determine the optimum angle of transition dipole moment in emissive ligand for a range of other molecular systems such as mer-Ir($L_A$)$_3$ or more complex polydentate ligands coordinated or cyclometallated onto a central metal. If one assumes that the molecule can be aligned with the principal rotation axis ($C_2$ for Ir($L_A$)$_2$($L_B$) system and $C_3$ forfac-Ir($L_A$)$_3$ system) perpendicular to the surface, the optimal angles between the Ir—N bond and the TDV are 0° and 45°, respectively. We believe that the angle for Ir-bppo complexes is between 20° and 30°, illustrating a mechanism for tuning this angle toward 45°. Adding electron withdrawing groups to the center of a C^N ligand, as in bppo, will shift the LUMO density toward the center of C^N ligand and thus the TDV toward/near 45°. Other examples of ligands that will shift the TDV toward 45° are given below. In the Ir($L_A$)$_2$($L_B$) system, the goal is to make the direction of the Ir—N bond and the TDV coincident. This is accomplished by either extending conjugation along the Ir—N direction (thus extending the LUMO) or by decreasing the size of the π-system at the carbon end of the C^N ligand and thereby increase the metal character of the HOMO. These are also illustrated below. These are all illustrated for the ppy ligand system. Similar argument can be made for other bidentate and tridentate ligand systems, including carbene and other dative components in place of pyridine.

Ligands that will shift the angle between the Ir—N bond and the TDV toward 45°:

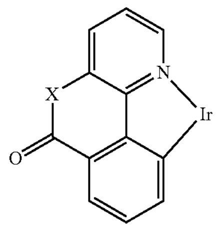

where X is O, S, NR, or $CR_2$,

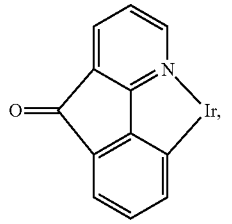

-continued

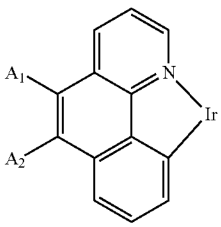

where A is an electron acceptor, such as CN, $NO_2$, halide, etc.

Ligands that will shift the angle between the Ir—N bond and the TDV toward 0° by extending the LUMO along the Ir—N bond direction:

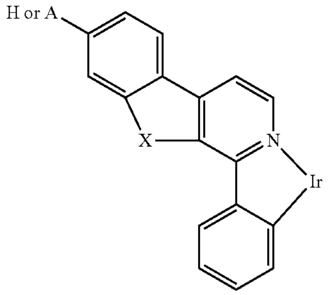

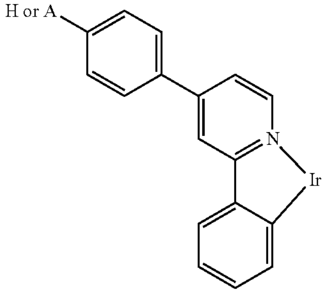

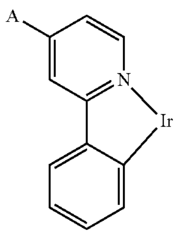

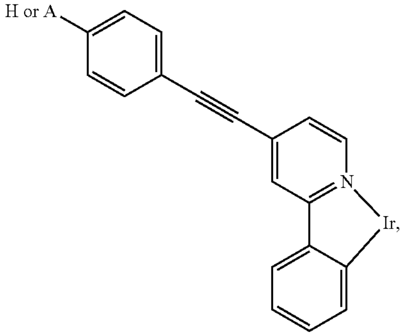

where X is $CR_2$, O, S, or NR; A is an electron acceptor, such as CN, $NO_2$, halide, etc.

Ligands that will shift the angle between the Ir—N bond and the TDV toward 0° by decreasing the size of the π-system at the carbon end of the C^N ligand:

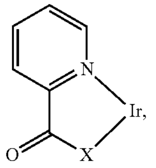

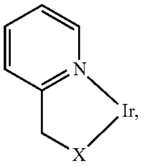

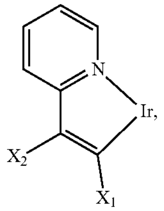

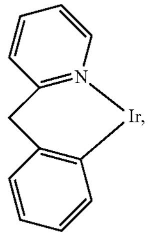

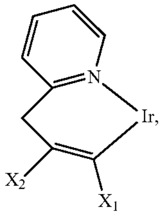

where X is O, S, NR, or $CR_2$.

One can chemically change the direction of the TDV in the ligand by changing the electron density through substitution and inclusion of new functionalities and heteroatoms.

By changing the ligands, both emissive and the ancillary, one can alter the orientation of the dopant and therefore the direction of emitted light. For example, by appending long alkyl chains in the R positions shown below we can promote alignment of the molecules with their $C_3$ axes perpendicular to the substrate surface. Adding alkyl chains to the ancillary ligand (e.g. acac) will promote alignment of the $C_2$ axis perpendicular to the substrate surface.

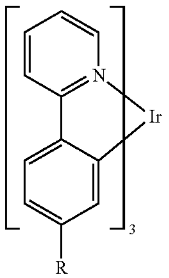

Possible coordination geometries of phosphorescent dopants. "A" refers to any non-emissive or ancillary ligand. In each geometry, a different transition dipole vector angle will be preferred.

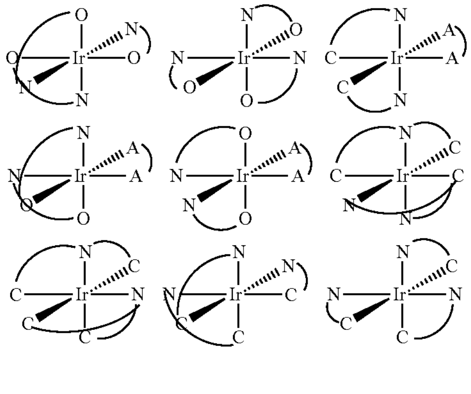

-continued

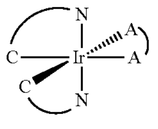
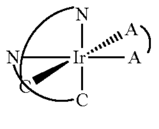
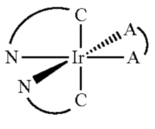

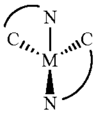
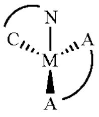
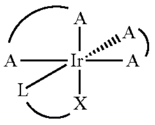

The organic light emitting device disclosed herein can be incorporated into one or more of a consumer product, an electronic component module, an organic light-emitting device, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2+1})_2$, $N(Ar_1)(Ar_2)$, $CH{=}CH{-}C_nH_{2n+1}$, $C{\equiv}C{-}C_nH_{2n+1}$, $Ar_1$, $Ar_1{-}Ar_2$, and $C_nH_{2n}{-}Ar_1$, or the host has no substitution. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiphene, dibenzofuran, dibenzoselenophene, azatriphenylene, azacarbazole, aza-dibenzothiophene, aza-dibenzofuran, and aza-dibenzoselenophene. The host can include a metal complex.

The host can be, but is not limited to, a specific compound selected from the group consisting of:

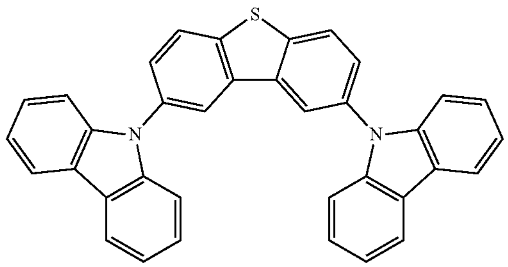
,

-continued

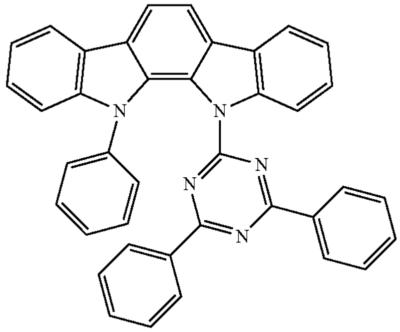
,

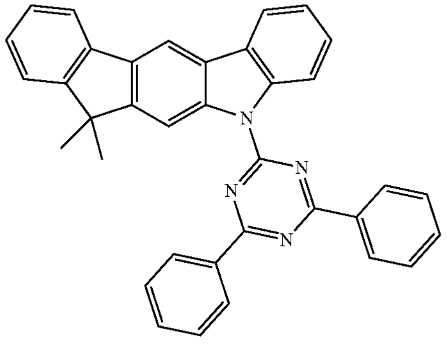
,

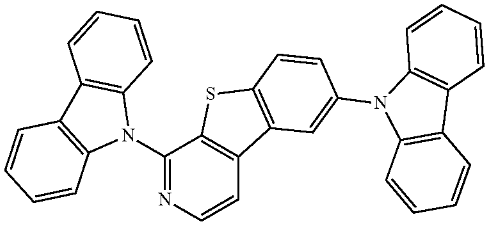
,

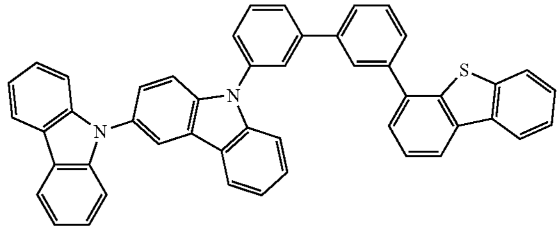
,

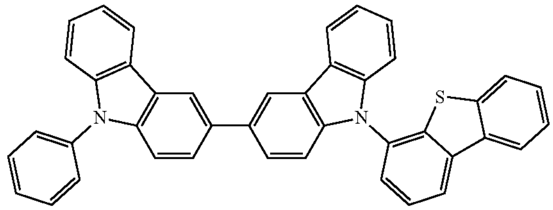
,

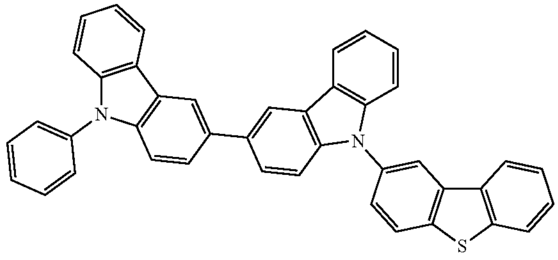
,

-continued
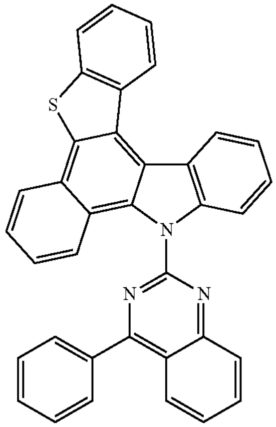
,
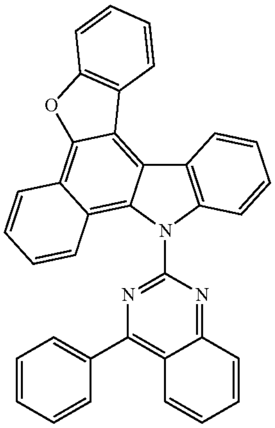
,
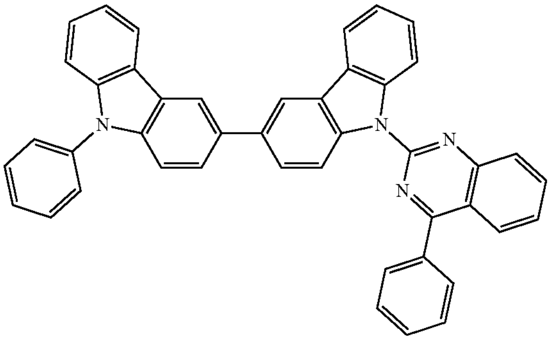
,
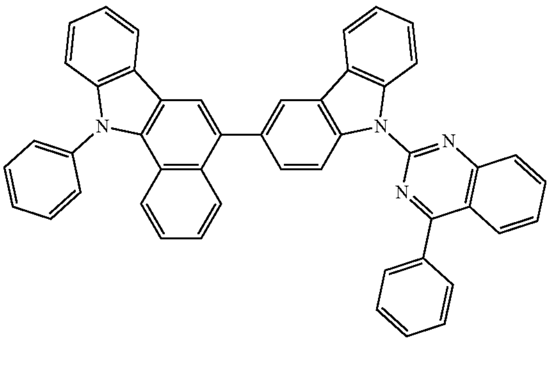
,
-continued
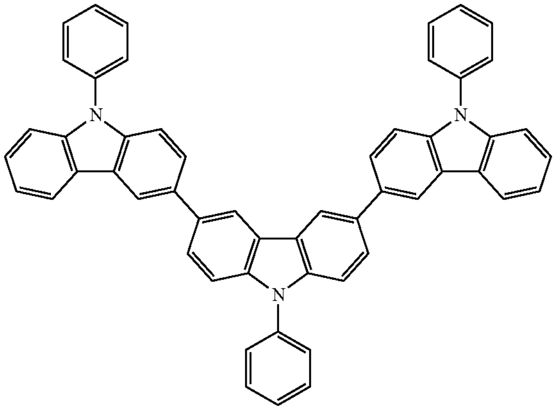
,
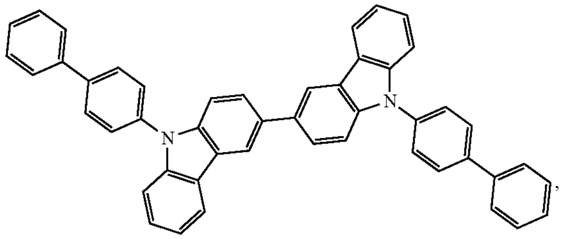
,
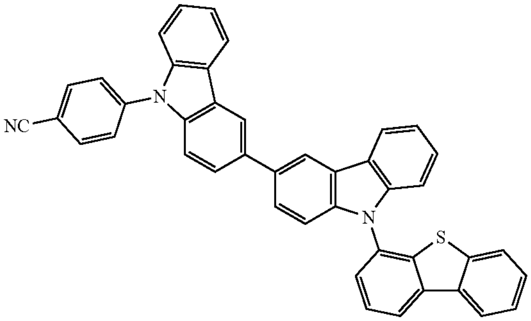
,
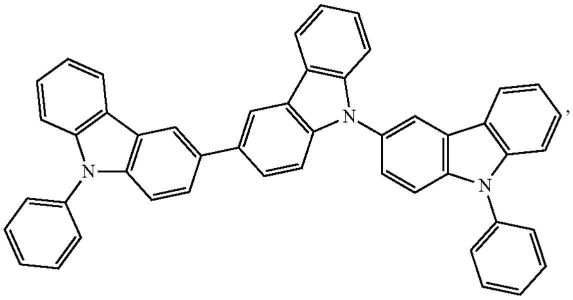
,
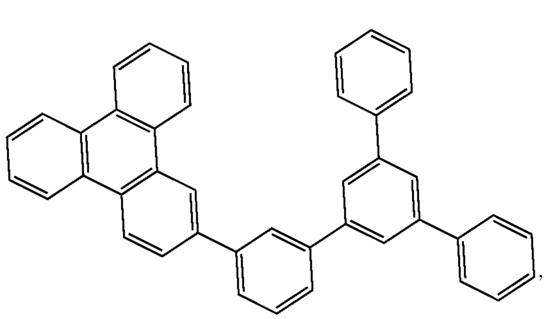
, -continued

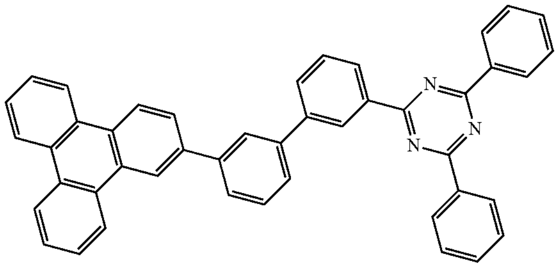
,

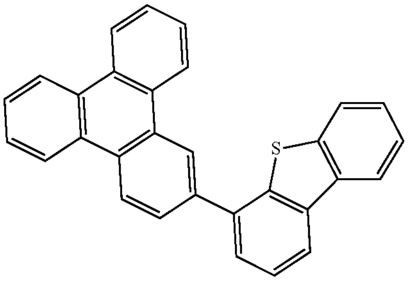
,

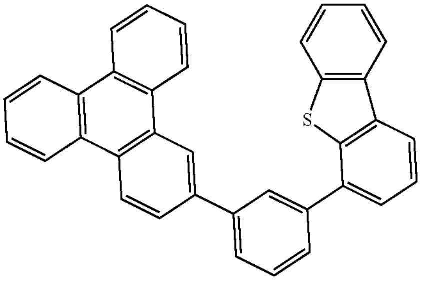
,

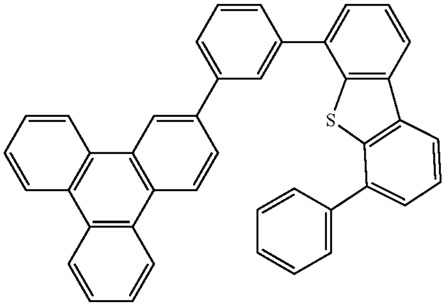
,

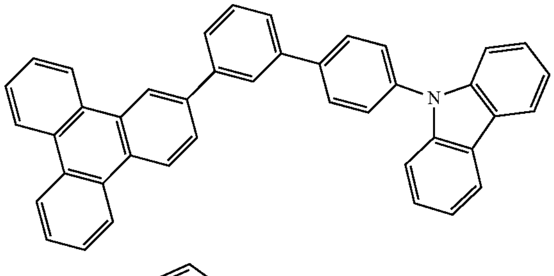
,

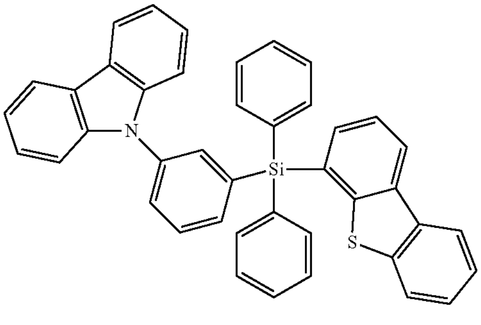
,

-continued

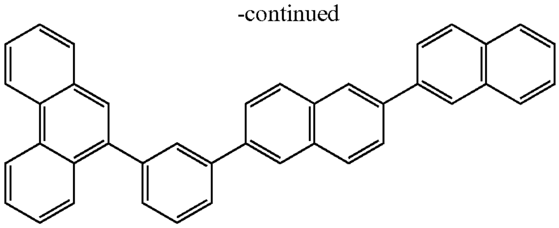
, and combinations thereof. Additional information on possible hosts is provided below.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer. Non-limiting examples of the conductivity dopants that may be used in an OLED in combination with materials disclosed herein are exemplified below together with references that disclose those materials:

EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804 and US2012146012.

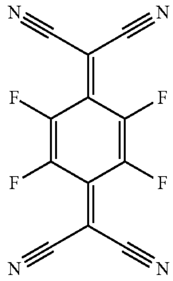

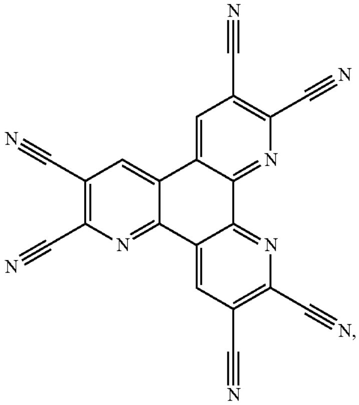
,

-continued

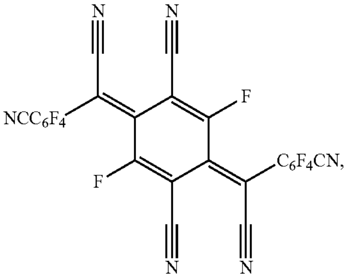

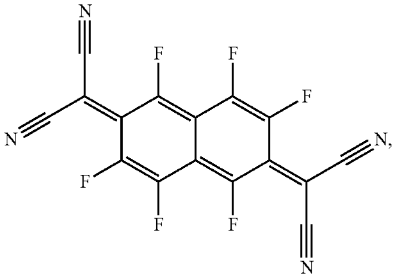

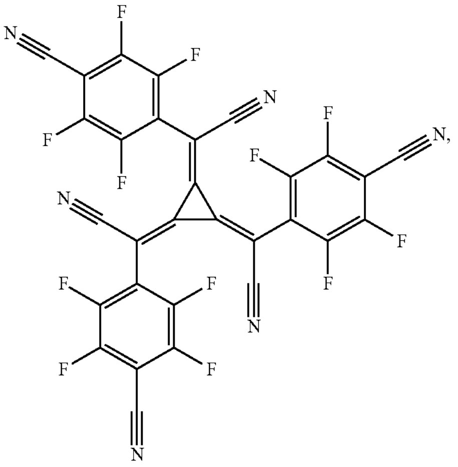

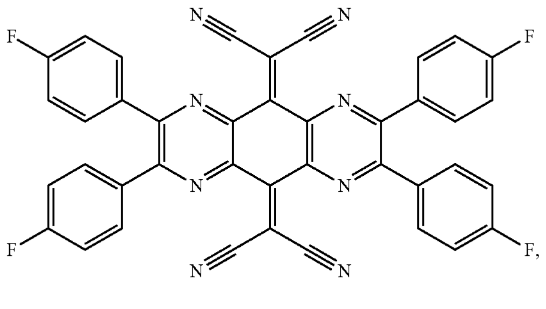

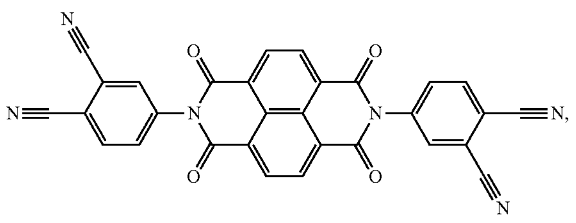

-continued

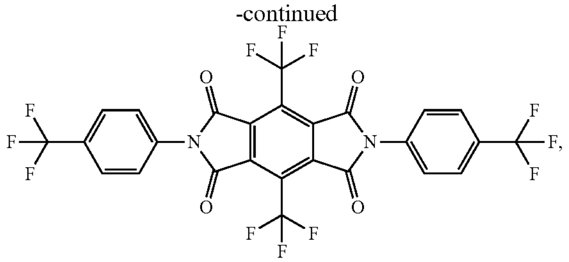

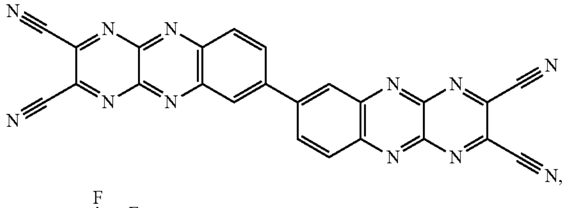

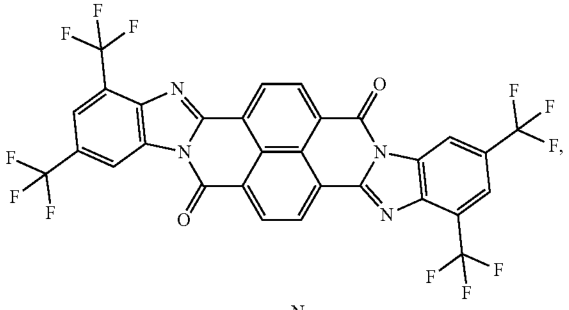

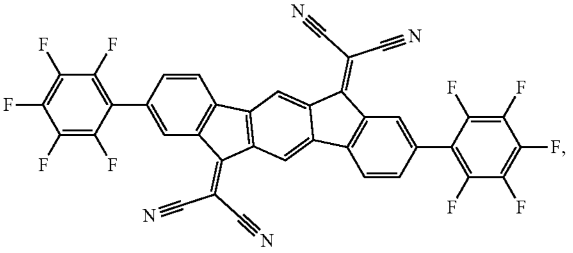

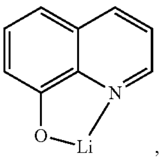

, and

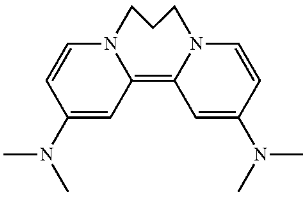

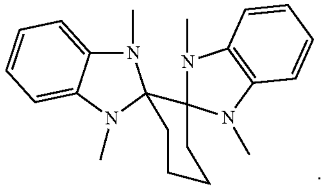

.

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as MoOx; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

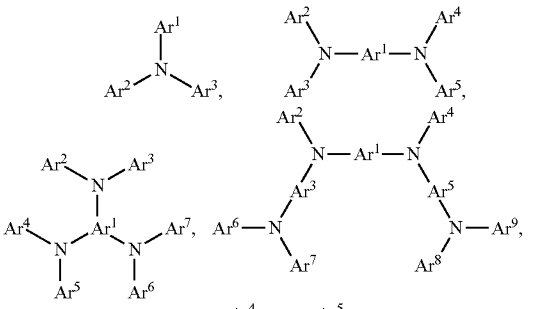

and

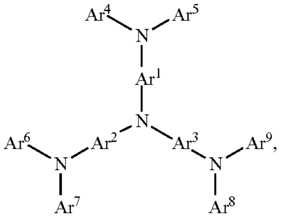

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

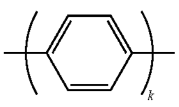

,

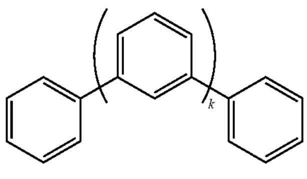

,

-continued

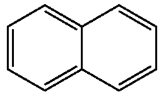

,

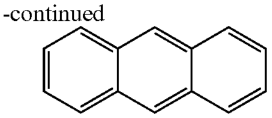

,

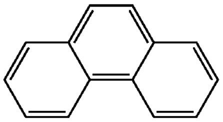

,

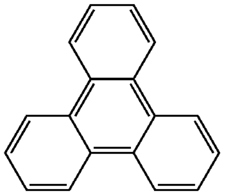

,

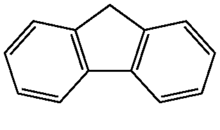

, and

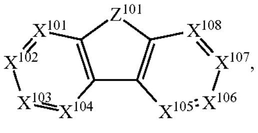

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

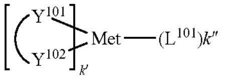

wherein Met is a metal, which can have an atomic weight greater than 40; $(Y^{101}\text{-}Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}\text{-}Y^{102})$ is a 2-phenylpyridine derivative. In another aspect, $(Y^{101}\text{-}Y^{102})$ is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials:

CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

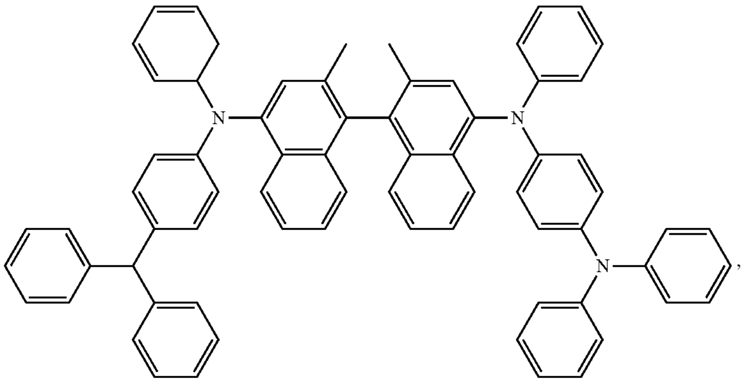
,
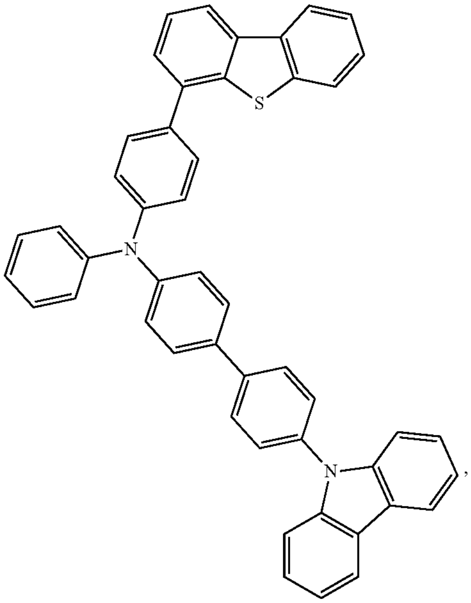
,
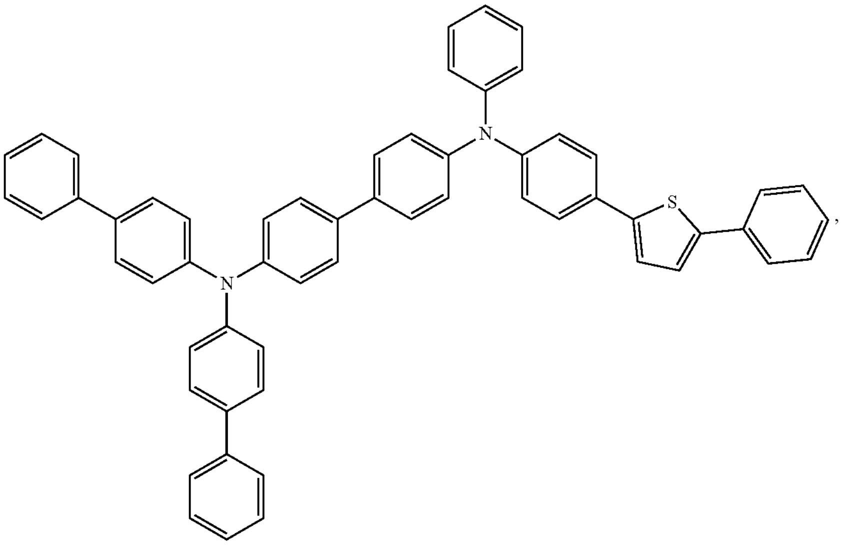
,

-continued
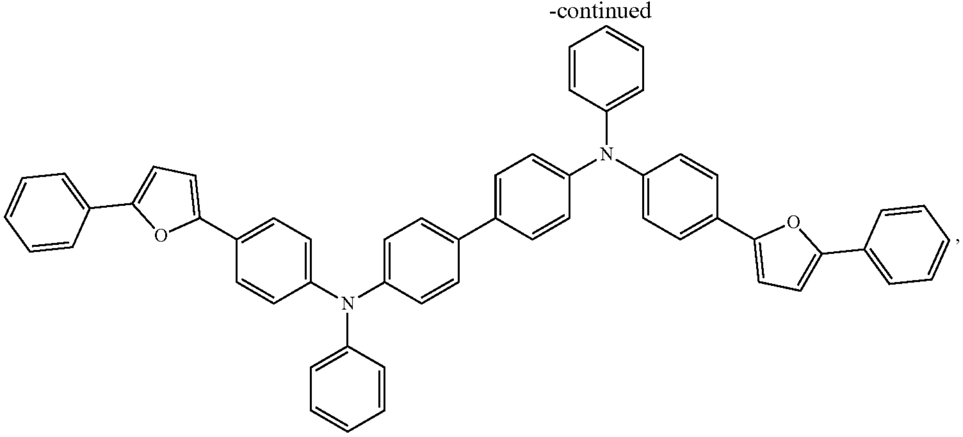
,
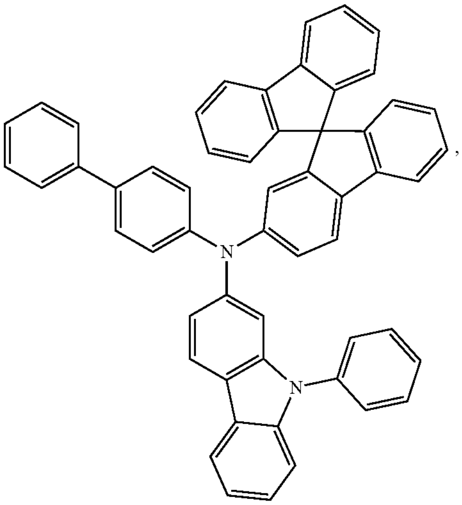
,
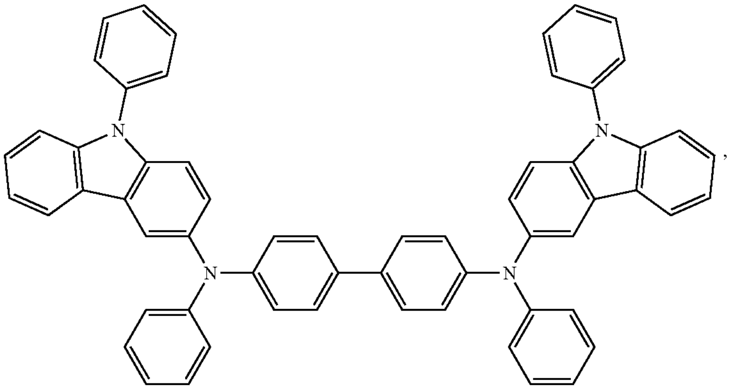
,

-continued
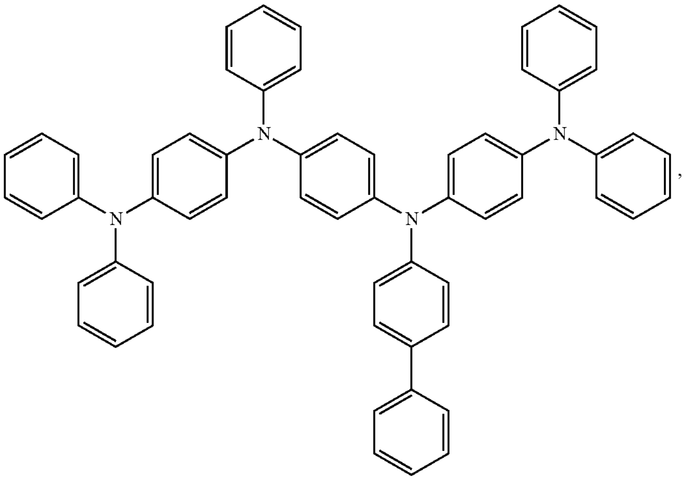
,
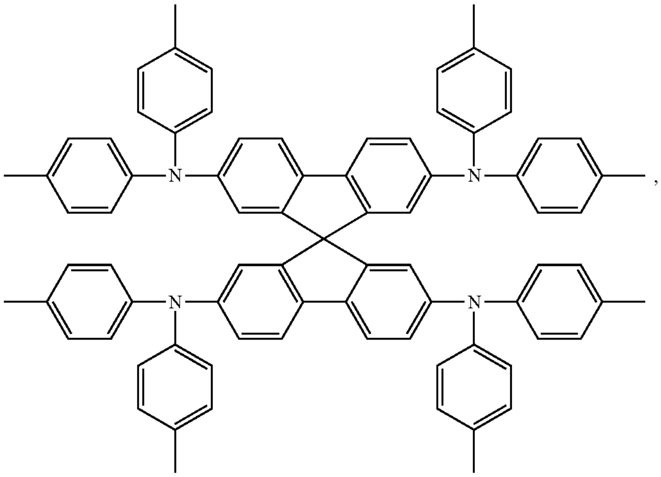
,
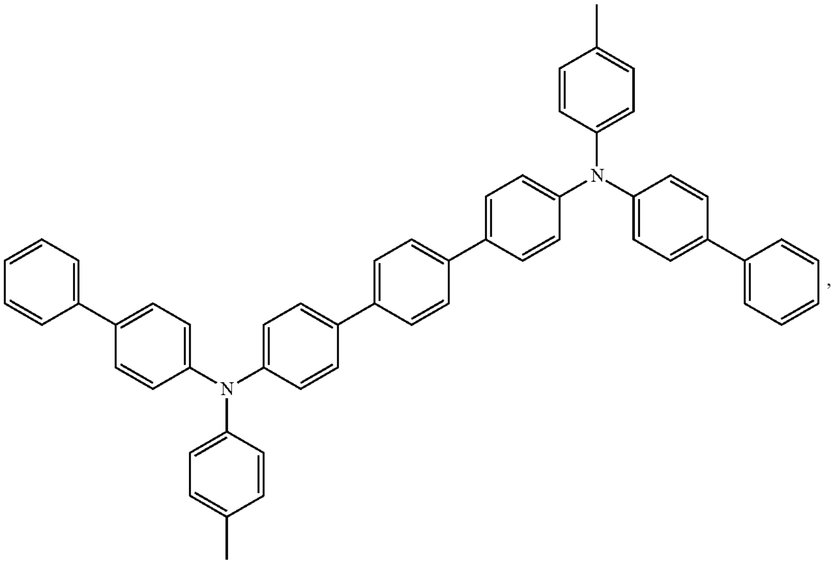
,

-continued
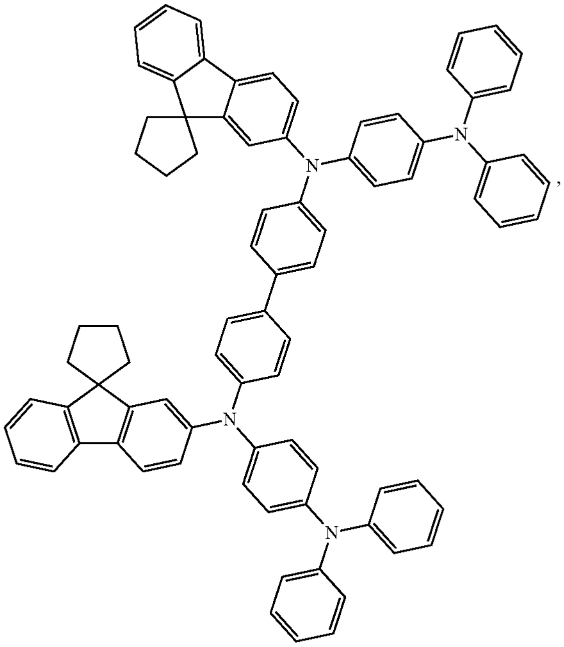
,
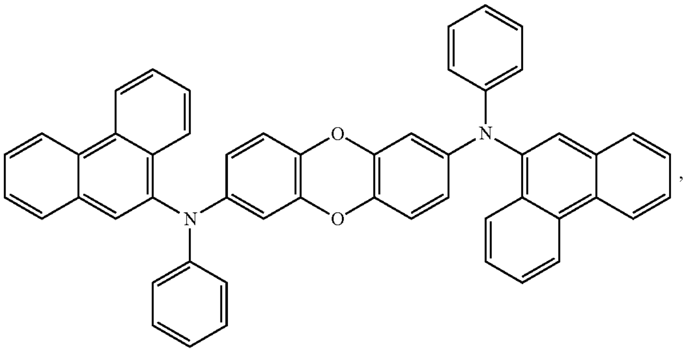
,
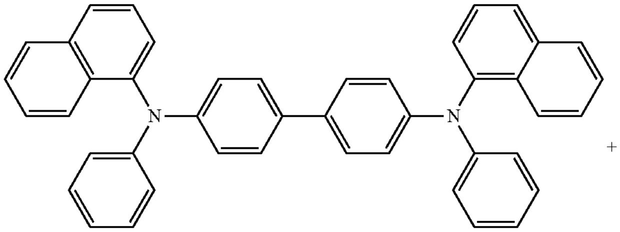
+ $MoO_x$,
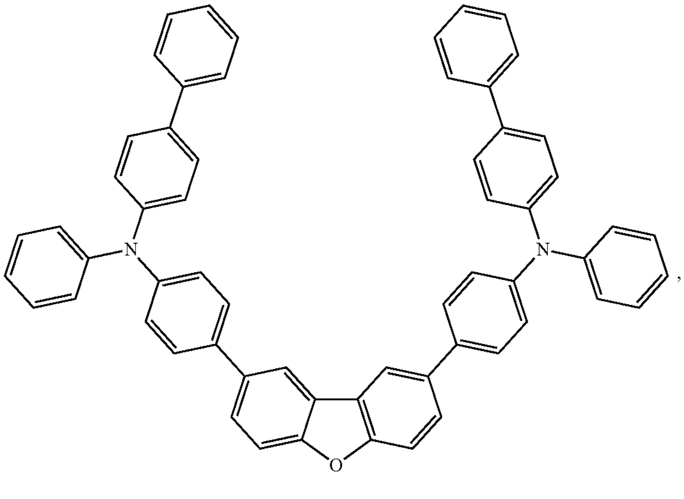
,
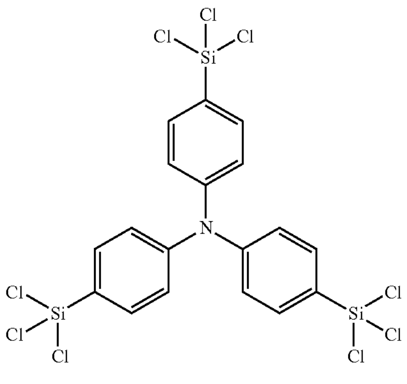
, -continued
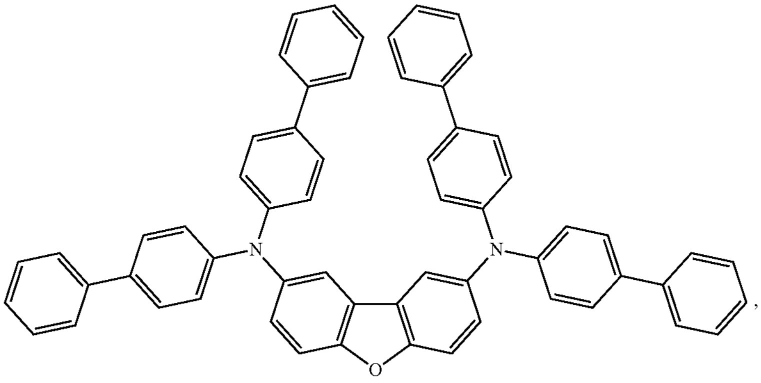
,
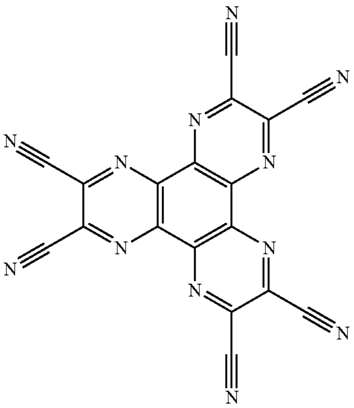
,
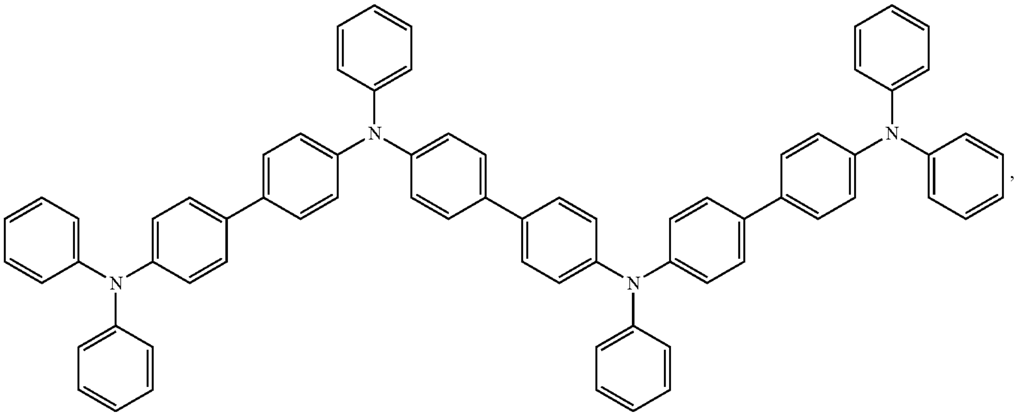
,
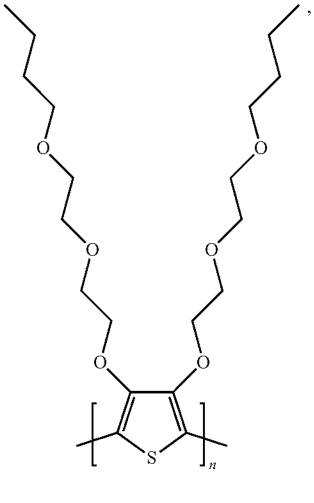
,
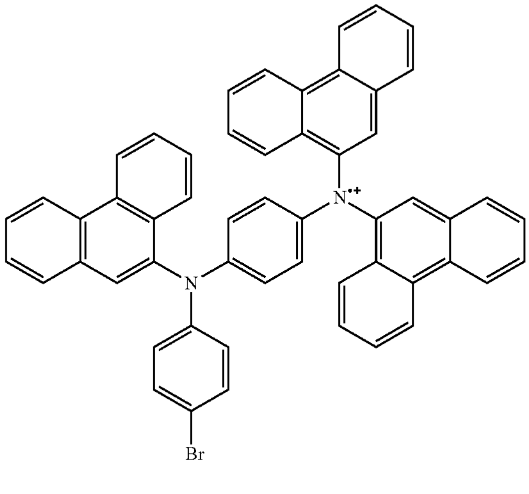

-continued
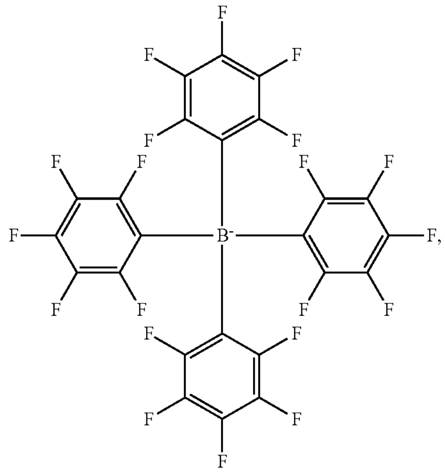
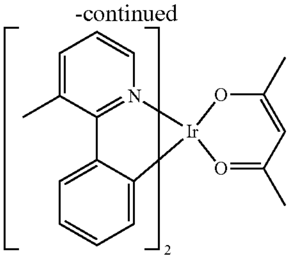
,
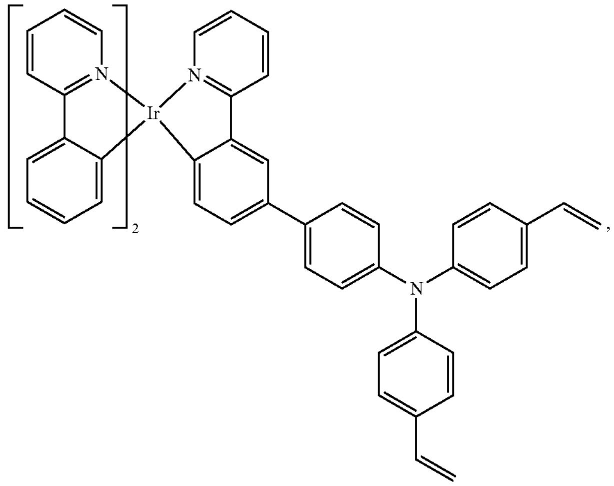
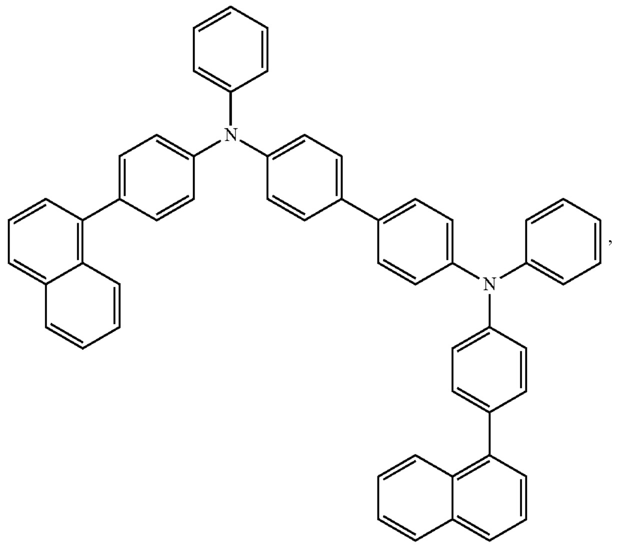

-continued
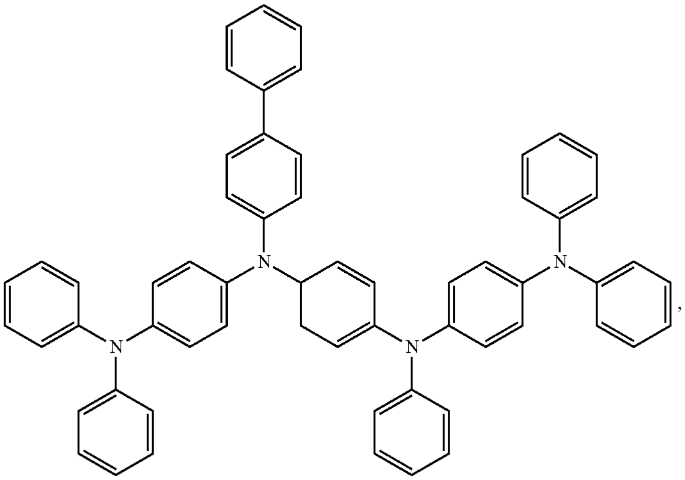
,
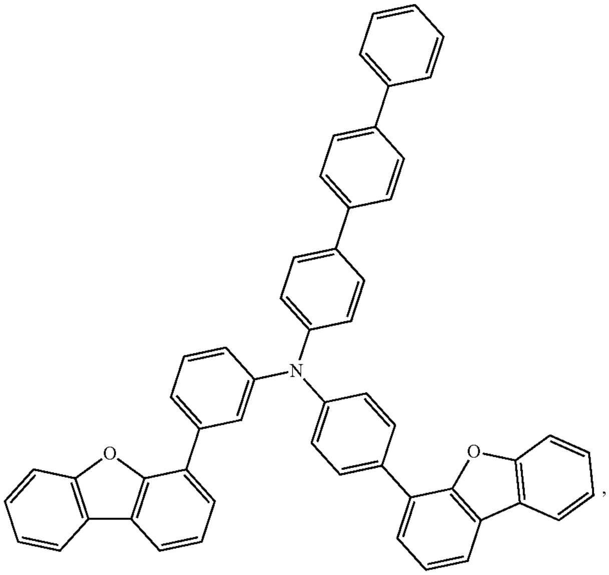
,
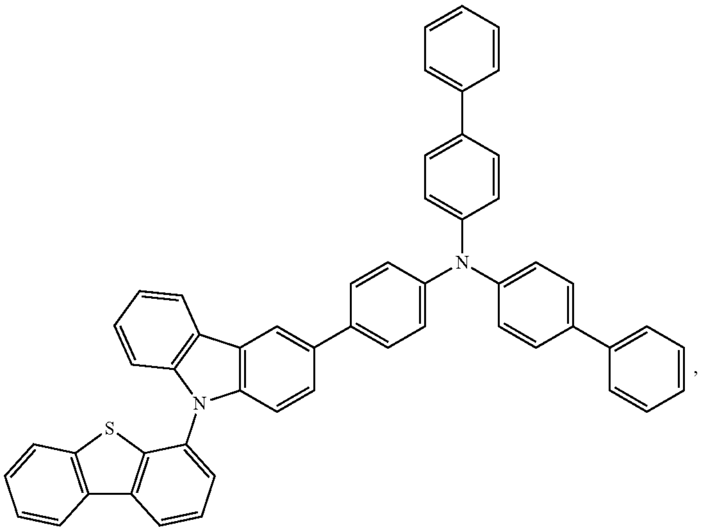
,

-continued
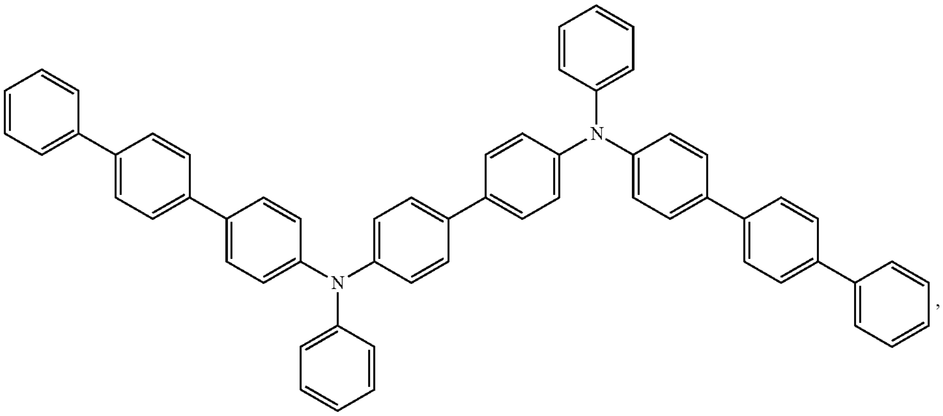
,
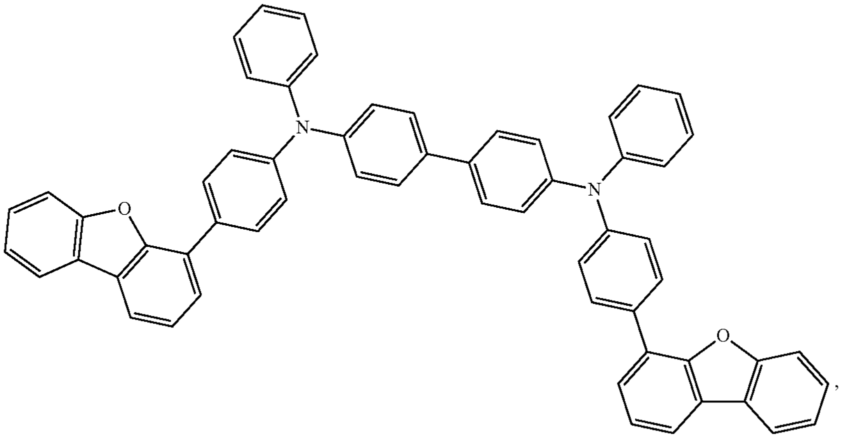
,
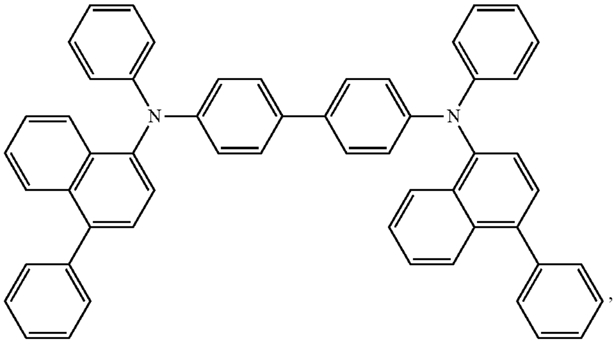
,

-continued
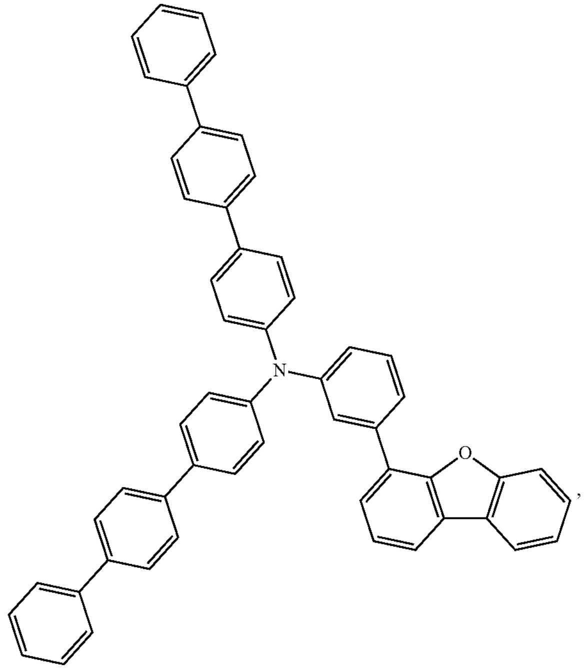
,
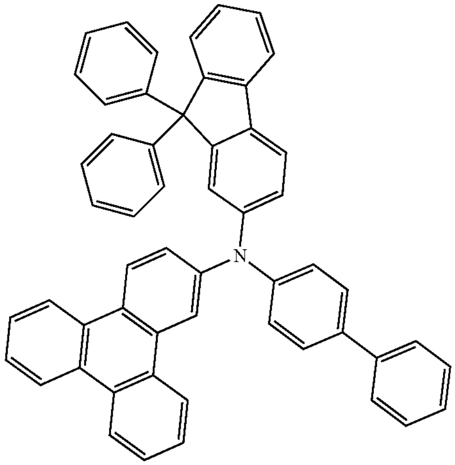
,
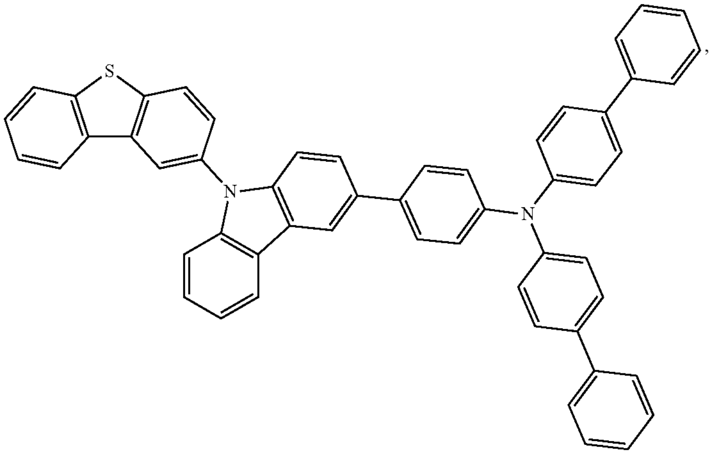
,
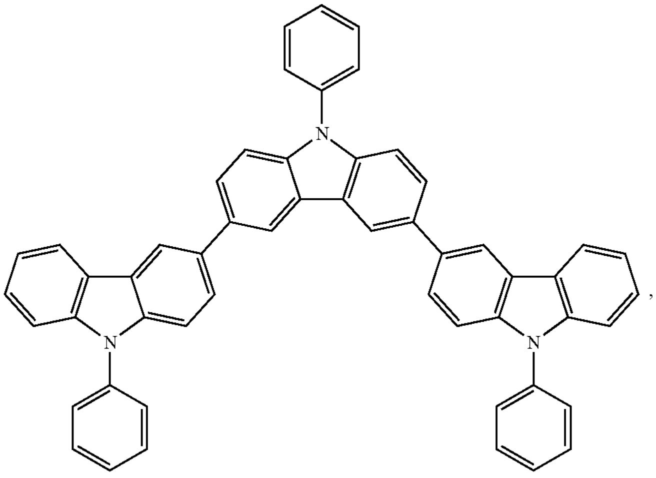
,
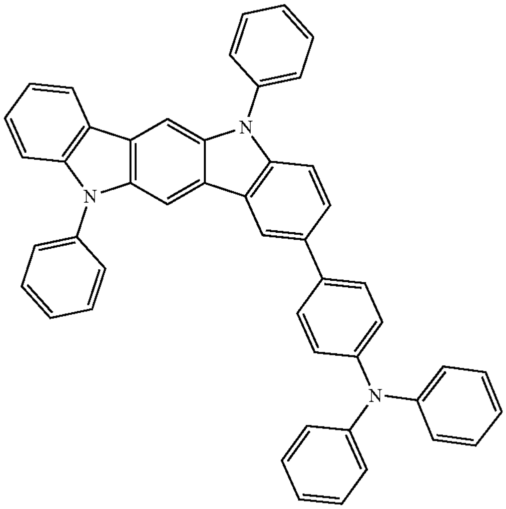
, -continued
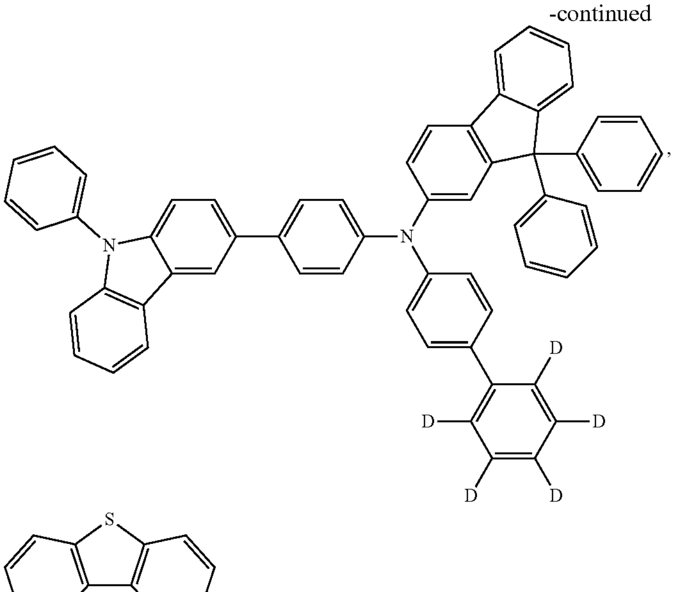
,
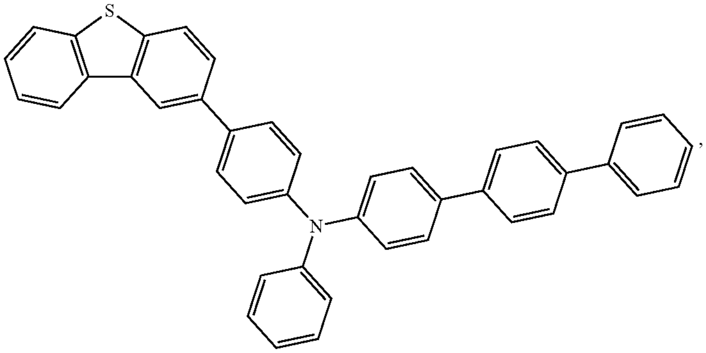
,
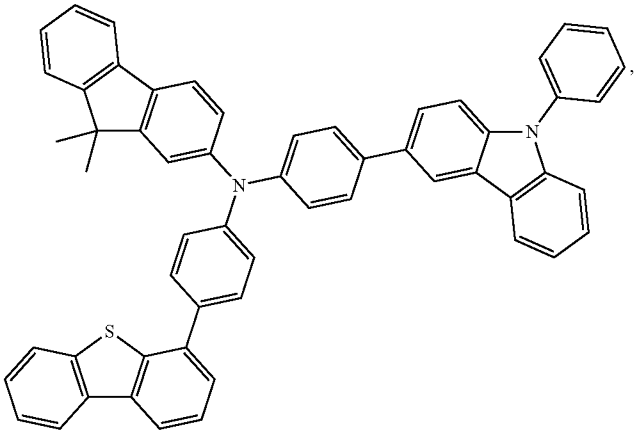
,
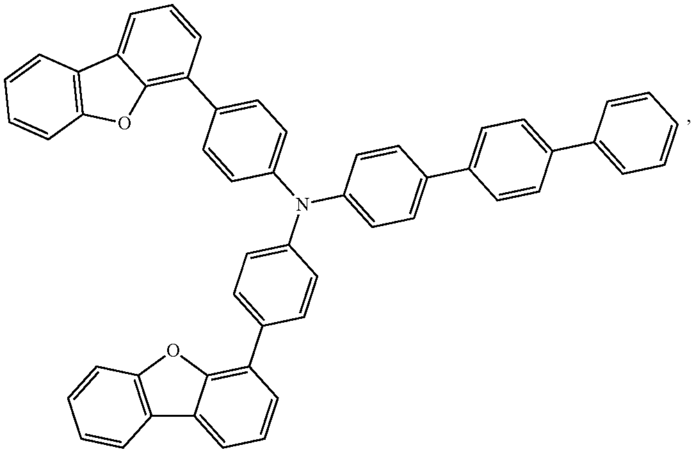
, -continued
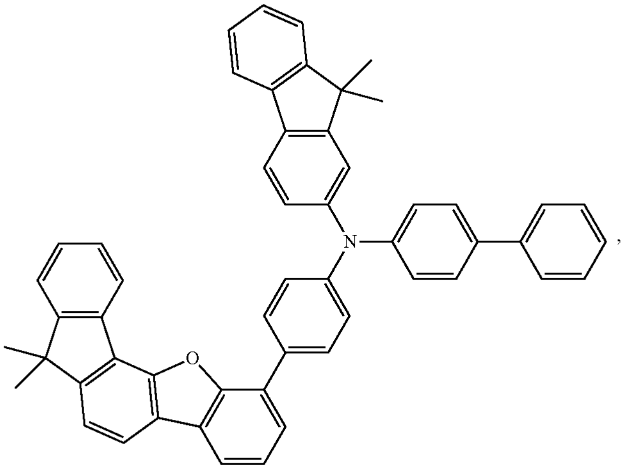
,
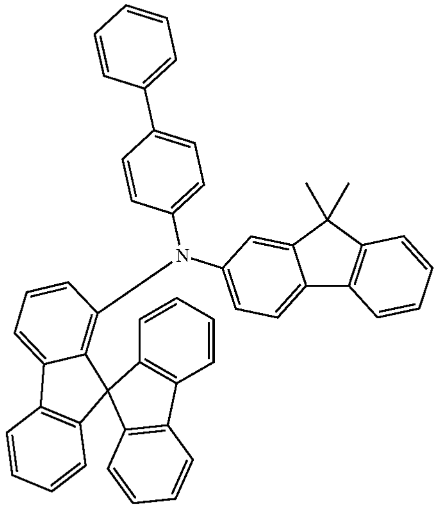
,
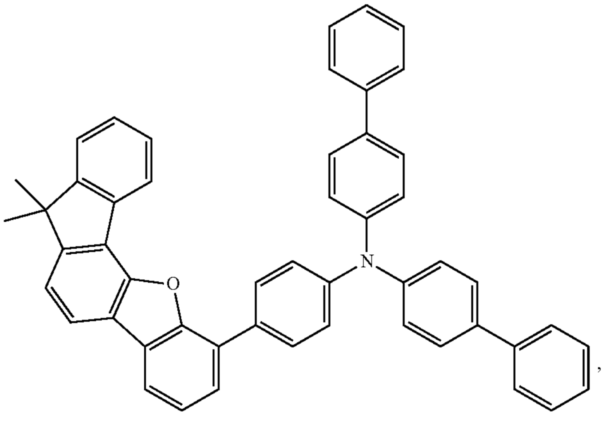
,
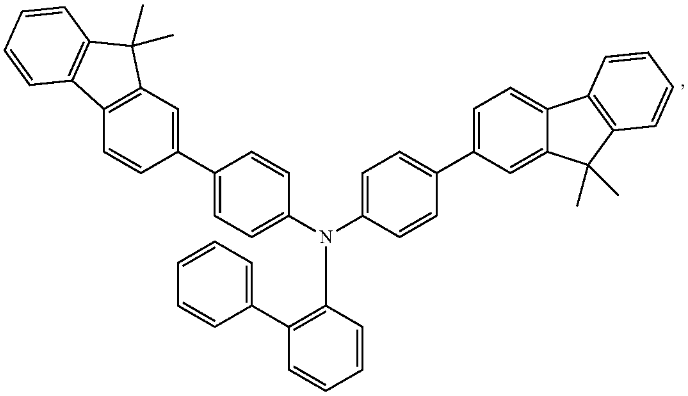
, -continued
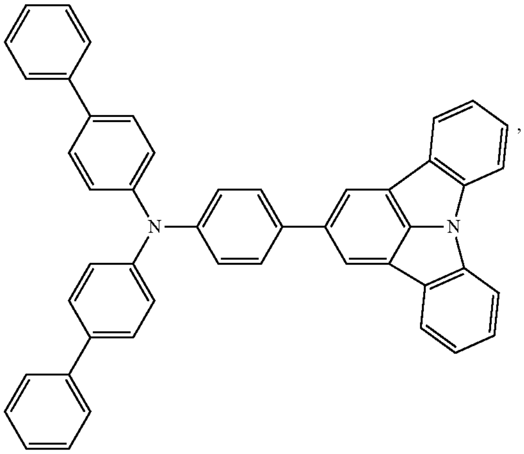
,
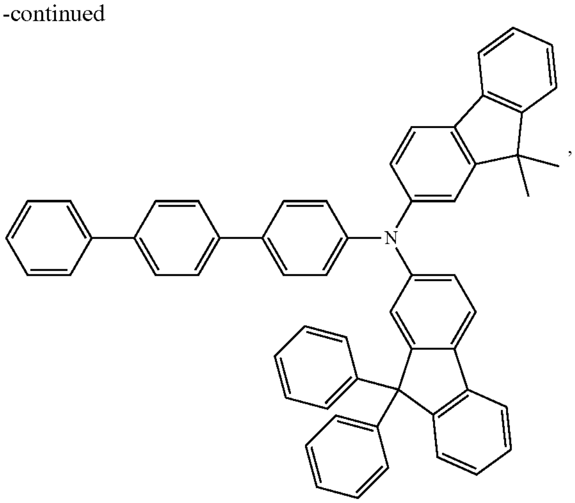
,
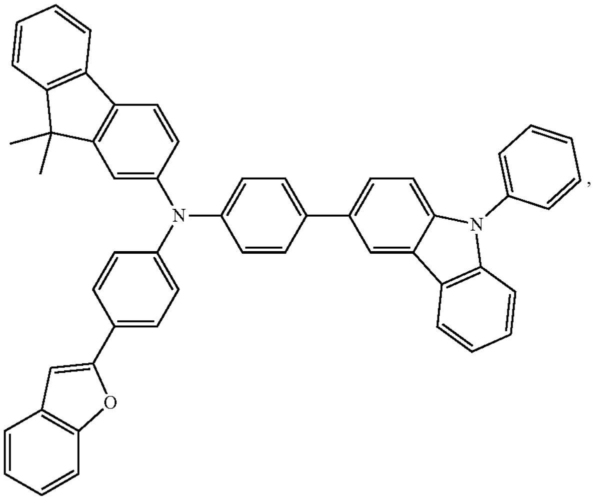
,
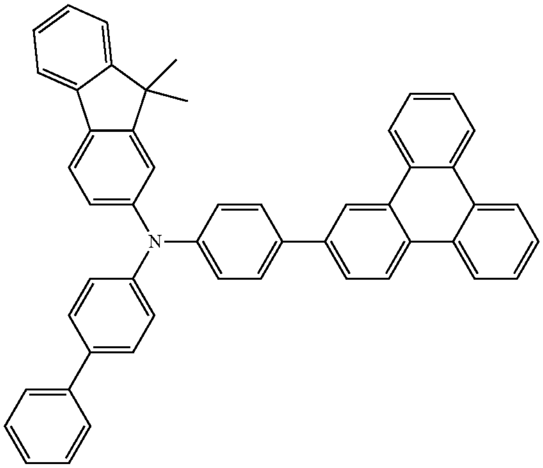
,
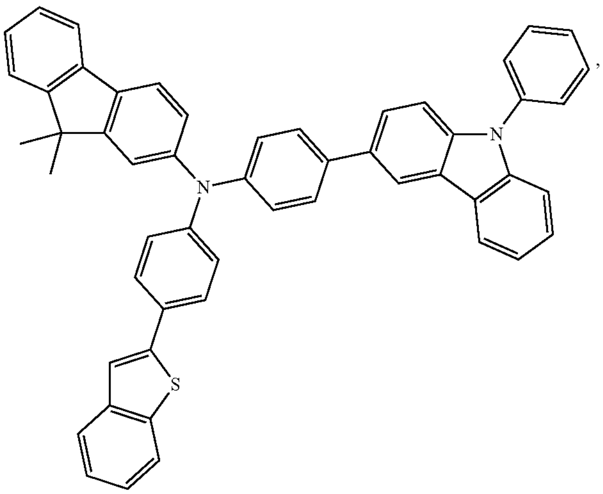
, -continued
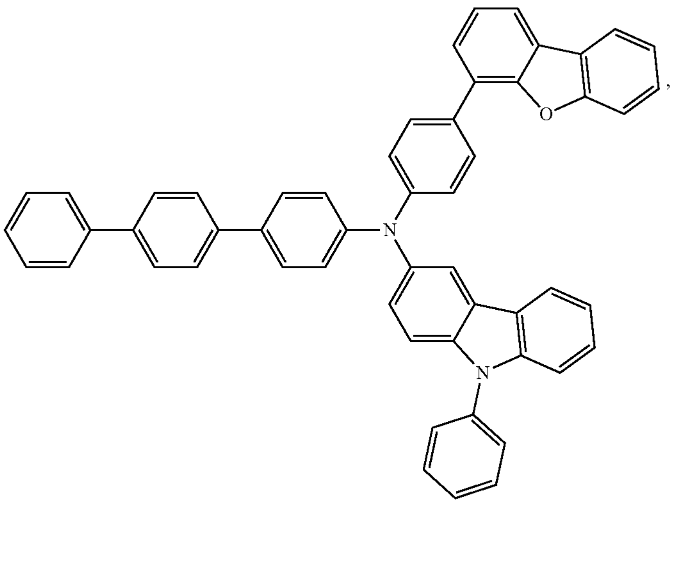
,
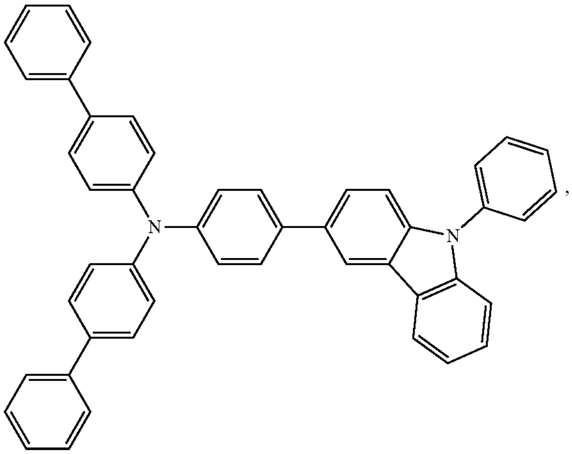
,
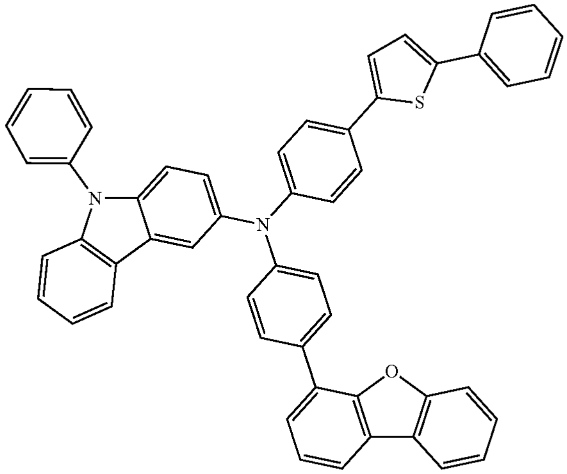
,
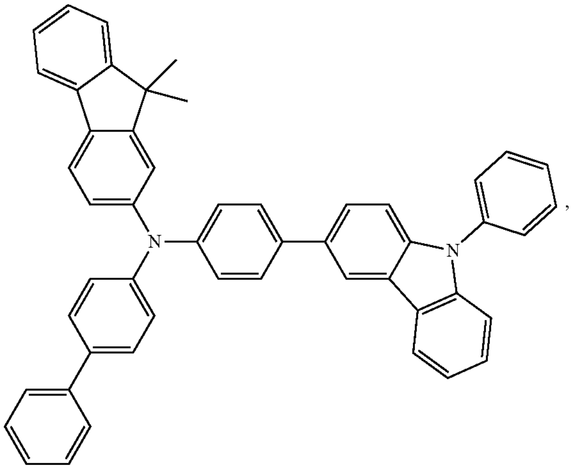
,
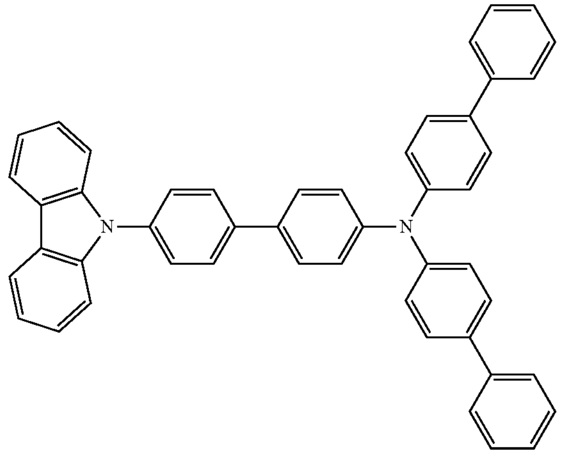
, -continued
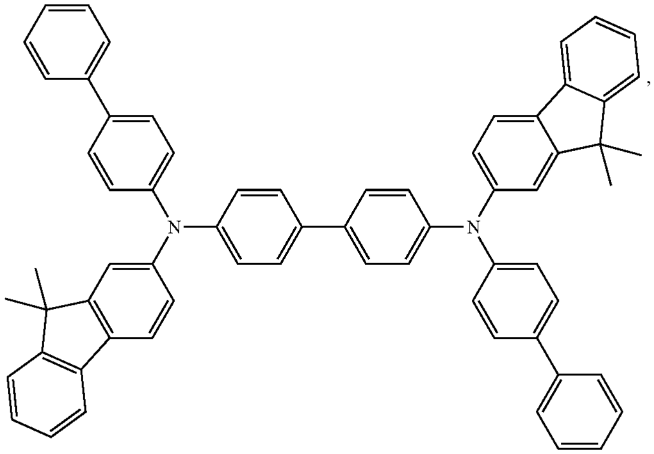
,
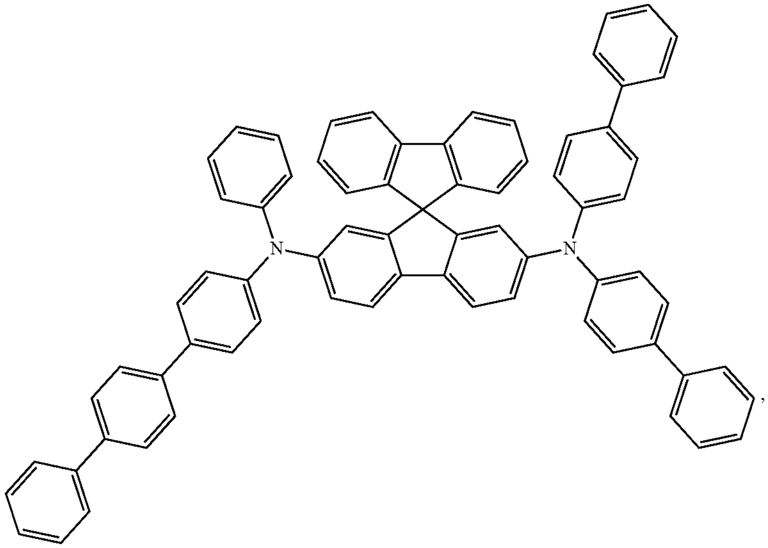
,
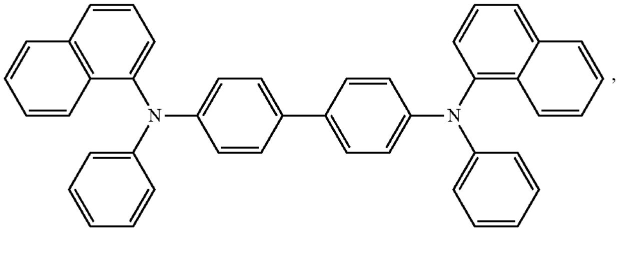
,
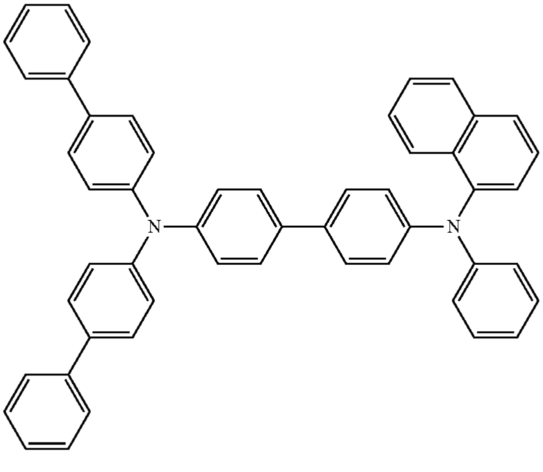
, -continued
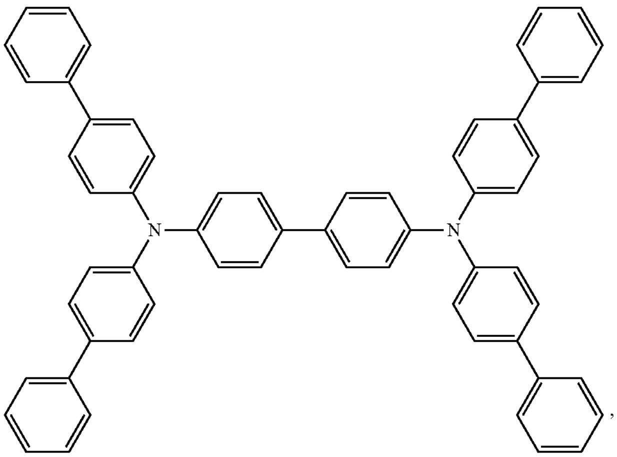
,
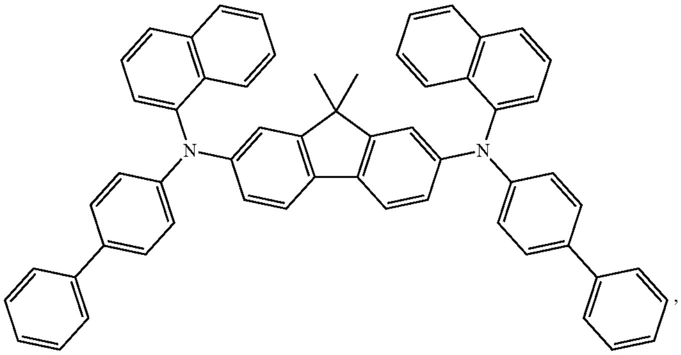
,
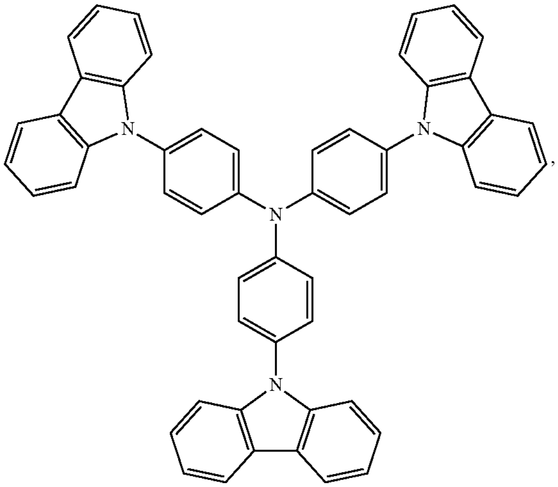
,
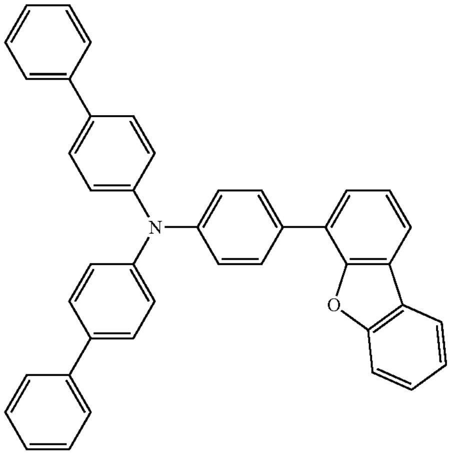
, -continued

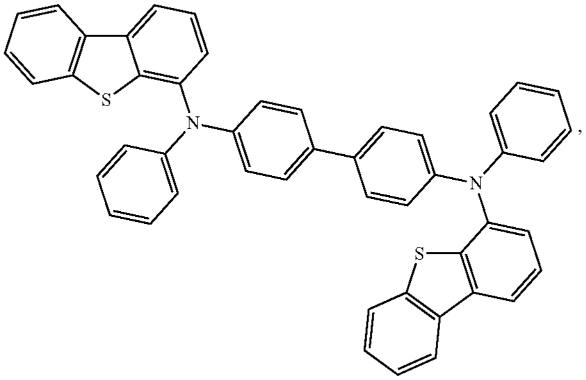

,

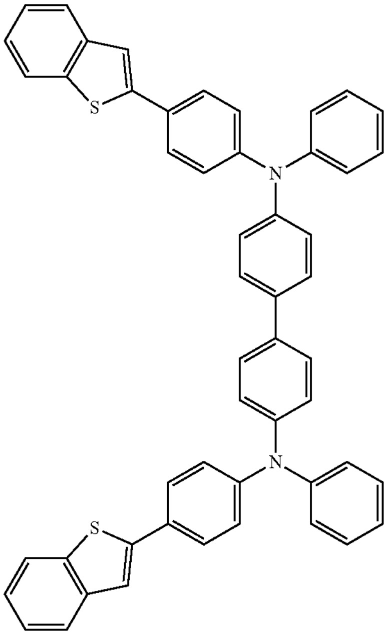

, and

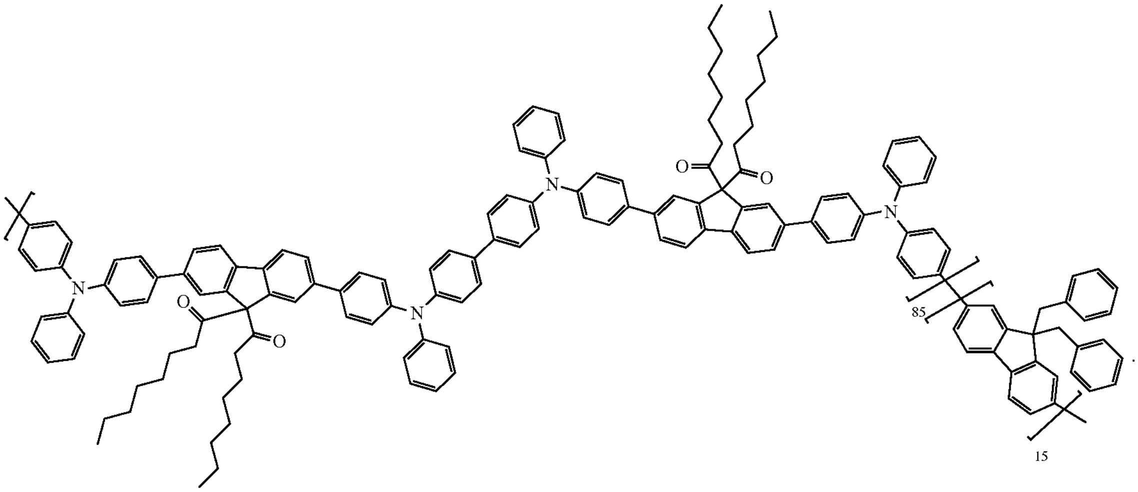

.

ELB:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

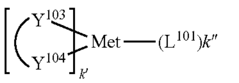

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

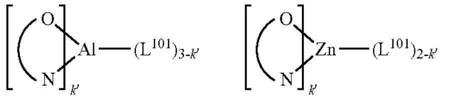

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

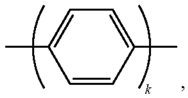

,

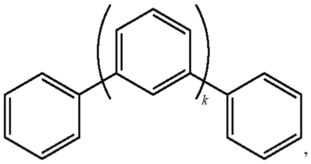

,

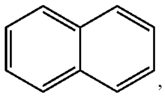

,

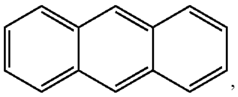

,

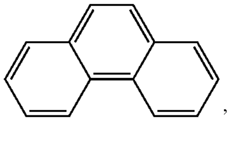

,

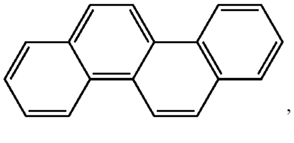

,

-continued

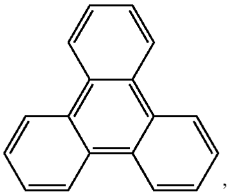

,

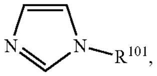

,

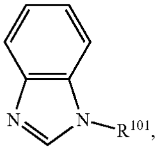

,

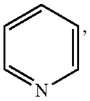

,

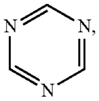

,

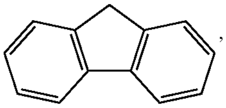

,

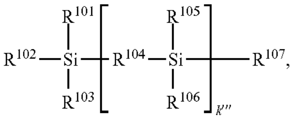

,

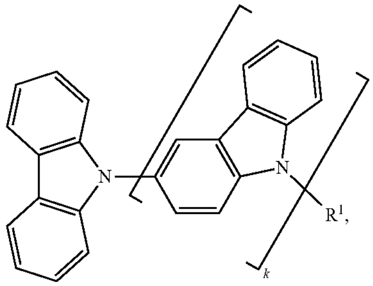

,

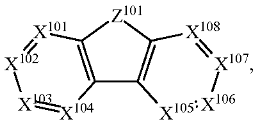

,

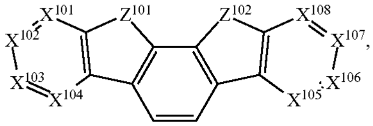

,

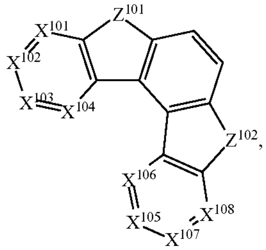

,

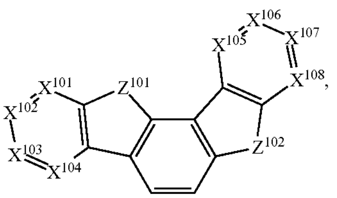

,

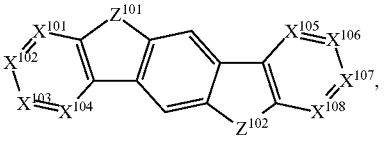

and

-continued

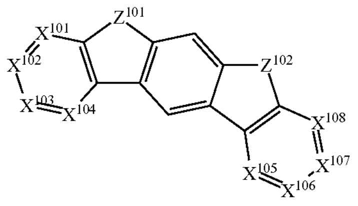

wherein each of $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20; k''' is an integer from 0 to 20. $X^{101}$ to $X^{108}$ is selected from C (including CH) or N.

$Z^{101}$ and $Z^{102}$ is selected from $NR^{101}$, O, or S.

Non-limiting examples of the host materials that may be used in an OLED in combination with materials disclosed herein are exemplified below together with references that disclose those materials:

EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472.

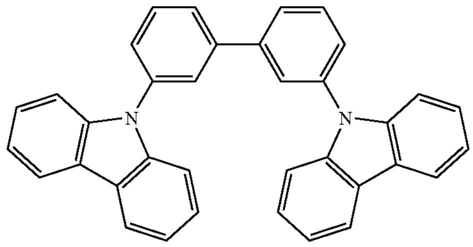

,

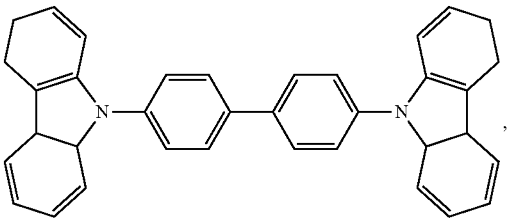

,

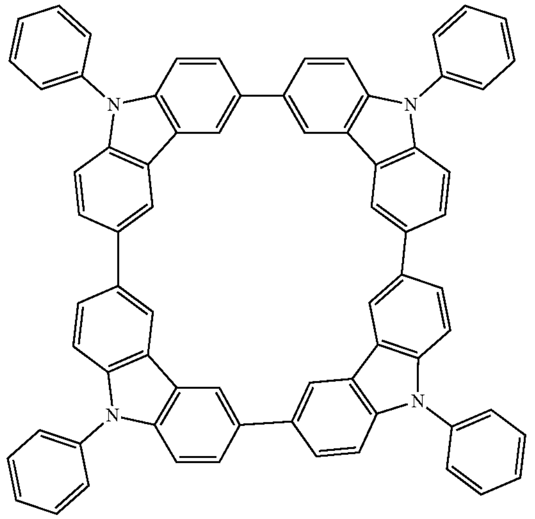

,

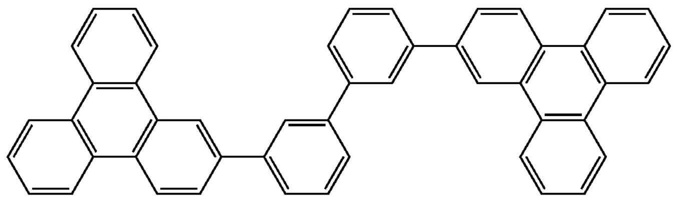

,

-continued
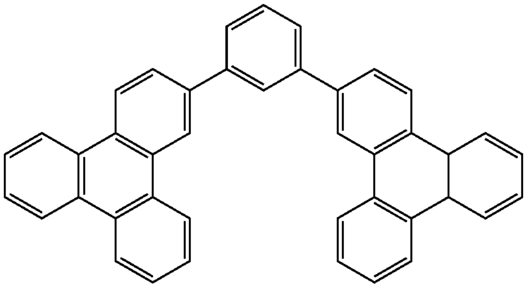,
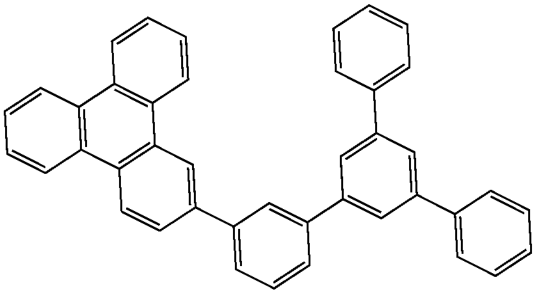,
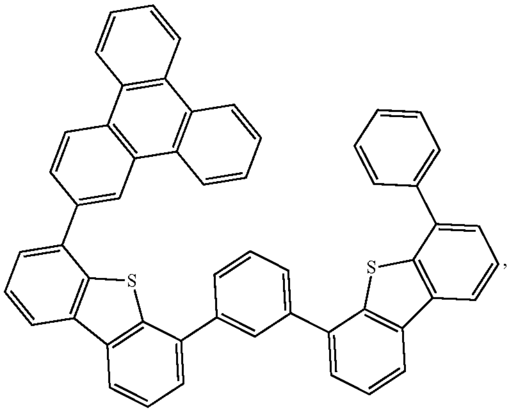,
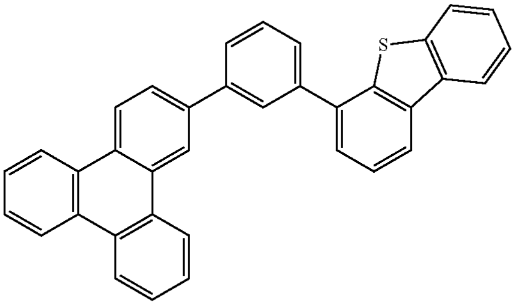,
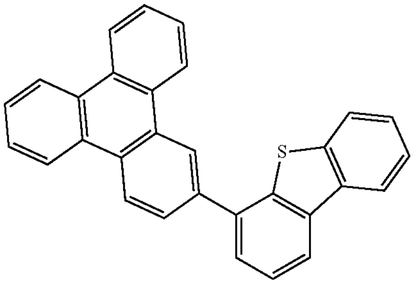,
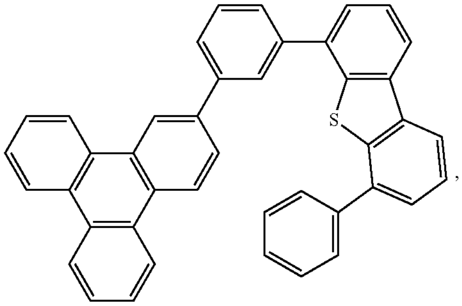,
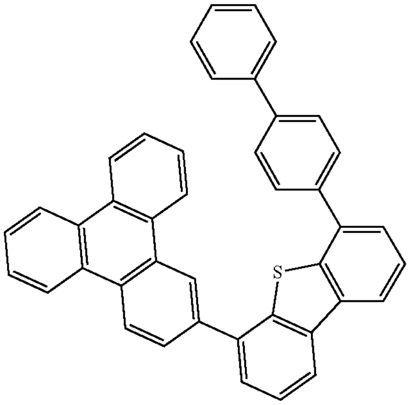,
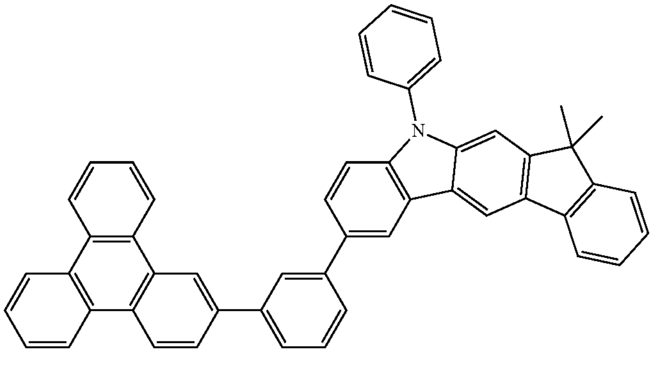, -continued
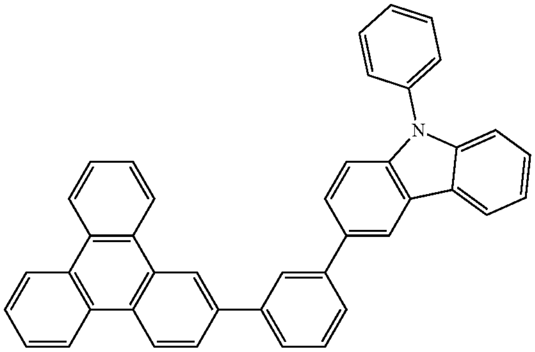
,
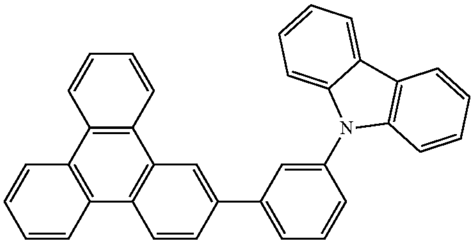
,
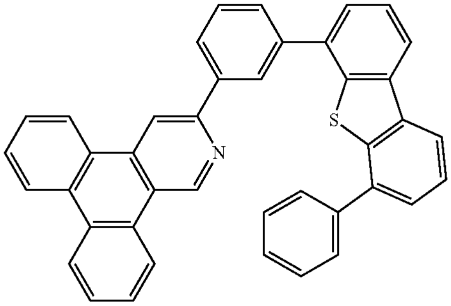
,
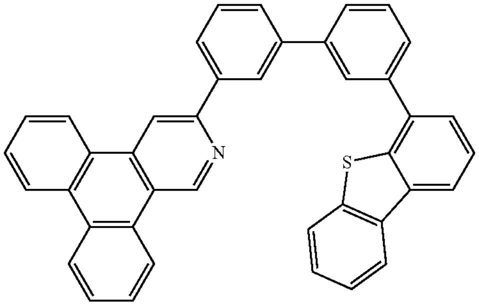
,
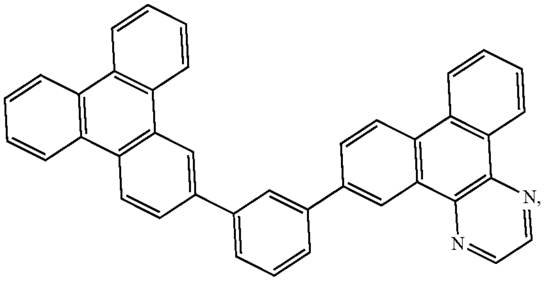
,
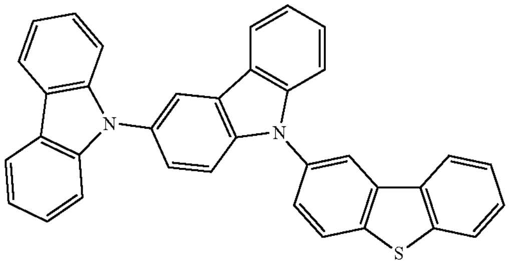
,
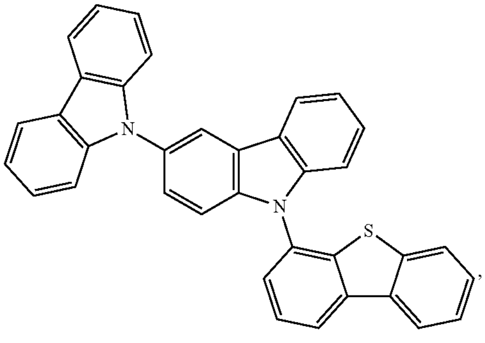
,
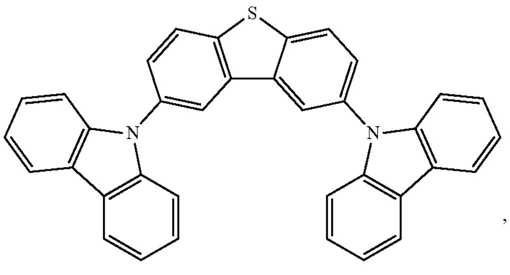
,
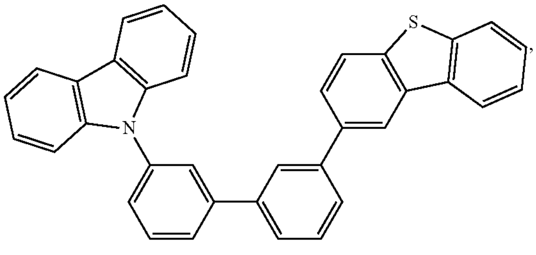
,
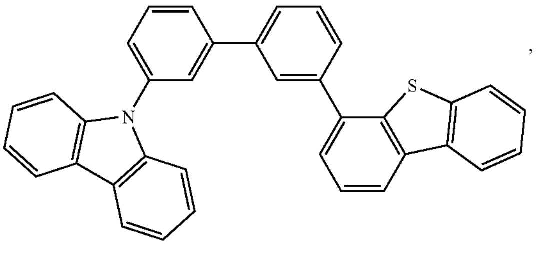
, -continued
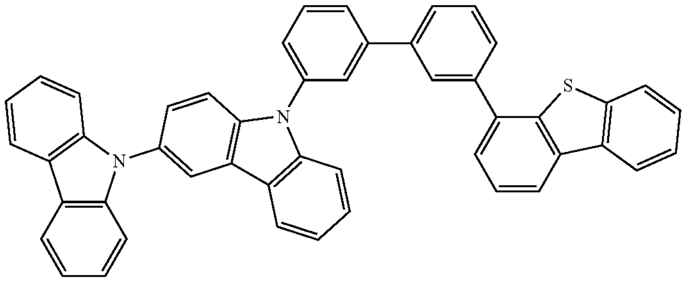
,
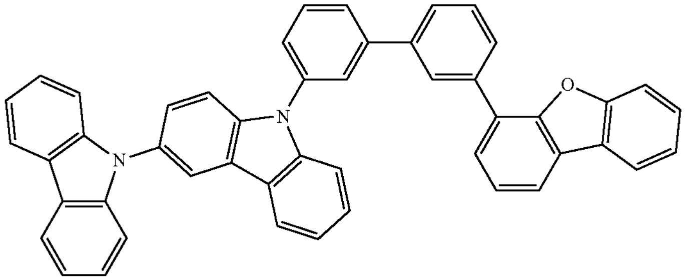
,
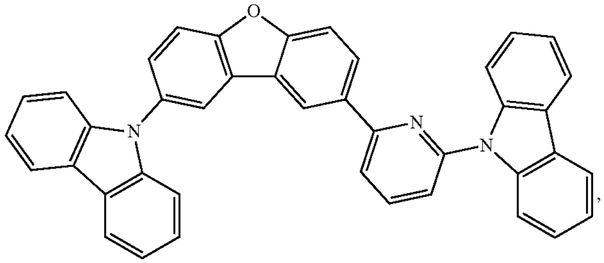
,
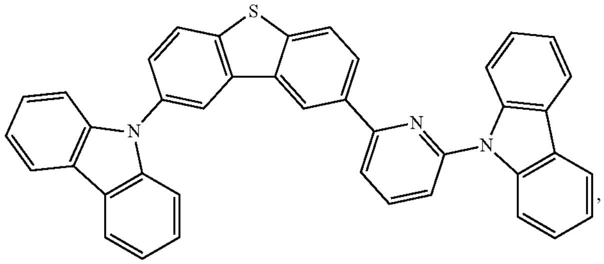
,
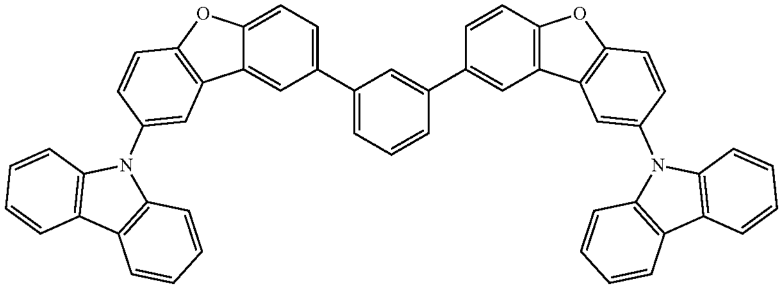
,
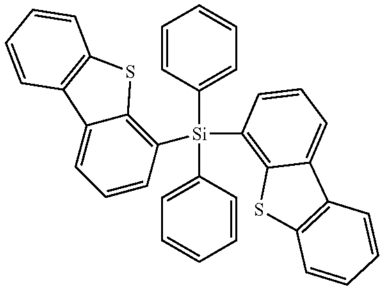
,
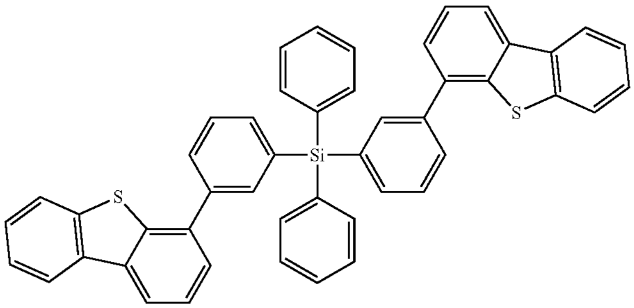
, -continued
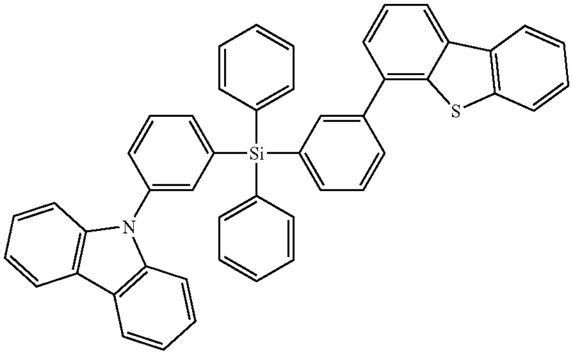,
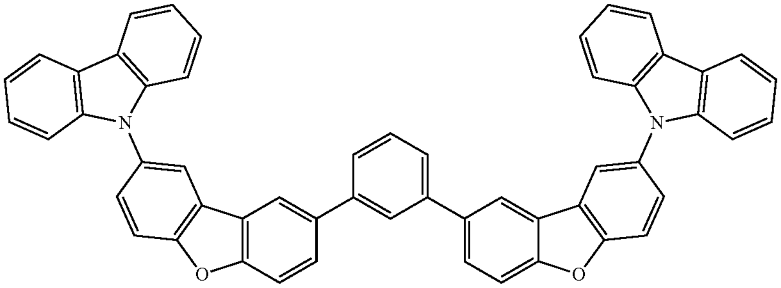,
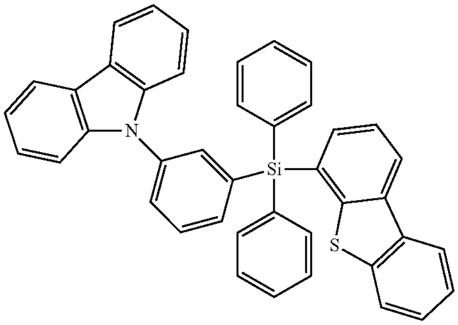,
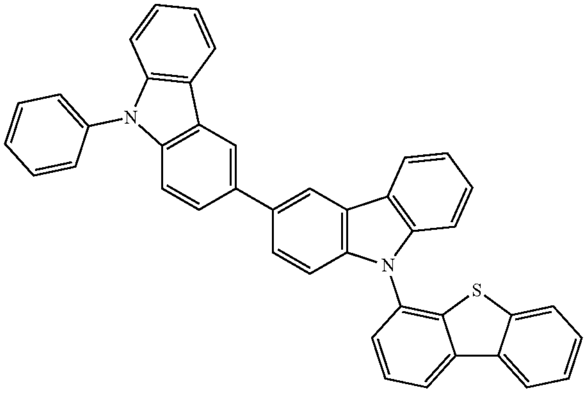,
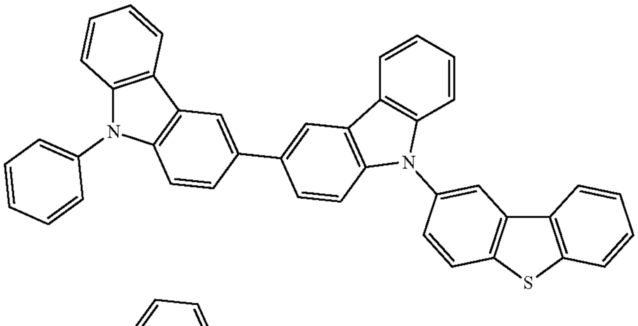,
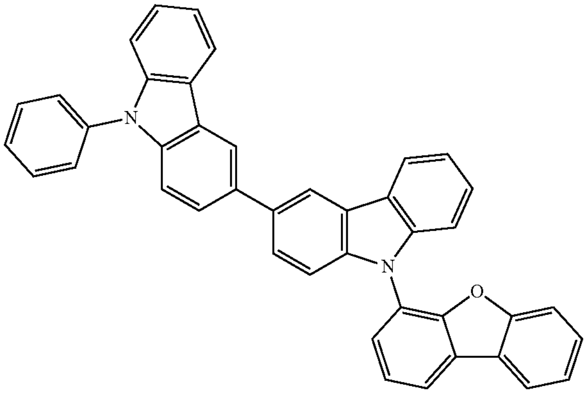, -continued
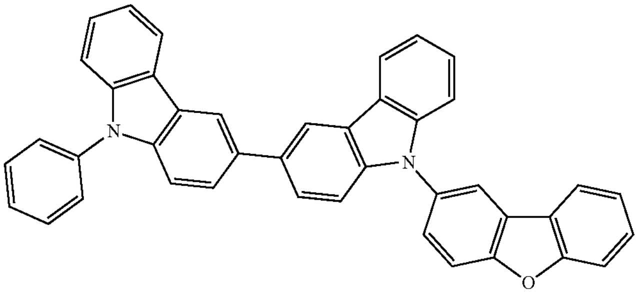
,
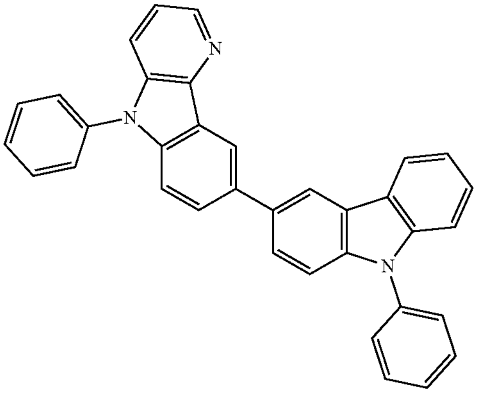
,
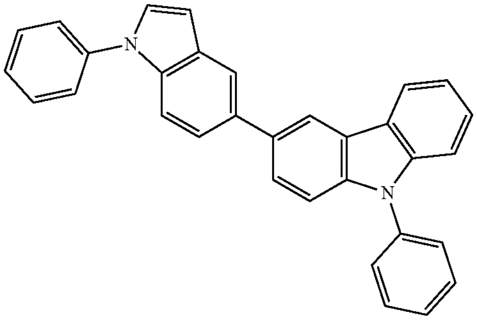
,
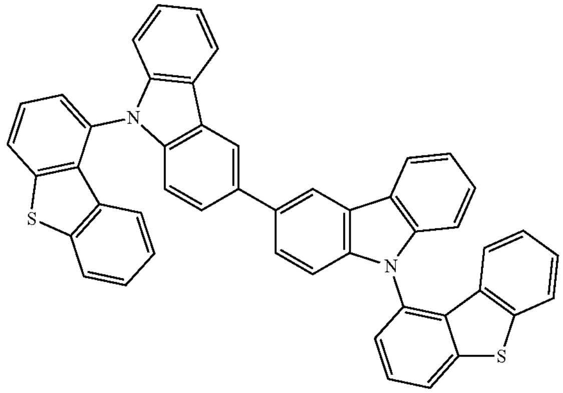
,
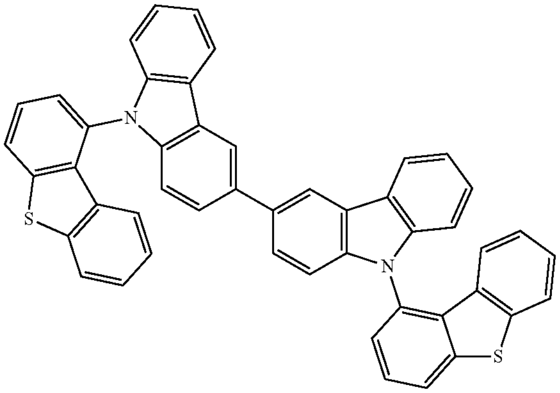
,
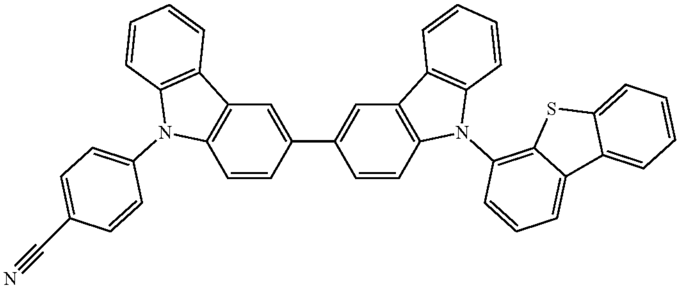
, -continued
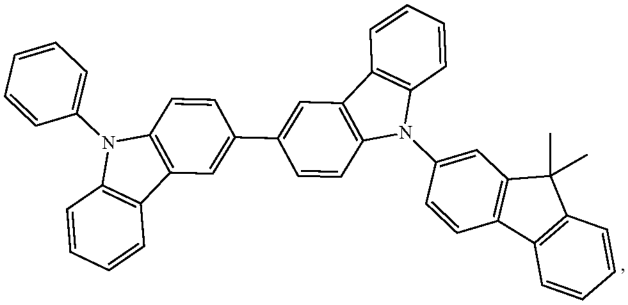
,
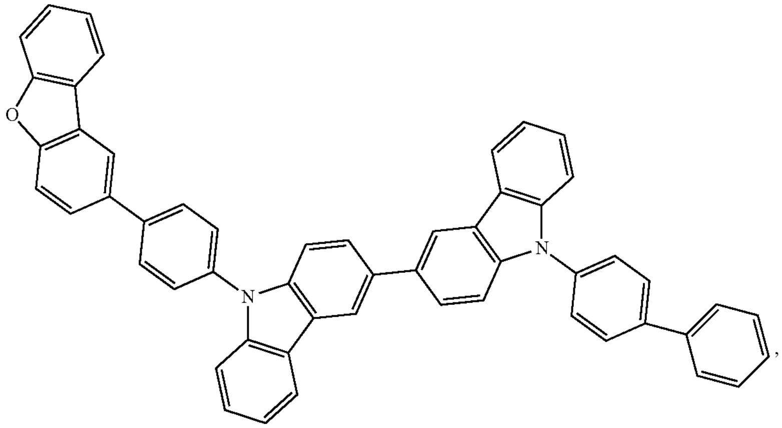
,
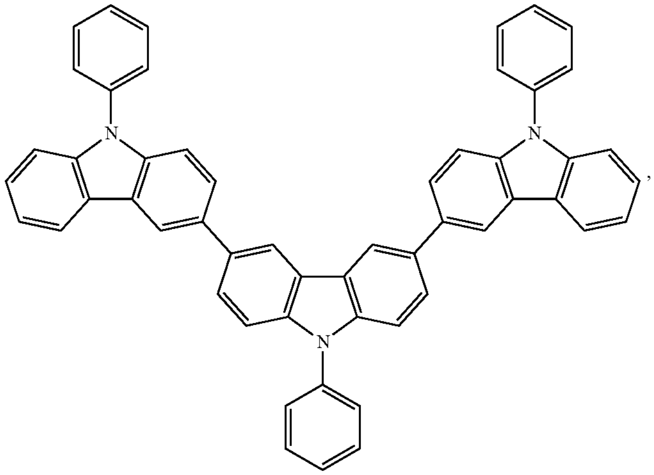
,
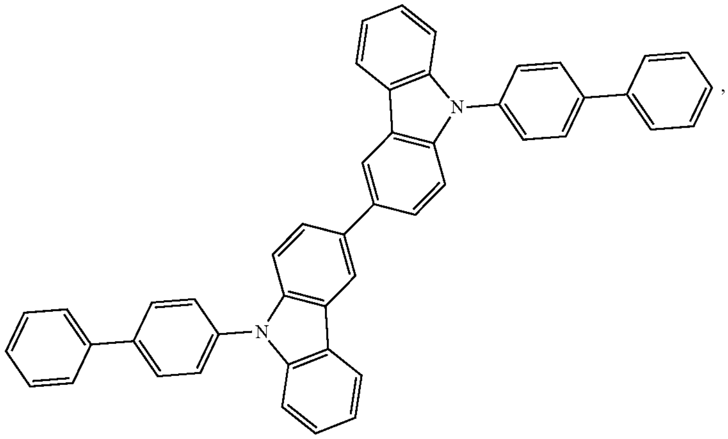
, -continued
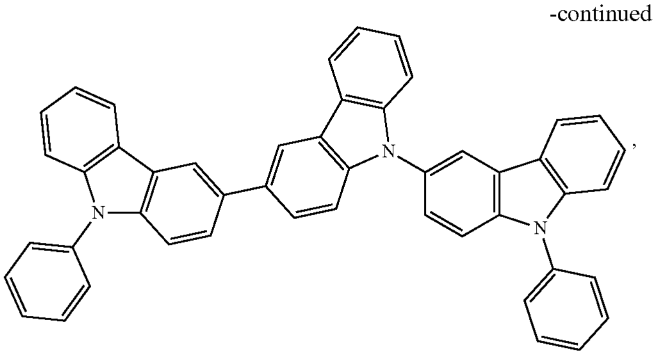
,
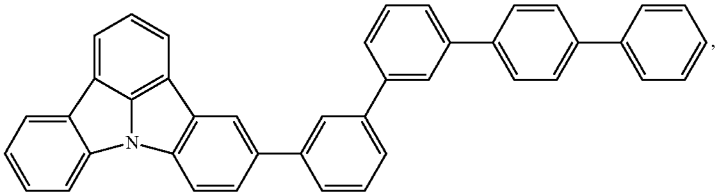
,
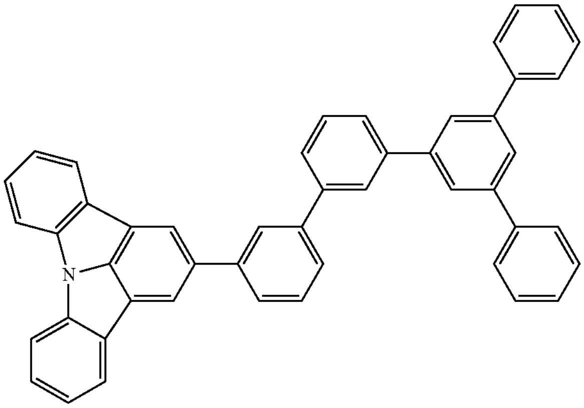
,
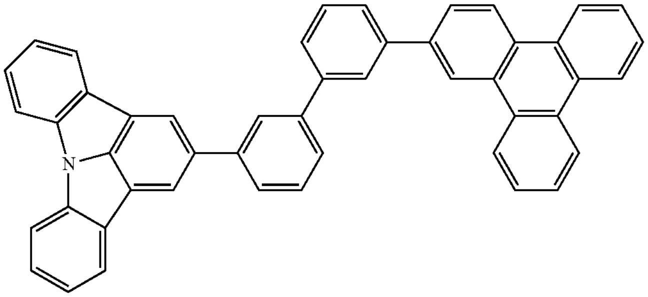
,
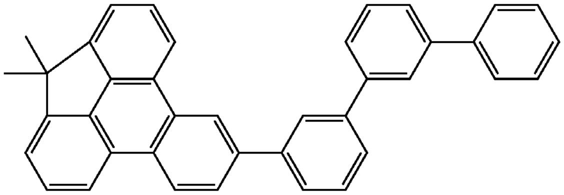
,
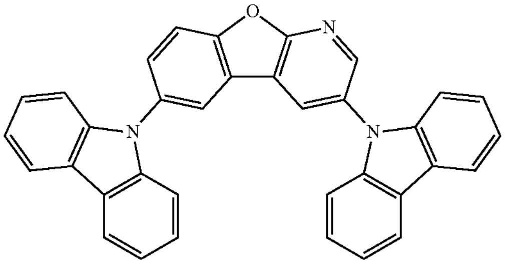
, -continued
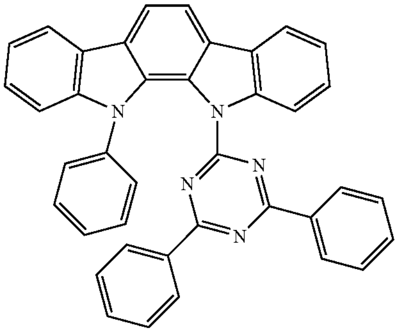
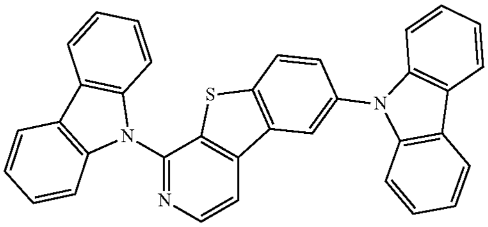
,
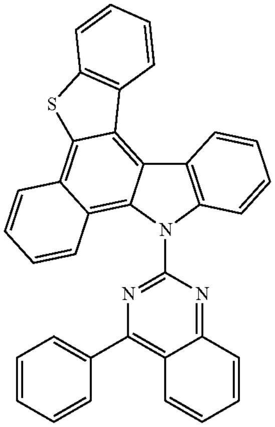
,
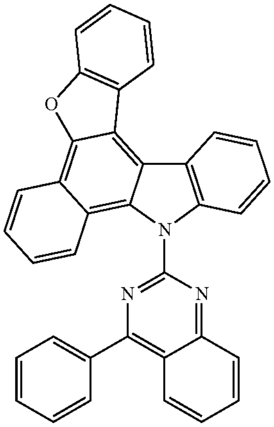
,
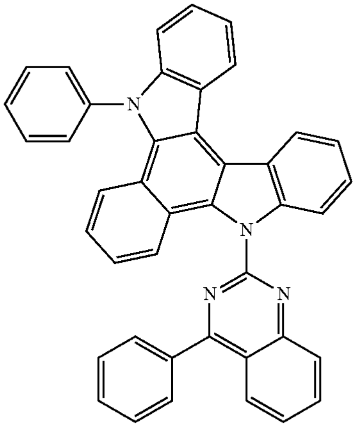
,
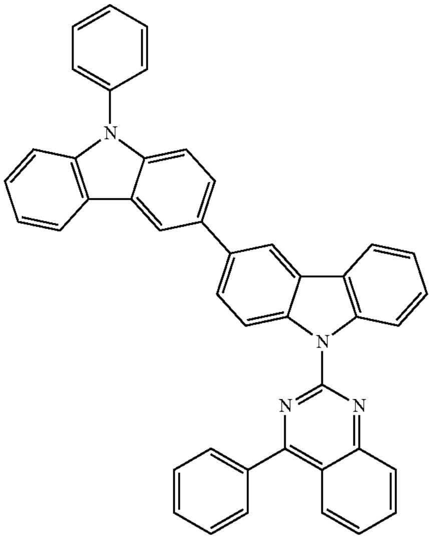
,
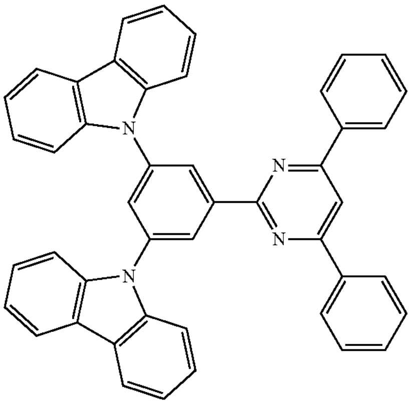
,
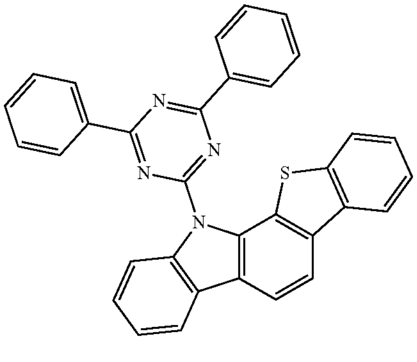
,
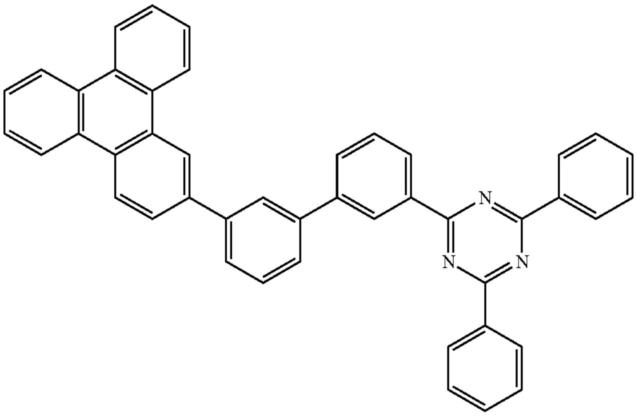
, -continued
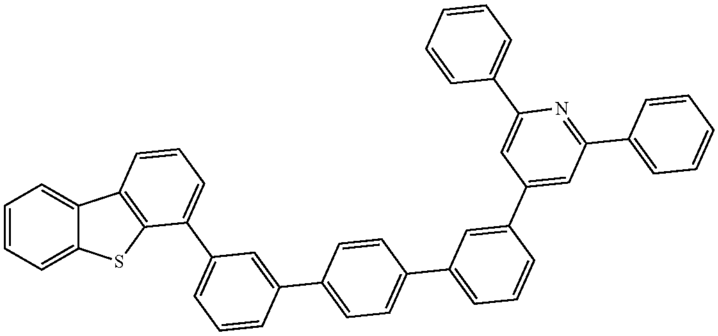,
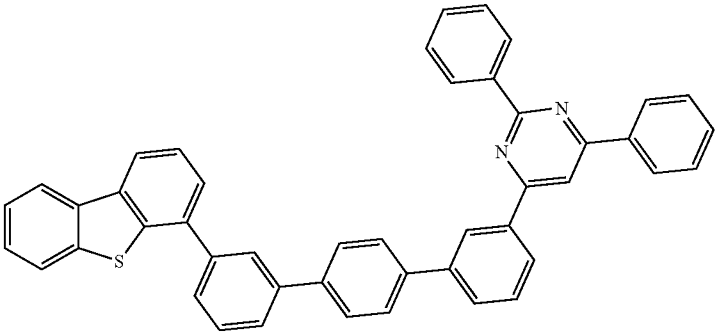,
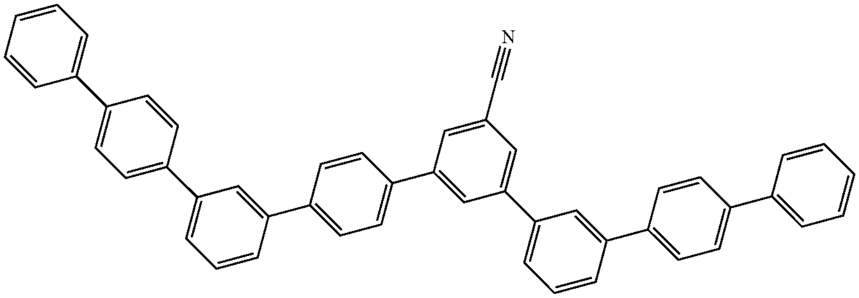,
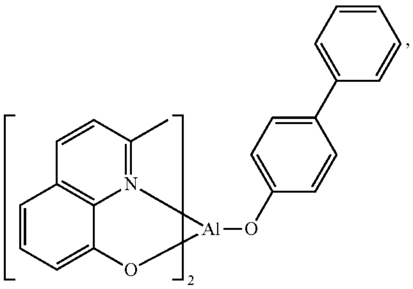, 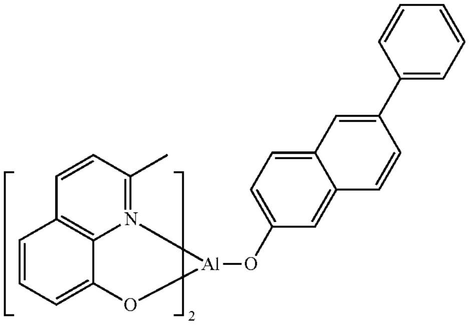, 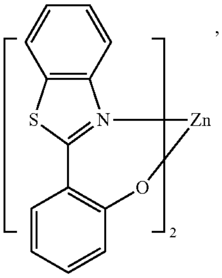,
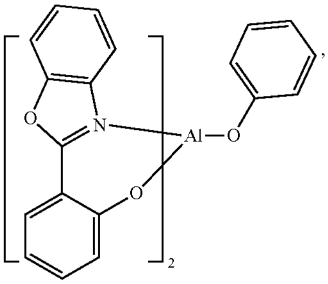, 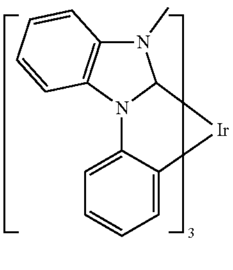, 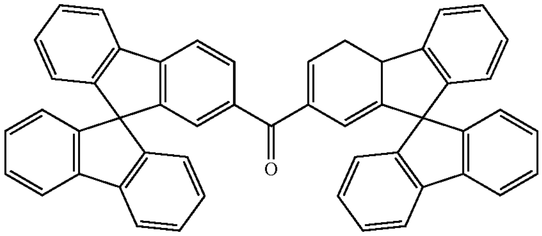, -continued

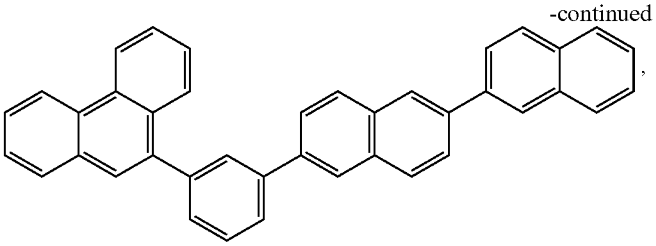

,

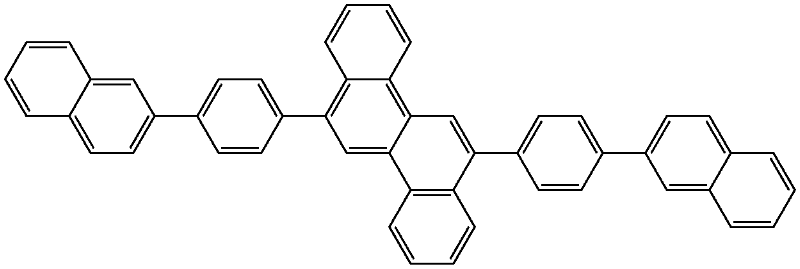

,

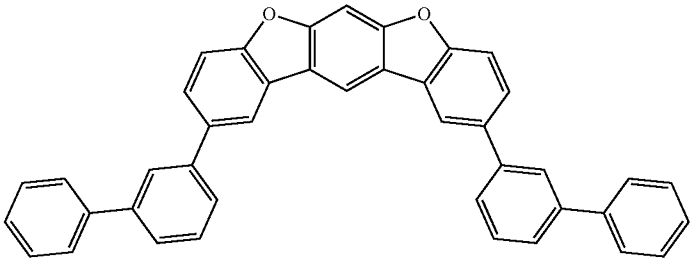

.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

-continued
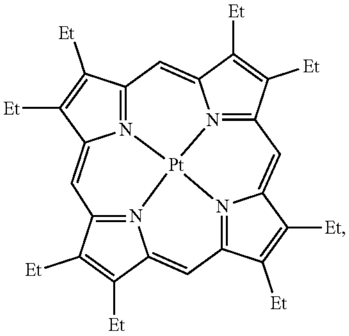
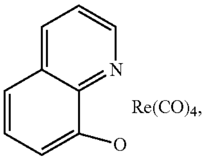
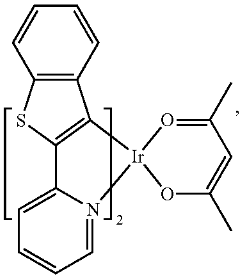
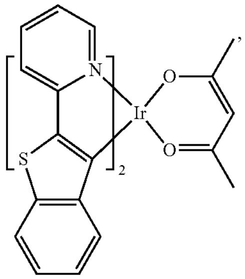
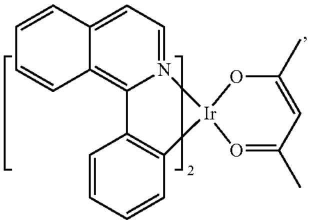
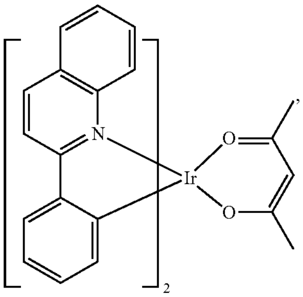
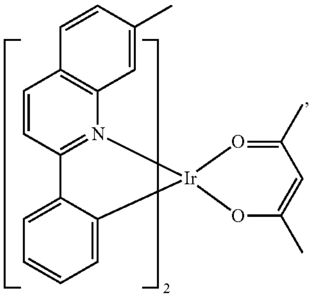
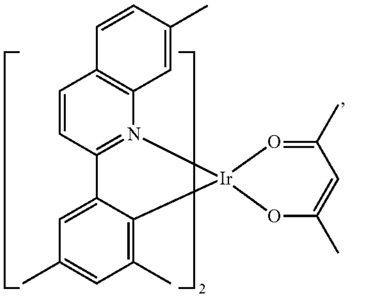
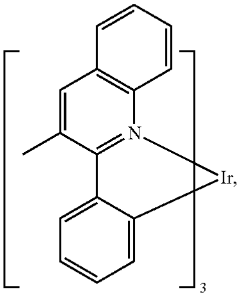
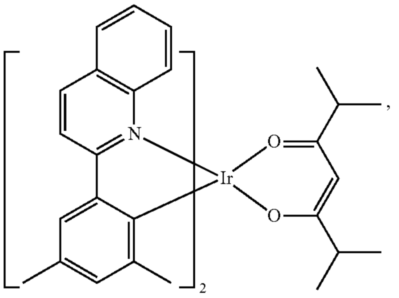
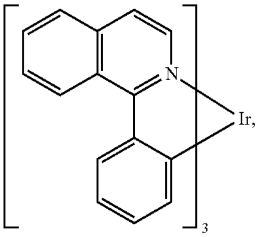
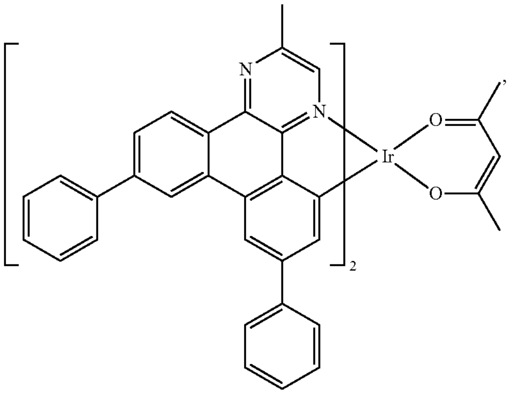

-continued
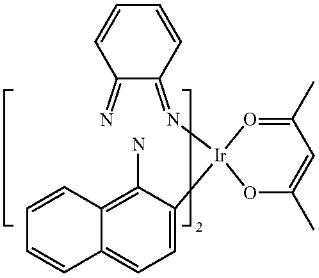
,
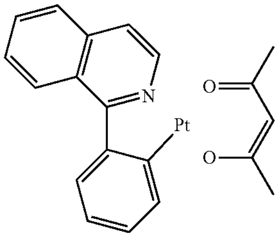
,
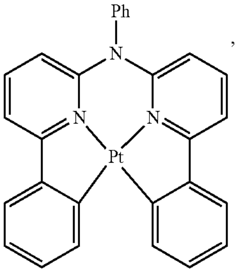
,
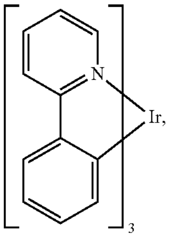
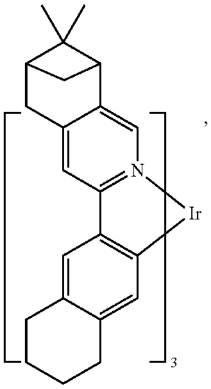
,
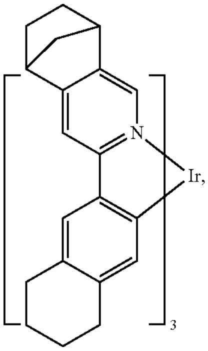
-continued
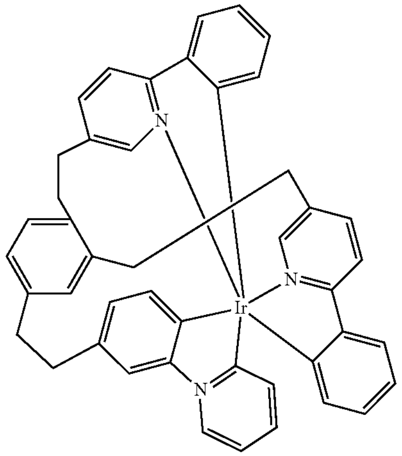
,
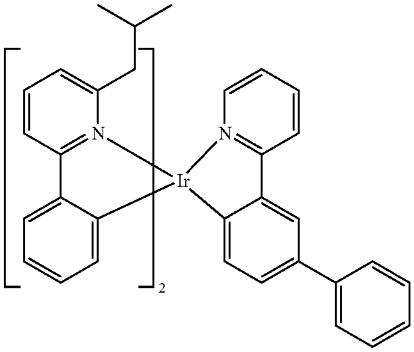
,
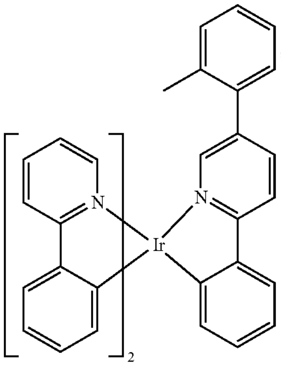
,
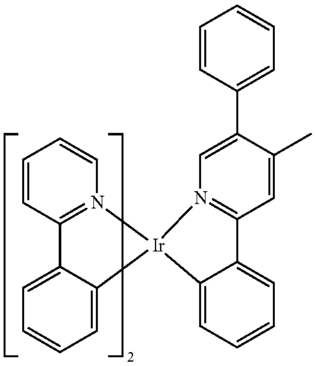
, -continued
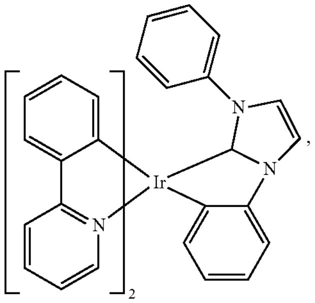
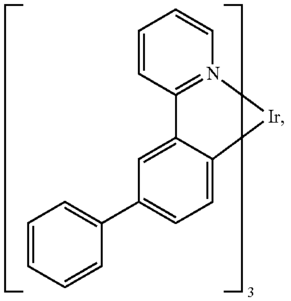
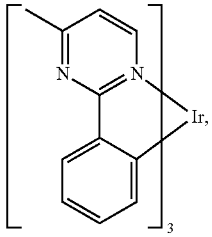
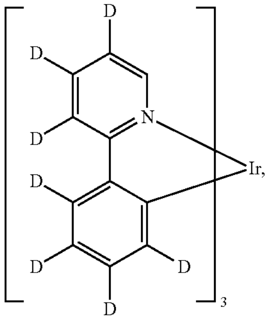
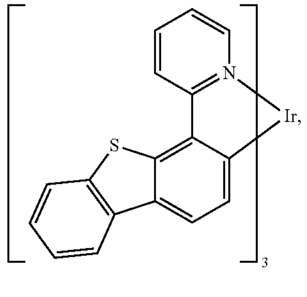
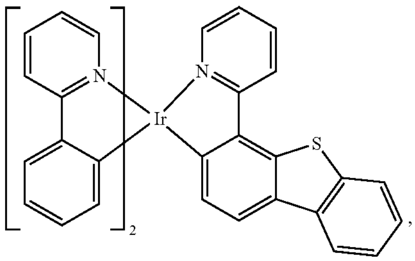
-continued
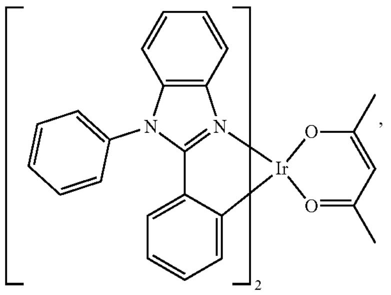
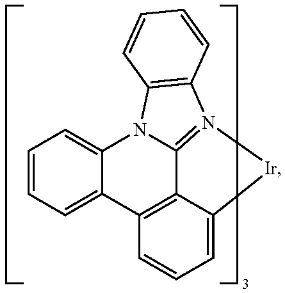
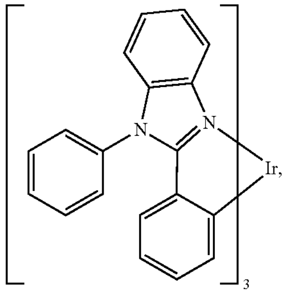
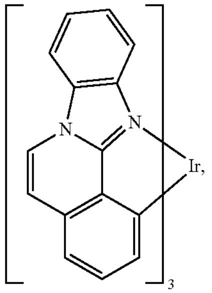
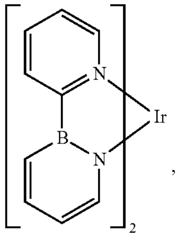
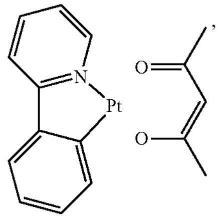
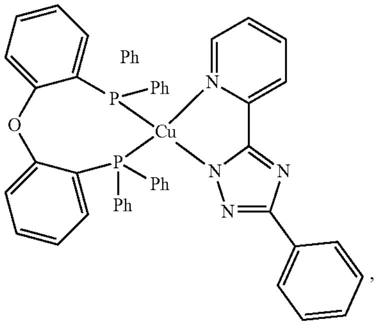

-continued
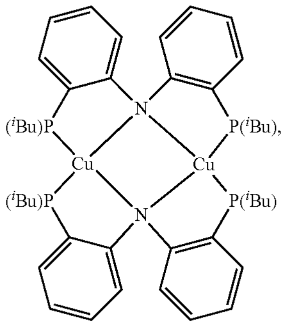
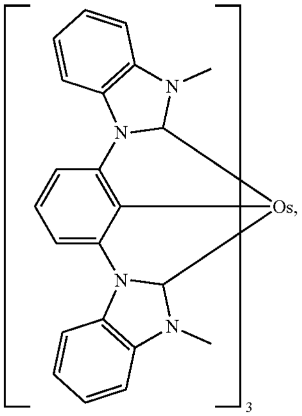
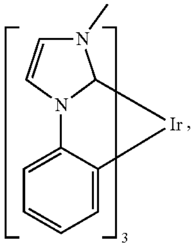
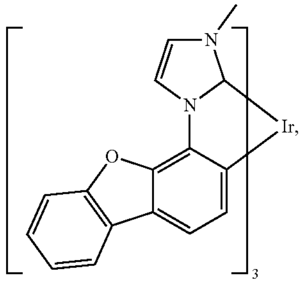
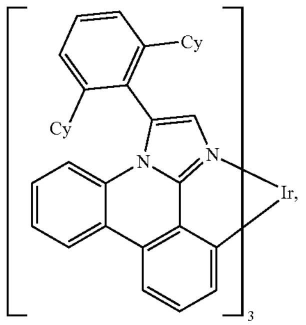
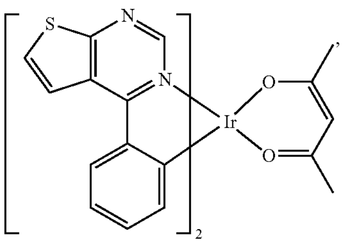
-continued
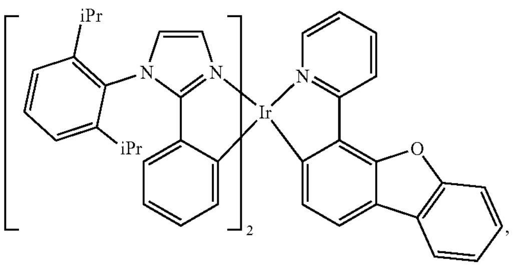
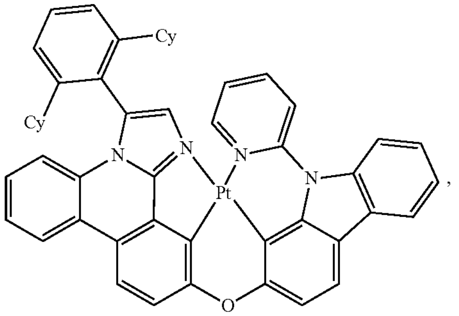
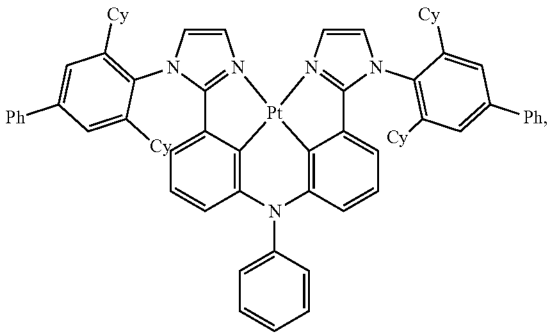
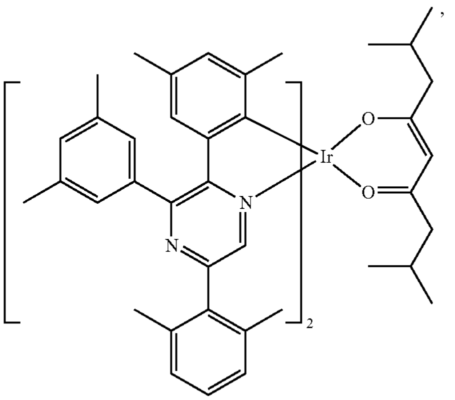
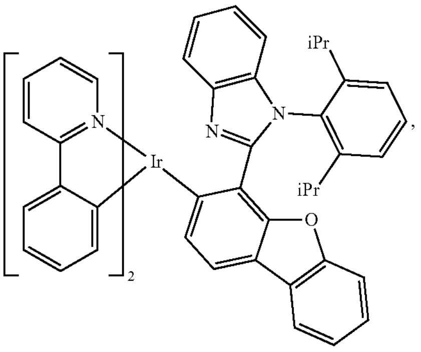

-continued
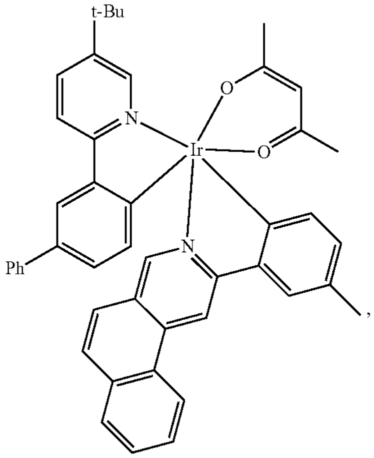
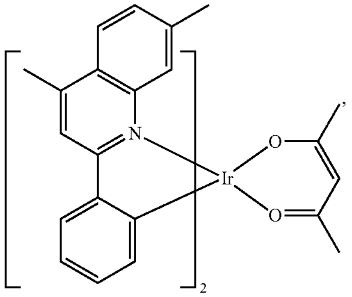
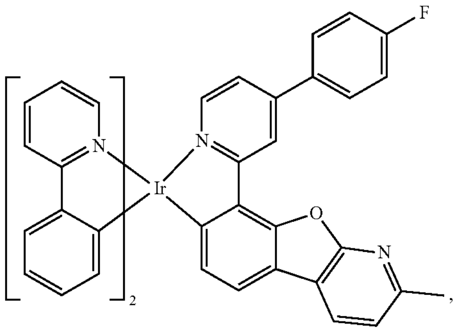
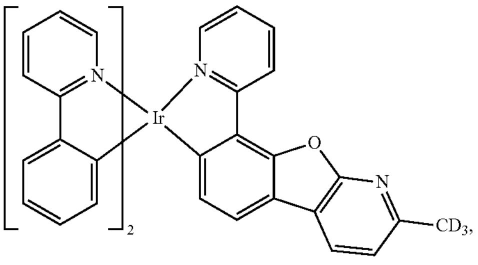
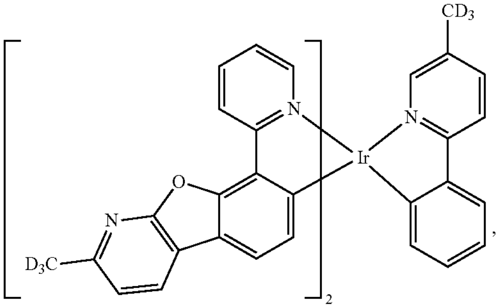
-continued
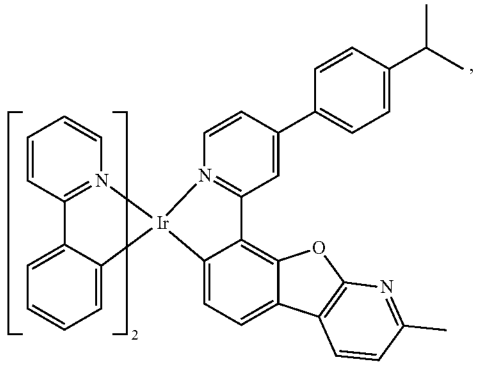
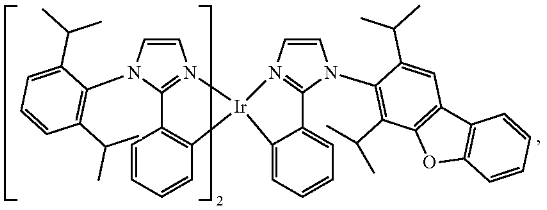
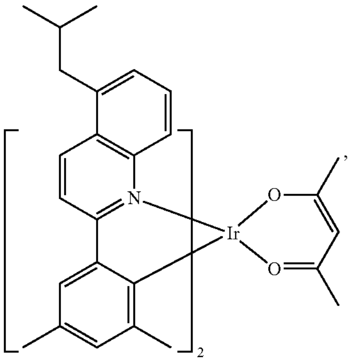
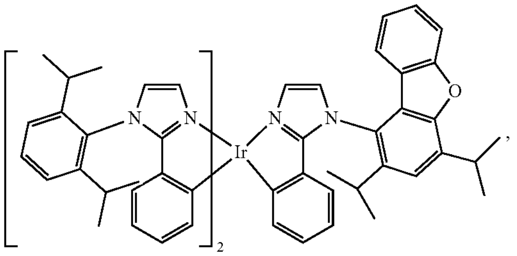
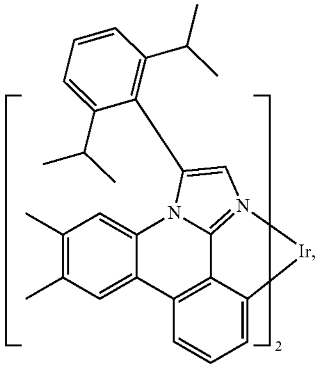

-continued
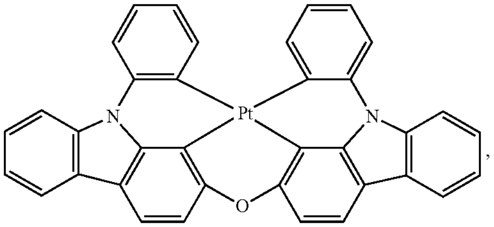
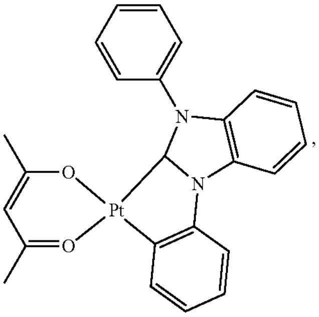
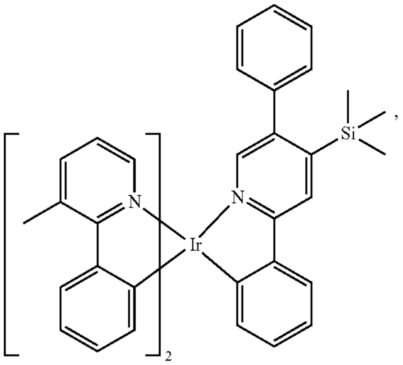
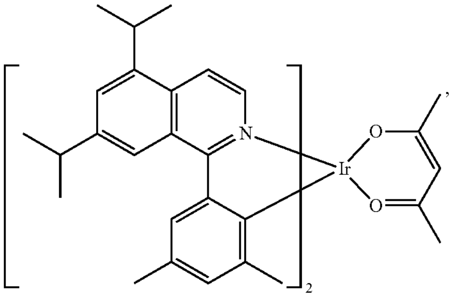
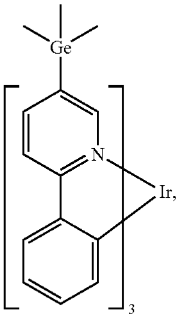
-continued
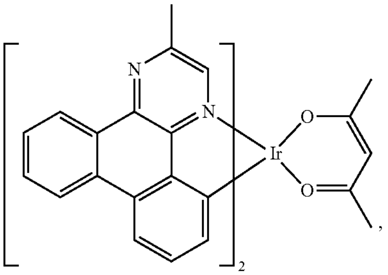
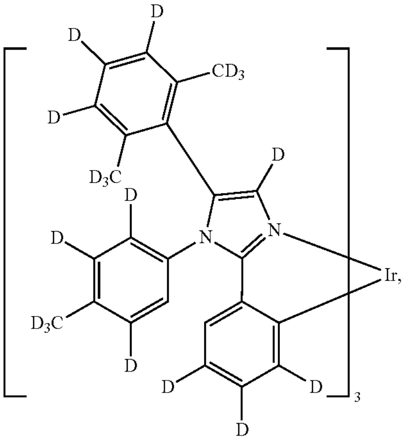
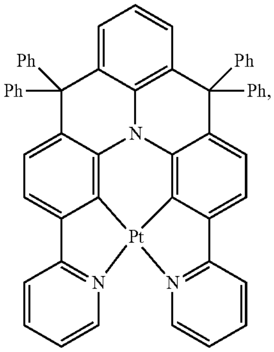
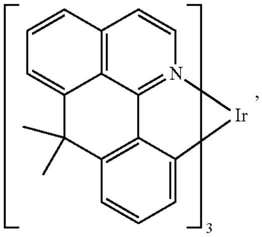
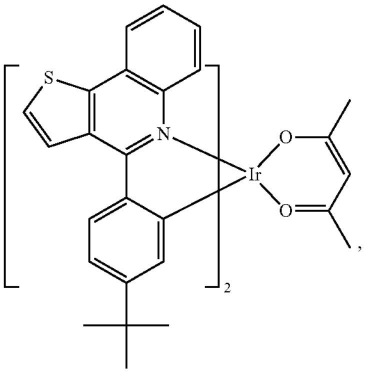
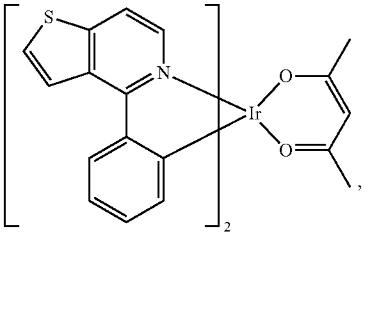

-continued
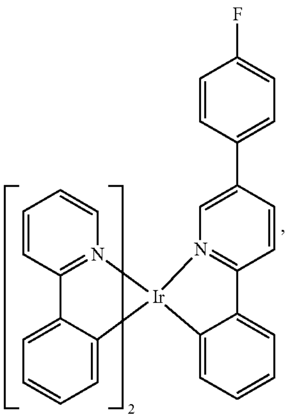
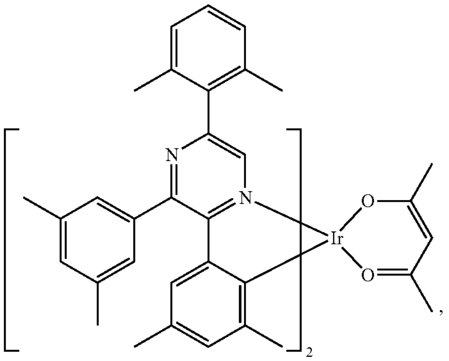
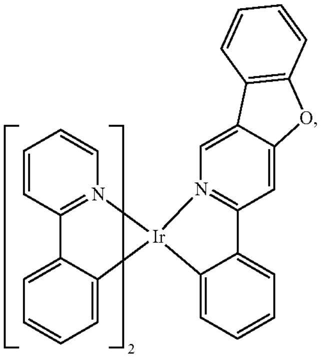
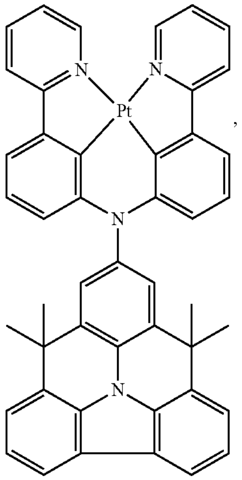
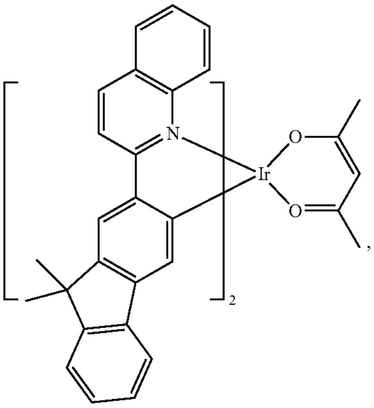
-continued
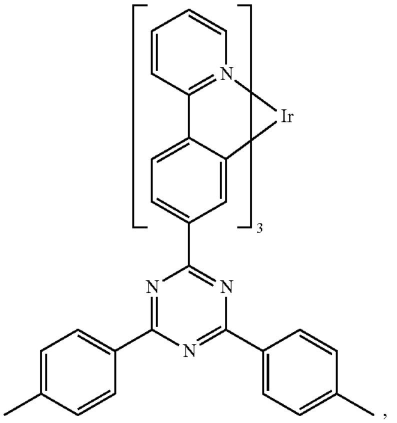
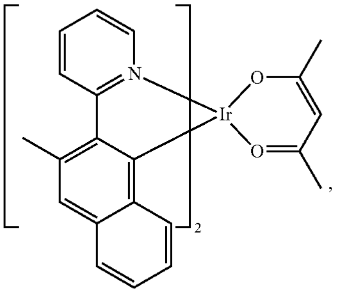
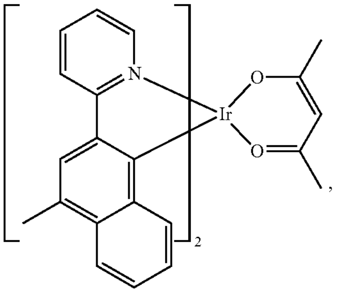
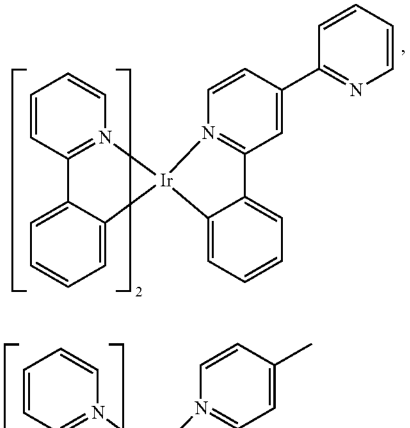
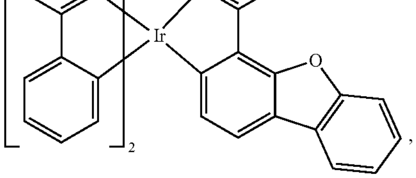

-continued
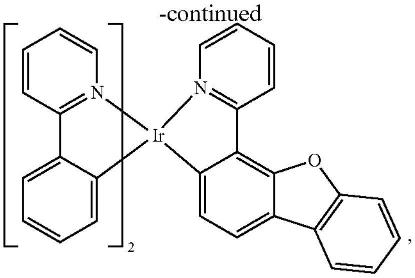
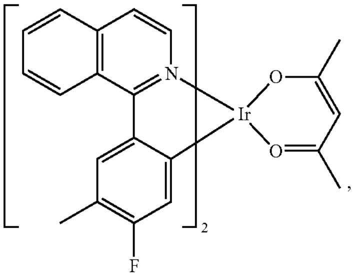
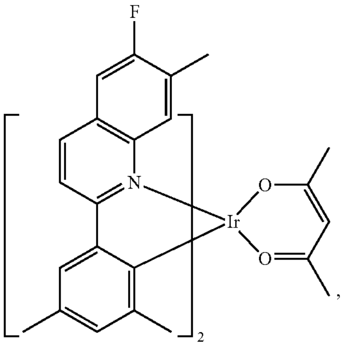
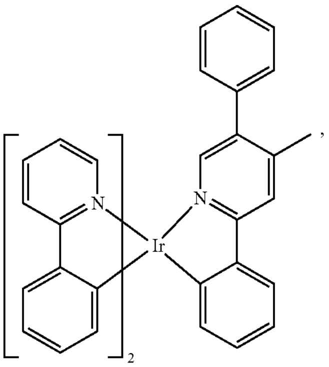
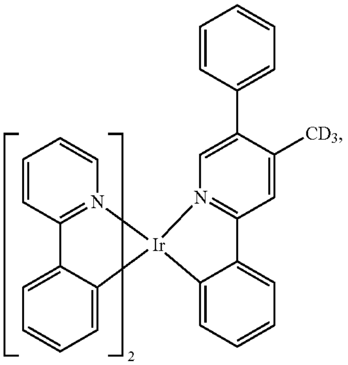
-continued
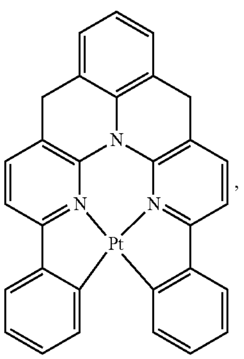
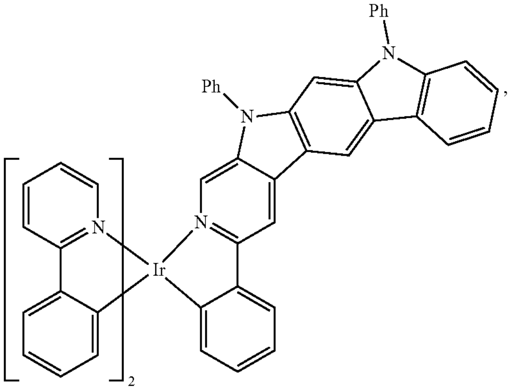
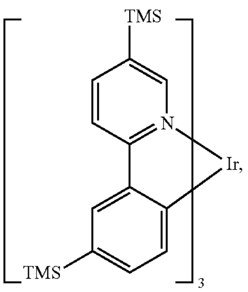
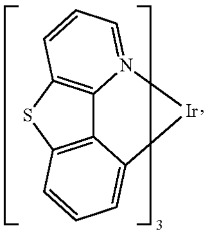
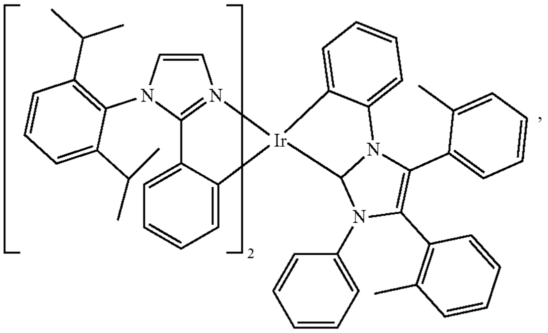
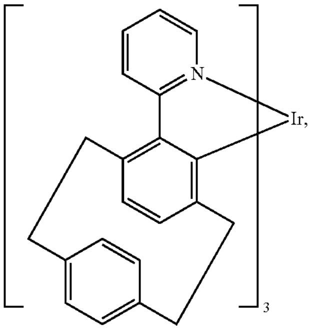

-continued
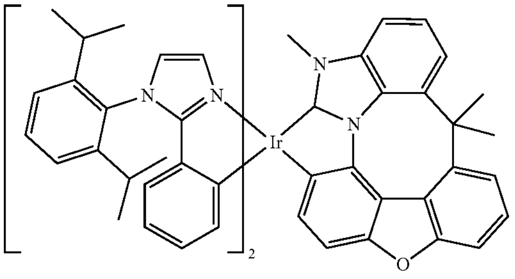
,
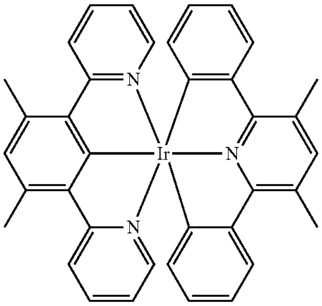
,
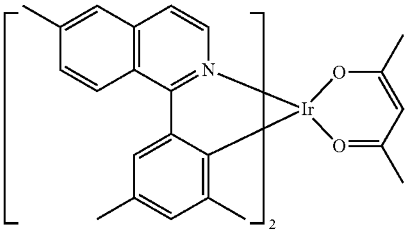
,
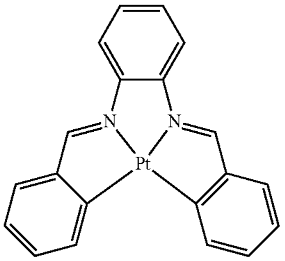
,
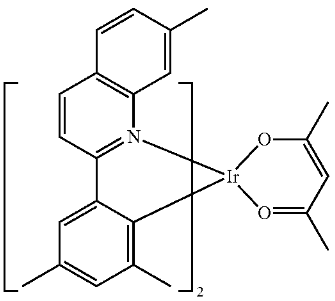
,
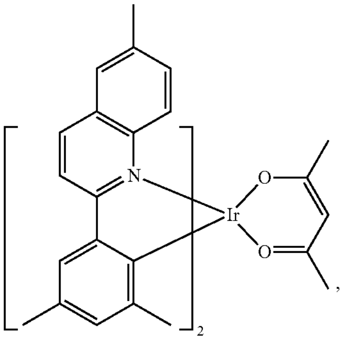
,
-continued
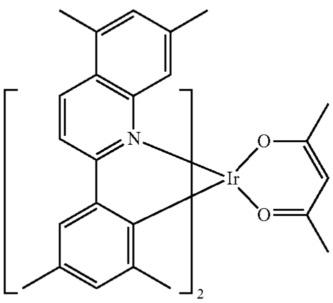
,
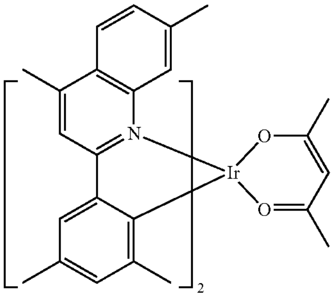
,
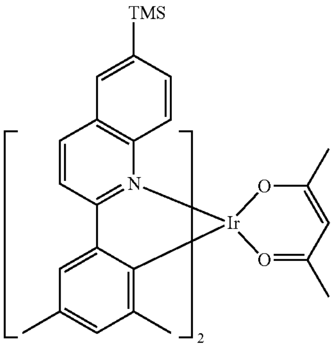
,
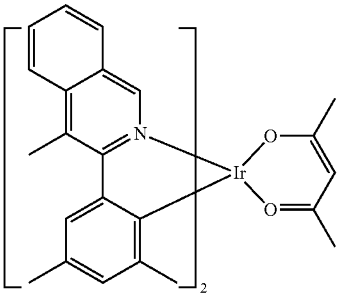
,
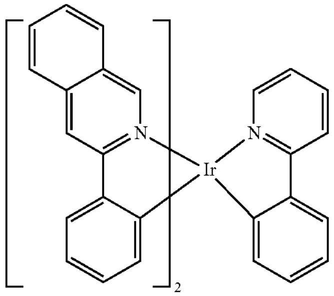
, -continued
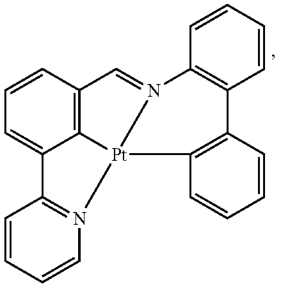
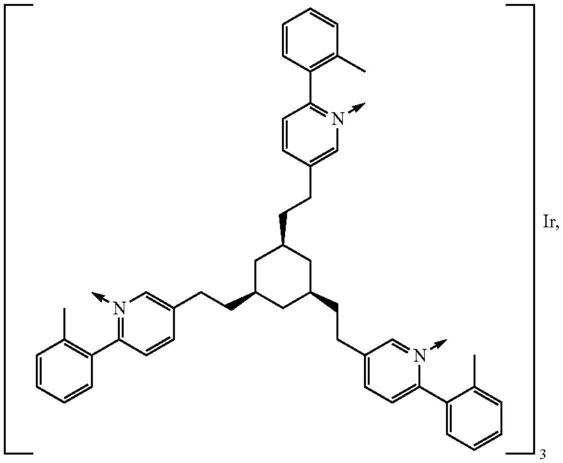
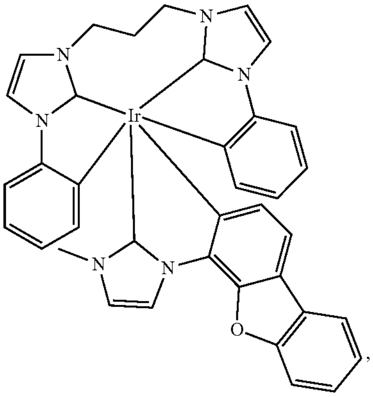
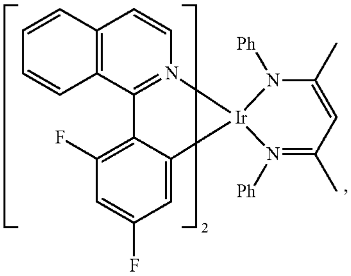
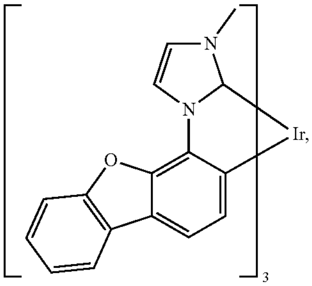
-continued
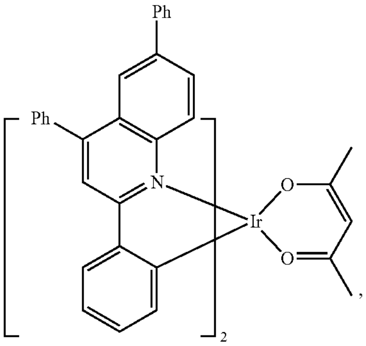
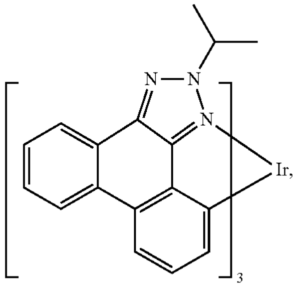
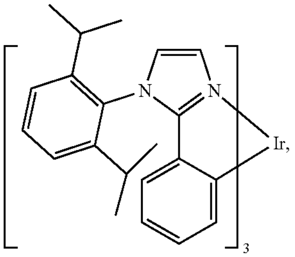
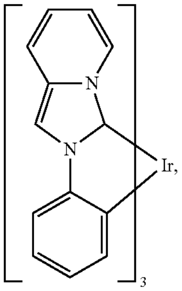
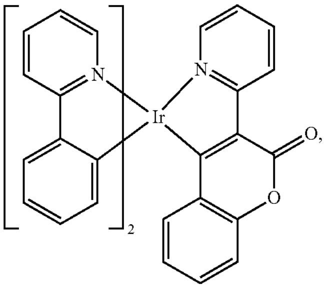
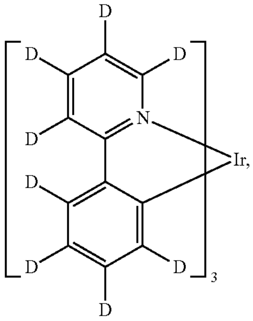
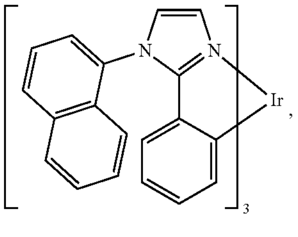

-continued

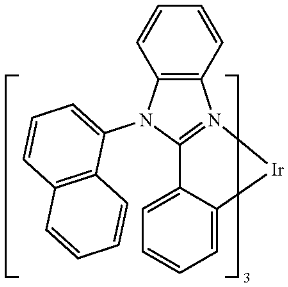

,

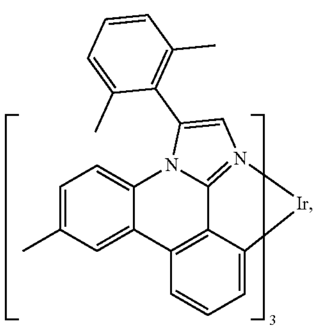

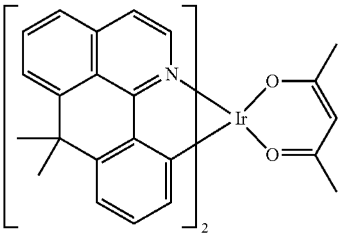

,

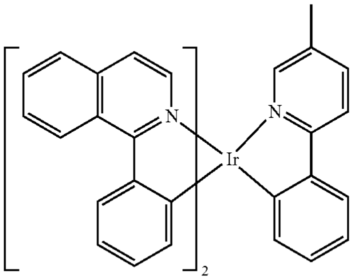

,

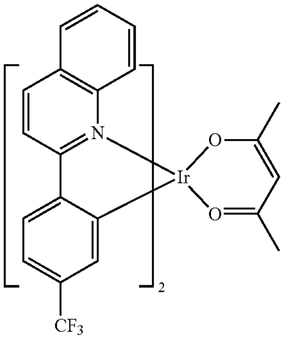

,

-continued

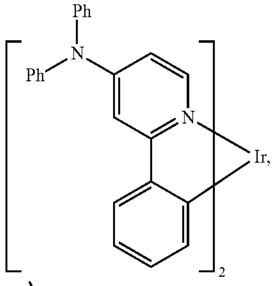

and

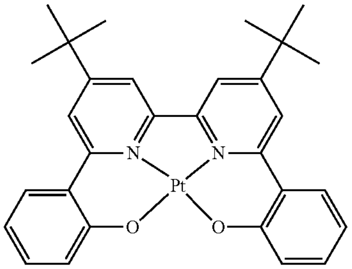

.

HBL:

A hole blocking layer (HBL) may be used to reduce the number of holes and/or excitons that leave the emissive layer. The presence of such a blocking layer in a device may result in substantially higher efficiencies and/or longer life-time as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

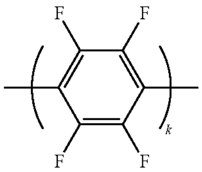

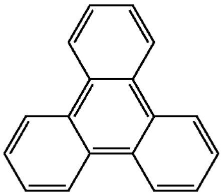

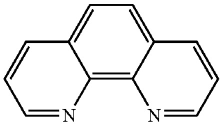

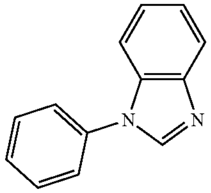

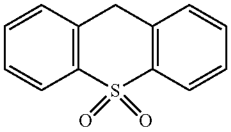

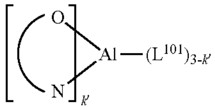

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

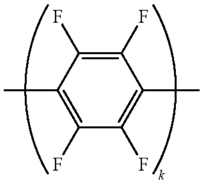
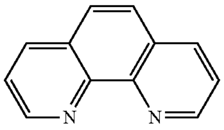
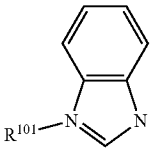
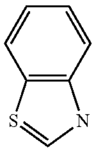
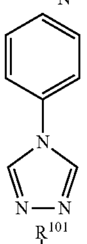
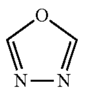
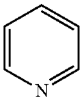
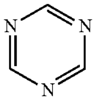
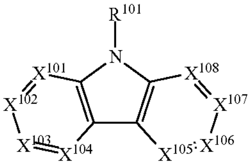
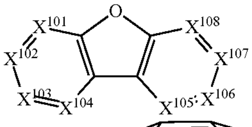
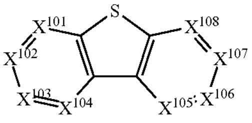
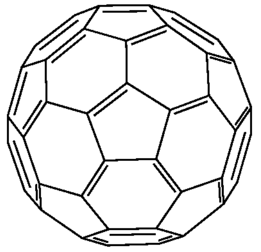
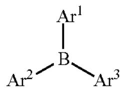

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

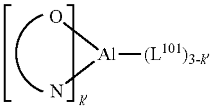
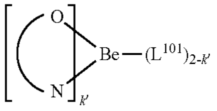

-continued

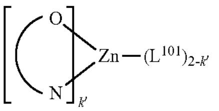
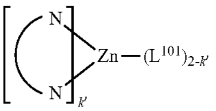

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535.

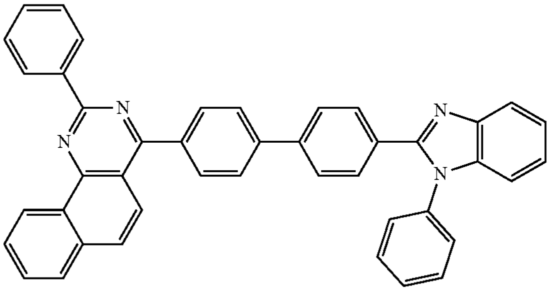
,

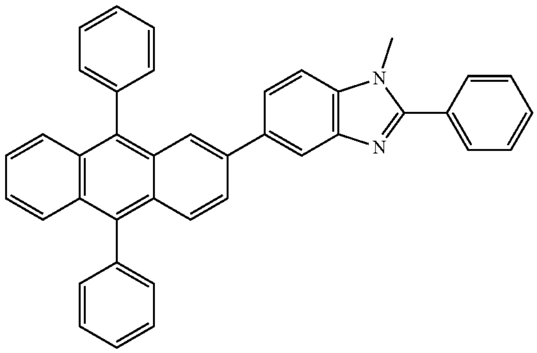
,

-continued
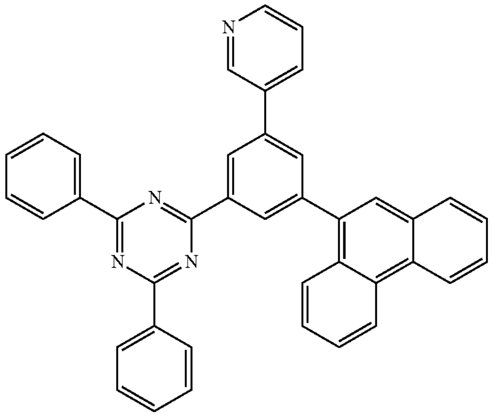
,
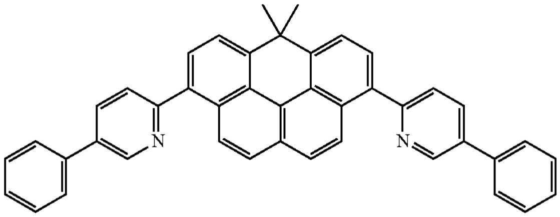
,
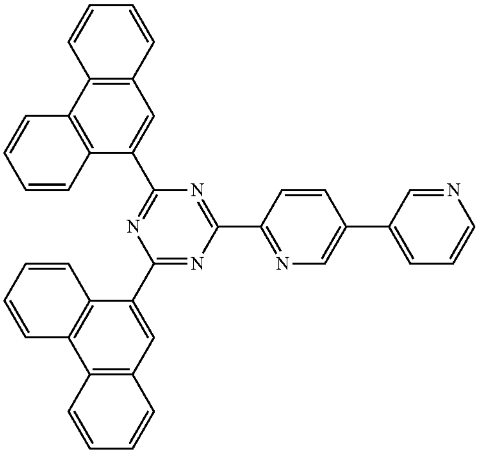
,
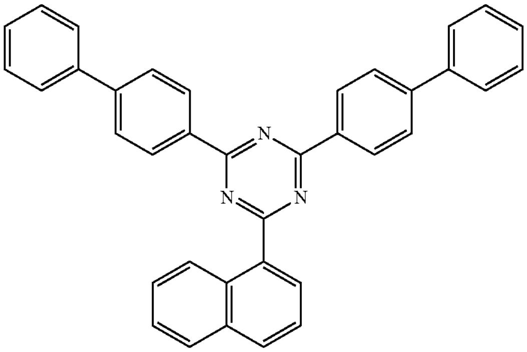
,
-continued
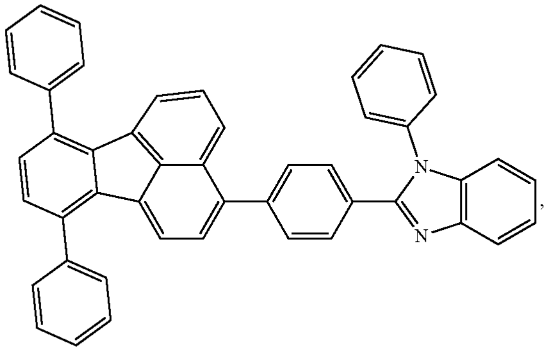
,
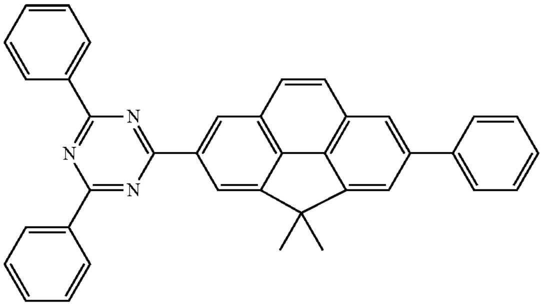
,
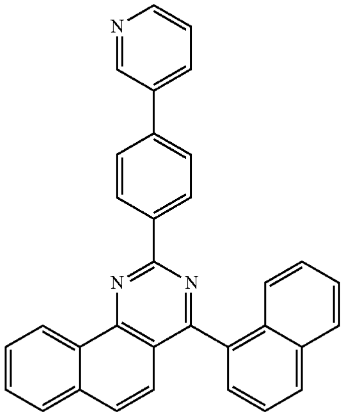
,
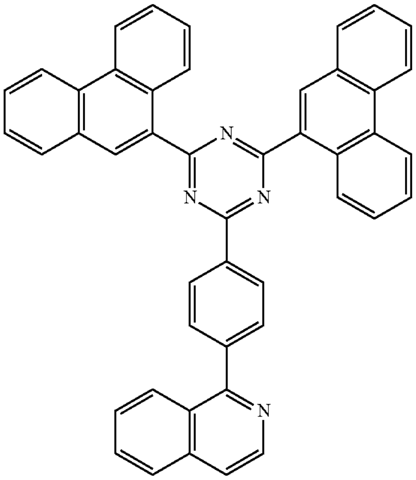
, -continued
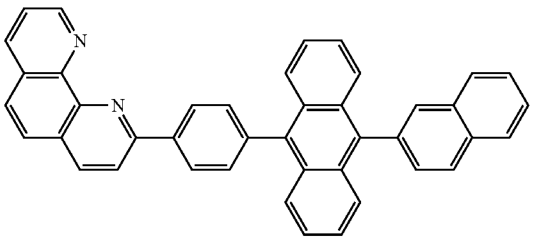
,
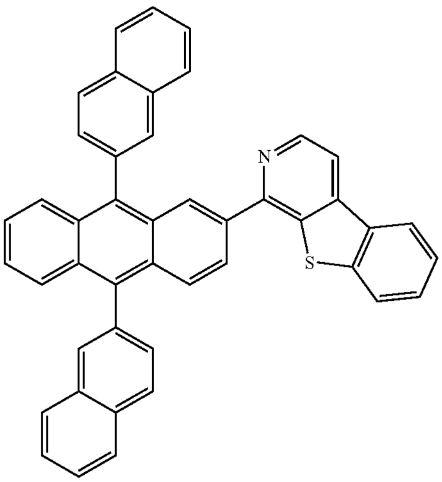
,
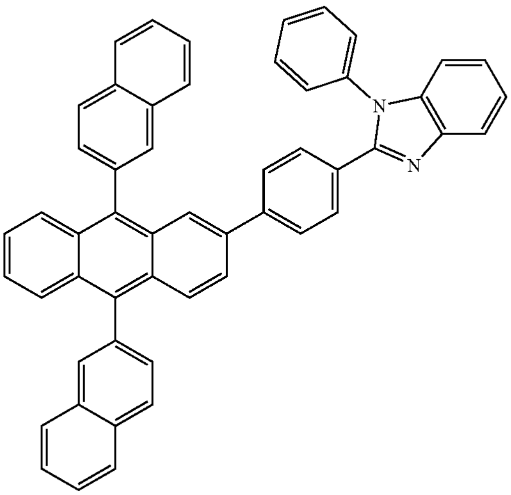
,
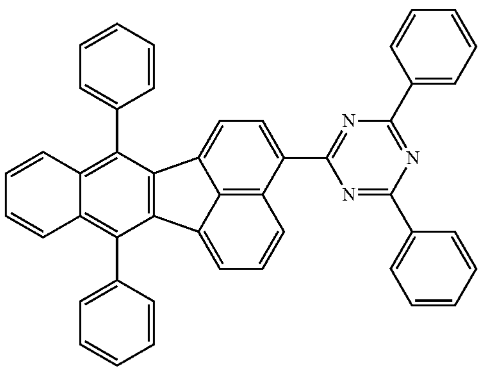
,
-continued
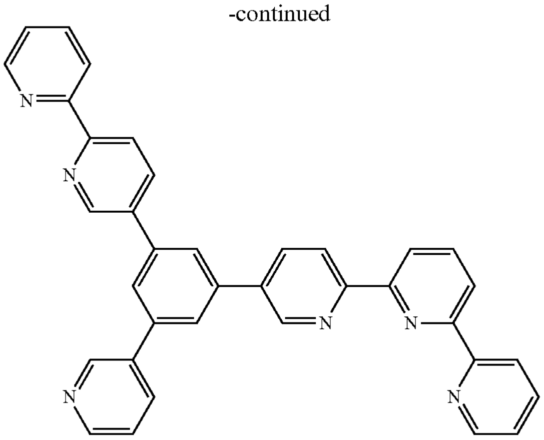
,
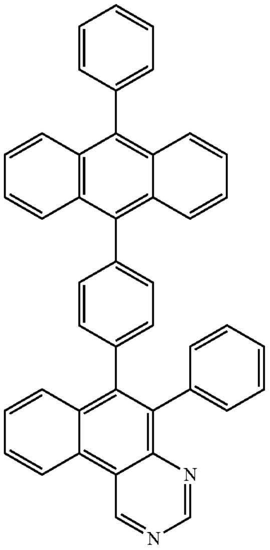
,
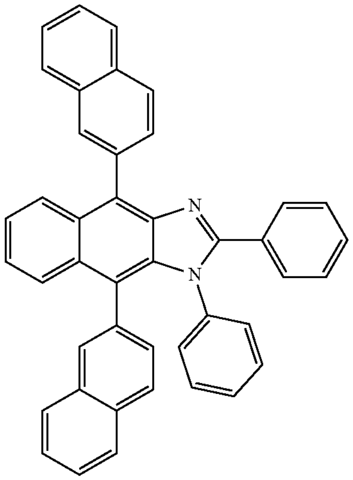
, -continued
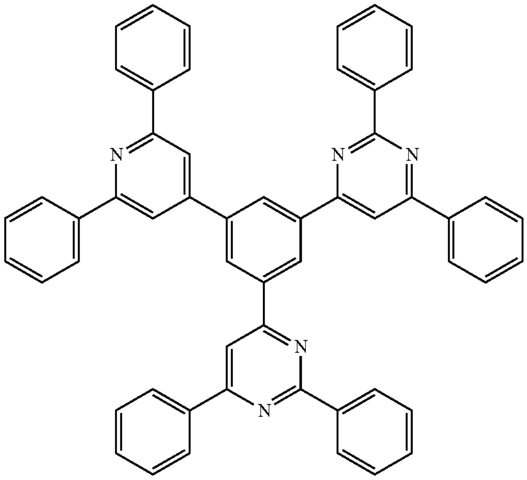
,
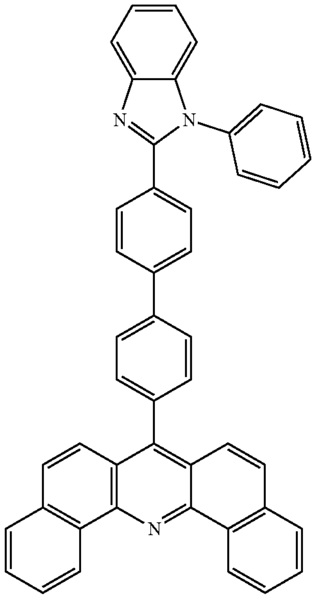
,
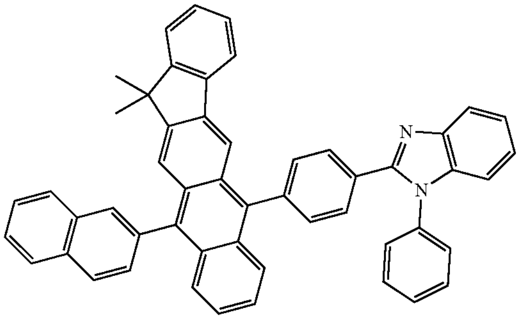
,
-continued
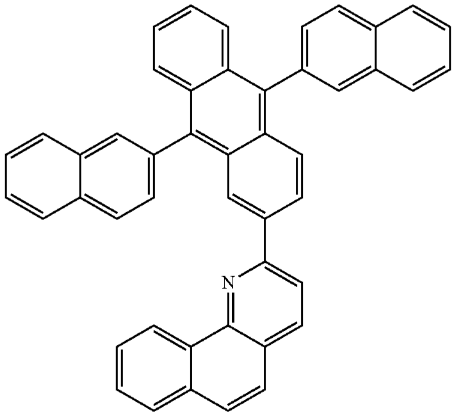
,
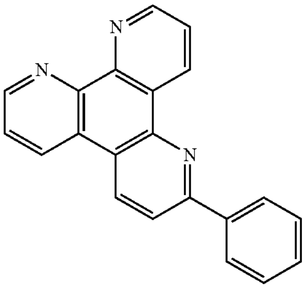
,
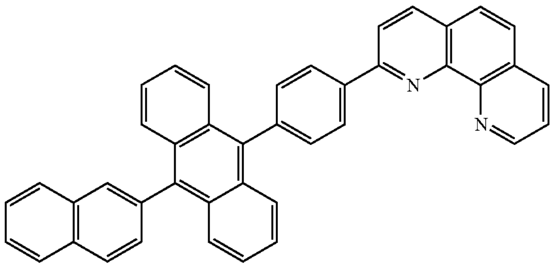
,
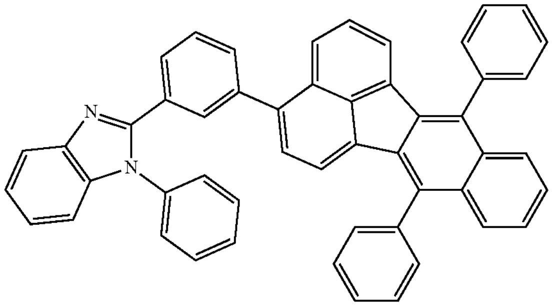
,

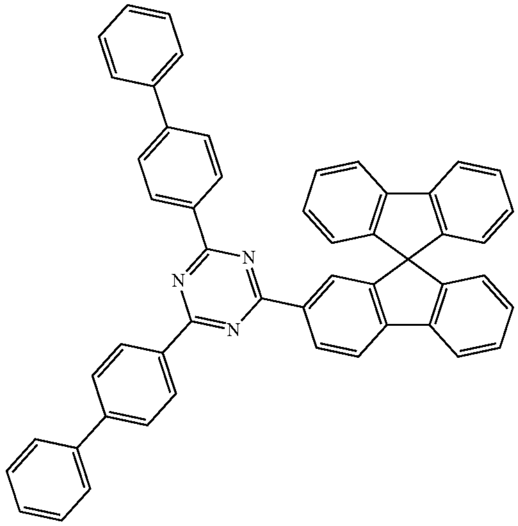
,
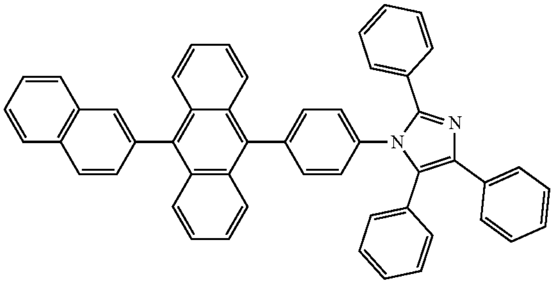
,
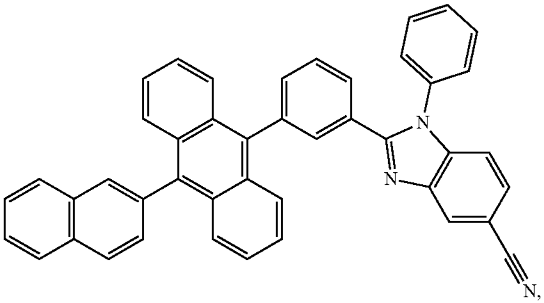
,
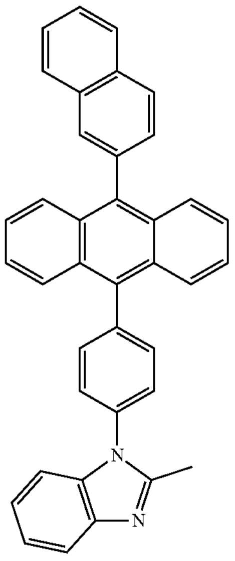
,
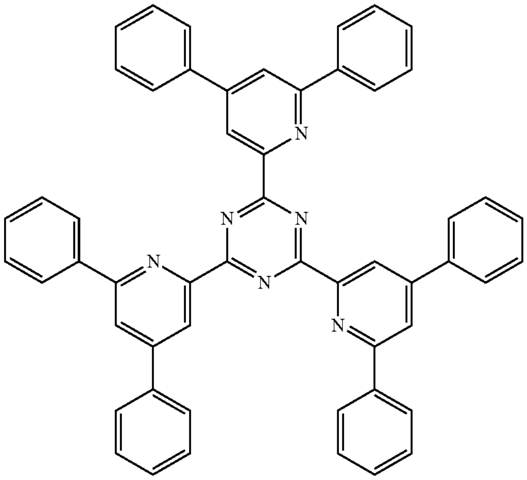
,
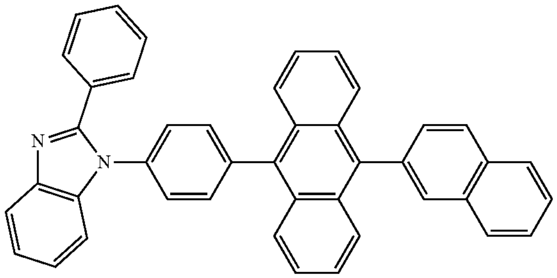
,
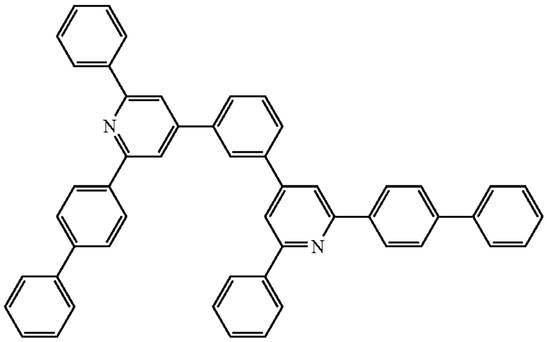
,
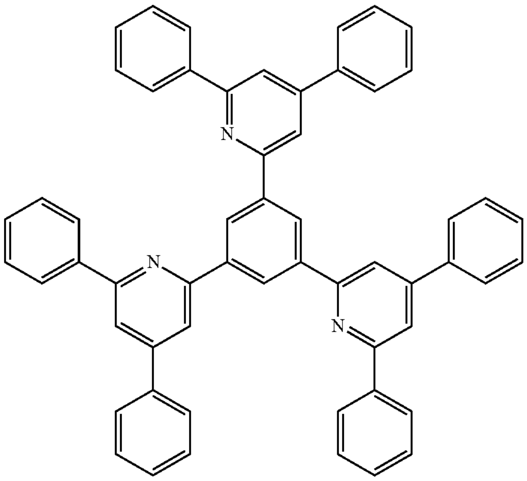
, -continued

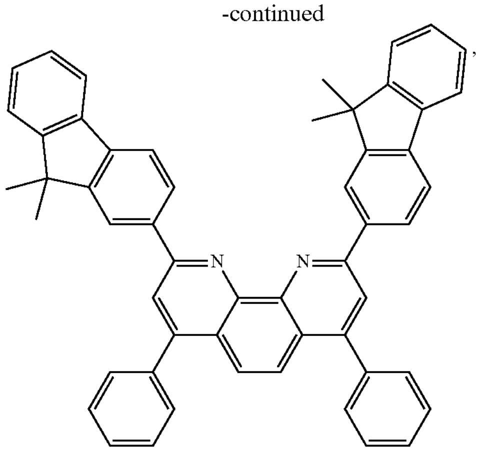

and

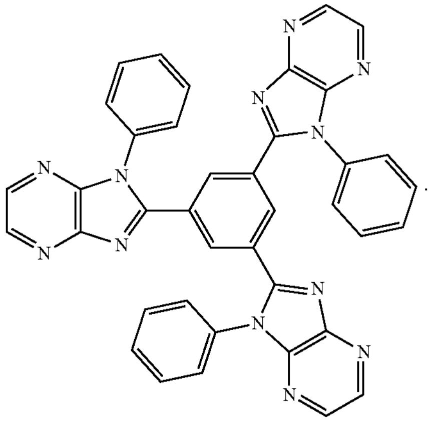 [SMILES: c1ccc(-n2c(-c3cc(-c4nc5nccnc5n4-c4ccccc4)cc(-c4nc5nccnc5n4-c4ccccc4)c3)nc3nccnc32)cc1]

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

What is claimed is:

1. A first organic light emitting device comprising:

a substrate;

an anode;

a cathode; and an organic layer, disposed between the anode and the cathode, comprising a film of homoleptic compounds having a formula $M(L_A)_3$;

wherein the compound has a structure of

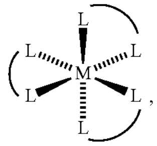

wherein  represents $L_A$, wherein

is a $M(L_A)$ fragment having a structure selected from the goup consisting of:

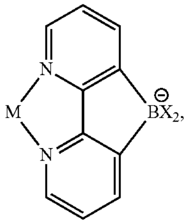

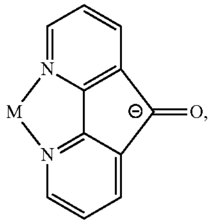

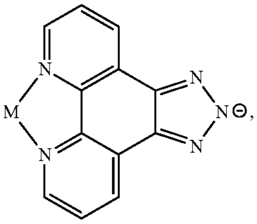

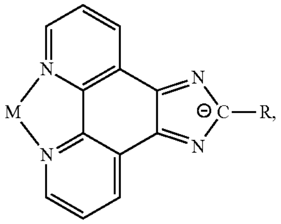

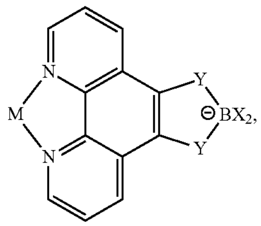

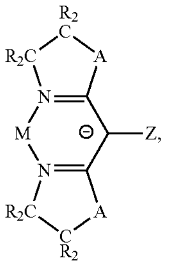

and

-continued

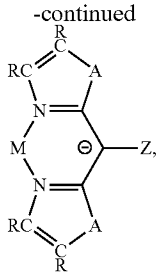

wherein M is a metal selected from the group consisting of Ir, Rh, Re, Ru, Os, Pt, Au, and Cu;

wherein $L_A$ is a $C_2$ symmetric bidentate monoanionic ligand and each ligand $L_A$'s coordination to M forms a L-M-L bond angle;

wherein each homoleptic compound is a $C_3$ symmetric compound having a $C_3$ symmetry axis and has a transition dipole moment; and wherein the homoleptic compounds in the film are oriented with their $C_3$ symmetry axis substantially perpendicular to the substrate and the transition dipole moment for the $M(L_A)$ fragment bisects the L-M-L bond angle;

wherein X is halide, alkyl, aryl, or alkoxide;

wherein Y is O or NR;

wherein Z is H, alkyl, aryl, CN, or $NO_2$;

wherein A is O, S, NR, PR, CO, $CR_2$, or $SiR_2$; and wherein R is H, alkyl, or aryl.

2. The first organic light emitting device of claim 1, wherein M is Ir.

3. The first organic light emitting device of claim 1, wherein $L_A$ has a structure of

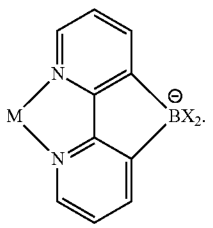

4. The first organic light emitting device of claim 1, wherein $L_A$ has a structure of

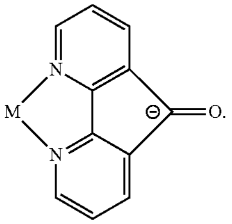

5. The first organic light emitting device of claim 1, wherein $L_A$ has a structure of

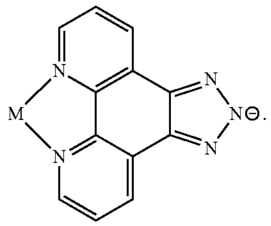

6. The first organic light emitting device of claim 1, wherein $L_A$ has a structure of

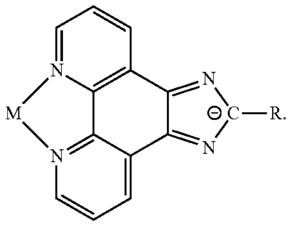

7. The first organic light emitting device of claim 1, wherein $L_A$ has a structure of

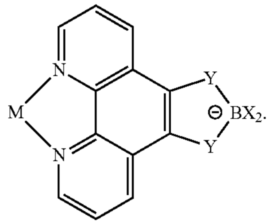

8. The first organic light emitting device of claim 1, wherein $L_A$ has a structure of

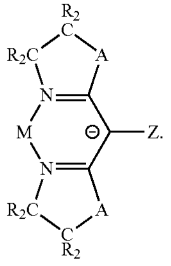

9. The first organic light emitting device of claim 1, wherein $L_A$ has a structure of

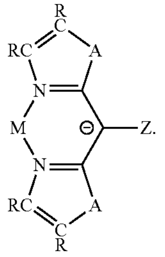

10. The first organic light emitting device of claim 1, wherein R is present and is partially or fully fluorinated alkyl.

11. The first organic light emitting device of claim 1, wherein Y is present and is O.

12. The first organic light emitting device of claim 1, wherein X is present and is halide or partially or fully fluorinated alkyl.

13. The first organic light emitting device of claim 1, wherein Z is present and is partially or fully fluorinated alkyl or CN.

14. The first organic light emitting device of claim 1, wherein $L_A$ comprises an electron withdrawing group.

15. The first light emitting device of claim 1, wherein $L_A$ comprises an electron withdrawing group selected from partially or fully fluorinated alkyl, F, CN, or $NO_2$.

16. The first organic light emitting device of claim 1, wherein the organic layer is an emissive layer and the homoleptic compound is an emissive dopant.

17. The first organic light emitting device of claim 1, wherein the organic layer further comprises a host, wherein the host comprises a triphenylene containing benzo-fused thiophene or benzo-fused furan;

wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1{-}Ar_2$, and $C_nH_{2n}{-}Ar_1$, or the host has no substitutions;

wherein n is from 1 to 10; and wherein $Ar_1$ and $Ar_2$ are independently selected from the group consisting of benzene, biphenyl, naphthalene, triphenylene, carbazole, and heteroaromatic analogs thereof.

18. The first organic light emitting device of claim 1, wherein the organic layer further comprises a host, wherein the host comprises at least one chemical group selected from the group consisting of carbazole, dibenzothiophene, dibenzofuran, dibenzoselenophene, azacarbazole, aza-dibenzothiophene, aza-dibenzofuran, and aza-dibenzoselenophene.

19. The first organic light emitting device of claim 1, wherein the first organic light emitting device is incorporated into a device selected from the group consisting of a consumer product, an electronic component module, an organic light-emitting device, and a lighting panel.

* * * * *